United States Patent
Ichige et al.

(10) Patent No.: US 7,649,777 B2
(45) Date of Patent: Jan. 19, 2010

(54) NONVOLATILE SEMICONDUCTOR MEMORY CELL MATRIX WITH DIVIDED WRITE/ERASE, A METHOD FOR OPERATING THE SAME, MONOLITHIC INTEGRATED CIRCUITS AND SYSTEMS

(75) Inventors: Masayuki Ichige, Yokohama (JP); Fumitaka Arai, Yokohama (JP); Kikuko Sugimae, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/903,015

(22) Filed: Aug. 2, 2004

(65) Prior Publication Data

US 2005/0056869 A1    Mar. 17, 2005

(30) Foreign Application Priority Data

Aug. 4, 2003   (JP) ............................. 2003-286162
Sep. 22, 2003  (JP) ............................. 2003-330399

(51) Int. Cl.
    G11C 16/04     (2006.01)
    G11C 16/06     (2006.01)
(52) U.S. Cl. ........................ 365/185.17; 365/185.05
(58) Field of Classification Search ................ 365/63, 365/185.02, 185.05, 185.17; 257/326
    See application file for complete search history.

(56) References Cited

U.S. PATENT DOCUMENTS

| | | | | | |
|---|---|---|---|---|---|
| 4,962,481 | A | * | 10/1990 | Choi et al. ................... | 257/316 |
| 5,589,699 | A | * | 12/1996 | Araki ........................ | 365/185.17 |
| 5,680,347 | A | * | 10/1997 | Takeuchi et al. ............ | 365/185.17 |
| 5,740,112 | A | * | 4/1998 | Tanaka et al. ............... | 365/189.01 |
| 5,793,677 | A | * | 8/1998 | Hu et al. ..................... | 365/185.17 |
| 5,815,438 | A | * | 9/1998 | Haddad et al. .............. | 365/185.17 |
| 6,295,227 | B1 | * | 9/2001 | Sakui et al. ................. | 365/185.17 |
| 6,380,636 | B1 | * | 4/2002 | Tatsukawa et al. .......... | 257/390 |
| 2002/0130355 | A1 | * | 9/2002 | Takeuchi et al. ............ | 257/315 |
| 2003/0095448 | A1 | | 5/2003 | Ichige et al. | |

FOREIGN PATENT DOCUMENTS

| | | |
|---|---|---|
| JP | 6-350059 | 12/1994 |
| JP | 10-199265 | 7/1998 |
| JP | 2000-222895 | 8/2000 |
| JP | 2000-269468 | 9/2000 |
| JP | 2003-051559 | 2/2003 |
| JP | 2004-241558 | 8/2004 |
| WO | WO 97/49089 | 12/1997 |

OTHER PUBLICATIONS

Patent Abstracts of Japan, JP 2003-051557, Feb. 21, 2003.
U.S. Appl. No. 11/480,460, filed Jul. 5, 2006, Ichige, et al.
U.S. Appl. No. 11/566,283, filed Dec. 4, 2006, Arai, et al.
U.S. Appl. No. 12/244,307, filed Oct. 2, 2008, Mizukami, et al.

* cited by examiner

*Primary Examiner*—J. H. Hur
(74) *Attorney, Agent, or Firm*—Oblon, Spivak, McClelland, Maier & Neustadt, L.L.P.

(57) ABSTRACT

A nonvolatile semiconductor memory includes a plurality of word lines WL; a plurality of bit lines BL; memory cell transistors having a charge storage layer arranged in the column whose charge storage state is controlled by one of the word lines; memory cell transistor rows MSGm, MSGn functioning as select gate lines by injecting a charge into the charge storage layer of a memory cell transistor to form an enhancement mode transistor. Any one of a first select gate transistor or a second transistor, or both may be formed by a memory cell transistor functioning as a select gate transistor.

7 Claims, 49 Drawing Sheets

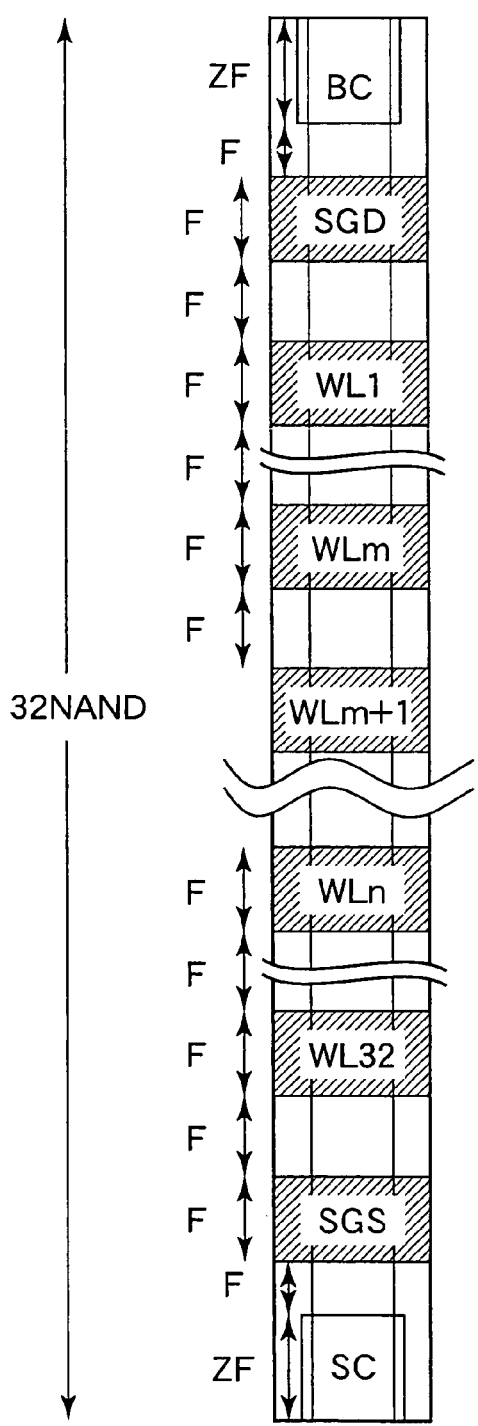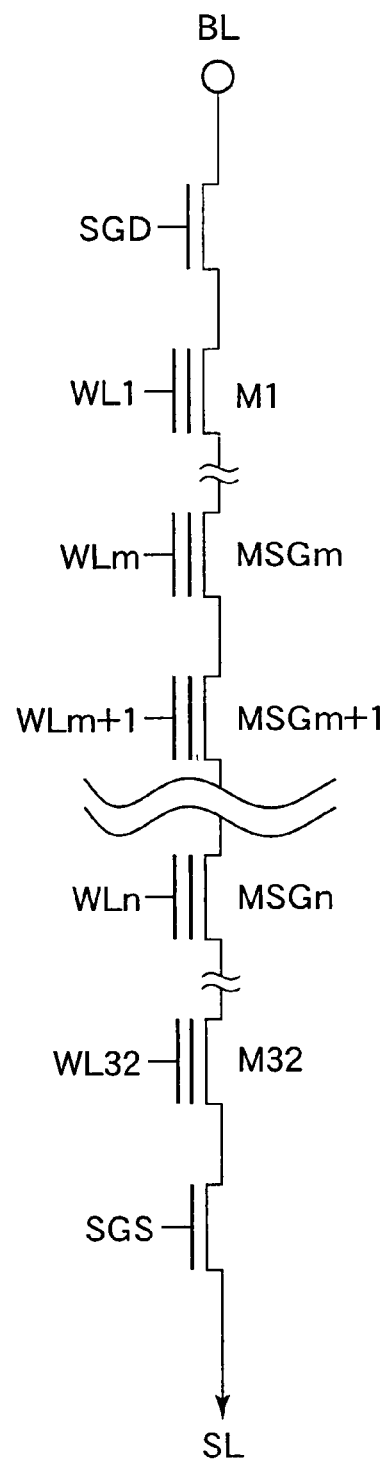

MEMORY CARD 60
OR MEMORY CARD HOLDER 80

NONVOLATILE SEMICONDUCTOR MEMORY CELL MATRIX WITH DIVIDED WRITE/ERASE, A METHOD FOR OPERATING THE SAME, MONOLITHIC INTEGRATED CIRCUITS AND SYSTEMS

CROSS REFERENCE TO RELATED APPLICATIONS

This application is based upon and claims the benefit of priority from prior Japanese Patent Application P2003-286162 filed on Aug. 4, 2003 and P2003-330399 filed on September 22; the entire contents of which are incorporated by reference herein.

BACKGROUND OF THE INVENTION

1. Field of the Invention

The present invention relates to a nonvolatile semiconductor memory cell matrix providing divided write/erase for high-density memory cell transistors having a floating gate or MONOS structure, a method for operating thereof, and a monolithic integrated circuit and a nonvolatile semiconductor memory system.

2. Description of the Related Art

In the related art, for example, an EEPROM (Electrically Erasable Programmable Read-Only Memory), which electrically writes and erases data, is known as a nonvolatile semiconductor memory, as described in Riichiro Shirota, "A Review of 256 Mbit NAND Flash Memories and NAND Flash Future Trend", Non-Volatile Semiconductor Memory Workshop (NVSMW), 2000, pp. 22-31.

An EEPROM, especially in the case of a NAND, has memory cell transistors at respective intersections of word lines in a row direction and bit lines in a column direction arranged to form a memory cell array. As the memory cell transistor, such as a MOS transistor having a stacked-gate structure where a floating gate and a control gate are overlaid is generally used.

A typical memory cell of the NAND flash memory is disclosed in Riichiro Shirota, "A Review of 256 Mbit NAND Flash Memories and NAND Flash Future Trend", Non-Volatile Semiconductor Memory Workshop (NVSMW), 2000, pp. 22-31. The NAND flash memory has a structure where a plurality of memory cell transistors connected in series to form a NAND string, on both sides of which select gate transistors are arranged. Furthermore, an element isolation region is disposed parallel to the element active area region of the memory cell transistor to form a memory cell array. Generally, the gate length of the select gate transistors is the same or longer than the gate length of the memory cell transistors to prevent degradation of cutoff characteristics of the transistors due to a short-channel effect. Moreover, the select gate transistor is usually constituted by an enhancement mode MOS transistor.

The high-density of the memory cell transistors of the NAND flash memory is realized by increasing the number of NAND columns. In other words, while the select gate transistors, and the bit-line and/or source-line contact portions are an overhead of the memory cell array, in order to decrease the rate at which the select gate transistors occupy, a higher density is achieved by increasing the number of memory cell transistors contained in a NAND column and thus decreases the rate of the overhead. However, if the number of memory cell transistors contained in a NAND column increases, a problem occurs that a unit of data in writing/erasing also becomes larger because data is rewritten for each NAND column. Hence, a method where the NAND column is divided by providing the select gate transistor in the memory cell string, and the like have been proposed in Japanese Laid-Open Patent Application No. 2000-222895 and U.S. Pat. No. 6,295,227. In addition, a self-boost (SB) write method and the like have been proposed by K. D. Suh, et al., "A 3.3V 32 Mb NAND Flash Memory with Incremental Step Pulse Programming Scheme", IEEE JOURNAL OF SOLID-STATE CIRCUITS, Vol. 30, No. 11, November 1995, pp. 1149-1156, as a method of controlling a channel-voltage when writing.

With the method where NAND columns are divided, while the increase of the overhead associated with the bit line and source line previously mentioned can be avoided, the region of the high-density memory cell inevitably increases because the overhead region of the select gate transistor itself increases. In addition, since positions of the select gate transistors are fixed from the stage of designing the memory, the degree of freedom in changing the unit in writing/erasing when using the memory is small.

SUMMARY OF THE INVENTION

An aspect of the present invention inheres in a memory cell matrix connectable to a control circuit generating a functional select gate control signal, the memory cell matrix including: (a) a plurality of word lines arranged in a row direction; (b) a bit line arranged in a column direction; and (c) a plurality of memory cell transistors arranged in the column direction, each of the memory cell transistors having a charge storage layer, a charge storage state of the memory cell transistors being controlled by one of the word lines, at least one of the memory cell transistors functions as a first select gate transistor by receiving the functional select gate control signal through the word line, and injects a charge into the charge storage layer so as to form an enhancement mode transistor.

Another aspect of the present invention inheres in a method for operating a nonvolatile semiconductor memory, including: (a) flash erasing a memory cell array block; (b) injecting electrons into an electric charge storage layer of a memory cell transistor functioning as a n-th select gate transistor in NAND strings; (c) identifying the memory cell transistor arranged from (n+1)-th to last among the NAND strings as a memory cell transistor; (d) performing programming data on the memory cell transistor arranged from (n+1)-th to last among the NAND strings; (e) turning ON the memory cell transistor on a bit line side arranged from the n-th of the NAND strings; (f) initially setting a bit-line voltage of low potential from the bit line to the memory cell transistor functioning as the select gate transistor; (g) transferring bit-line voltage of high potential to unselected memory cell transistors; (h) setting a source line to low potential by applying a cutoff voltage to the memory cell transistor functioning as the select gate transistor; and (i) performing programming of the memory cell transistor arranged from (n+1)-th to last of the NAND strings.

Another aspect of the present invention inheres in a nonvolatile semiconductor memory system including: (1) a memory cell matrix connectable to a control circuit generating a functional select gate control signal, the memory cell matrix includes: (a) a plurality of first word lines arranged in a row direction; (b) a plurality of bit lines arranged in a column direction; and (c) a plurality of first memory cell transistors arranged in the column direction, each of the first memory cell transistors having a first charge storage layer, a charge storage state of the first memory cell transistors being controlled by one of the first word lines, at least one of the memory cell transistors functions as a first select gate transistor by receiving the functional select gate control signal through the word line, and injects a charge into the first charge storage layer so as to form an enhancement mode transistor; and (2) a NAND flash memory cell matrix which includes: (a) a plurality of second word lines arranged in the row direction; (b) the bit lines arranged in the column direction; and (c) a plurality of second memory cell transistors arranged in the column direction, each of the second memory cell transistors having a second charge storage layer, a charge storage state of the second memory cell transistors being controlled by one of the second word lines.

Another aspect of the present invention inheres in a monolithic integrated circuit including: (1) a memory cell matrix connectable to a control circuit generating a functional select gate control signal, the memory cell matrix includes: (a) a plurality of first word lines arranged in a row direction; (b) a plurality of bit lines arranged in a column direction; and (c) a plurality of first memory cell transistors arranged in the column direction, each of the first memory cell transistors having a first charge storage layer, a charge storage state of the first memory cell transistors being controlled by one of the first word lines, at least one of the first memory cell transistors functions as a first select gate transistor by receiving the functional select gate control signal through the word line, and injects a charge into the first electric charge storage layer so as to form an enhancement mode transistor; (2) a NAND flash memory cell matrix which includes: (a) a plurality of second word lines arranged in the row direction; (b) the bit lines arranged in the column direction; and (c) a plurality of second memory cell transistors arranged in the column direction, each of the second memory cell transistors having a second charge storage layer, a charge storage state of the second memory cell transistors being controlled by one of the second word lines; and (3) a logic circuit to control the memory cell matrix.

Another aspect of the present invention inheres in a memory card including a divided write/erase NAND flash memory which includes: (a) a plurality of word lines arranged in a row direction; (b) a plurality of bit lines arranged in a column direction; and (c) a plurality of memory cell transistors arranged in the column direction, each of the memory cell transistors having a charge storage layer, a charge storage state of the memory cell transistors being controlled by one of the word lines, at least one of the memory cell transistors functions as a select gate transistor, and injects a charge into the electric charge storage layer so as to form an enhancement mode transistor.

Another aspect of the present invention inheres in an IC card including a divided write/erase NAND flash memory which includes: (a) a plurality of word lines arranged in a row direction; (b) a plurality of bit lines arranged in a column direction; and (c) a plurality of memory cell transistors arranged in the column direction, each of the memory cell transistors having a charge storage layer, a charge storage state of the memory cell transistors being controlled by one of the word lines, at least one of the memory cell transistors functions as a select gate transistor, and injects a charge into the charge storage layer so as to form an enhancement mode transistor.

BRIEF DESCRIPTION OF DRAWINGS

FIG. 2A is a schematic plan view of the layout pattern of a NAND flash memory according to a first embodiment of the present invention;

FIG. 2B is a circuitry view corresponding to FIG. 2A;

DETAILED DESCRIPTION OF THE EMBODIMENTS

Figure 1:
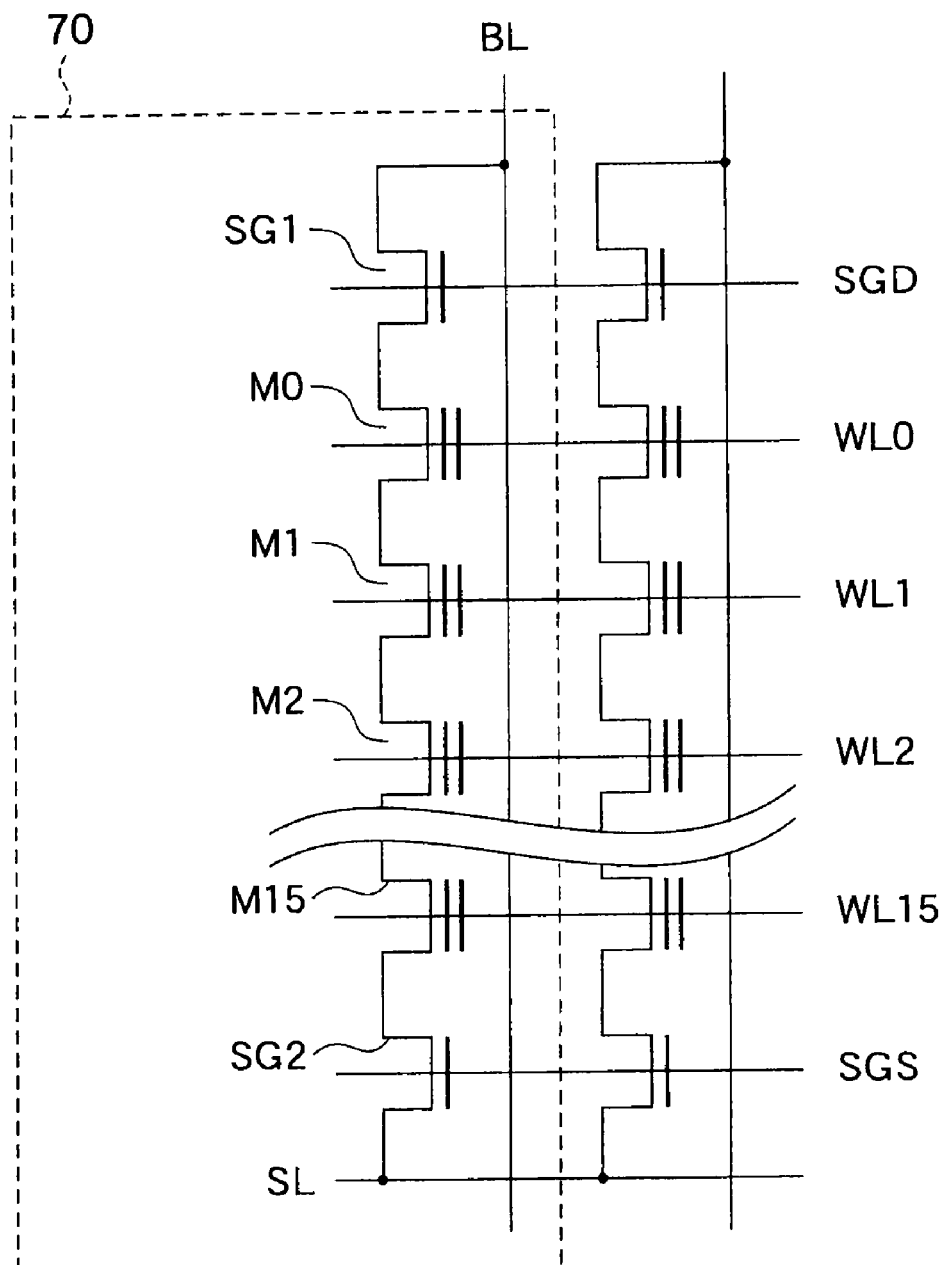
FIG. 1 is a schematic view of the circuitry of a NAND flash memory as a nonvolatile semiconductor memory of a comparative example for the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of circuit blocks, it will be appreciated that the various drawings are not drawn to scale from one figure to another nor inside a given figure, and in particular that the circuit diagrams are arbitrarily drawn for facilitating the reading of the drawings.

In the following descriptions, numerous specific details are set forth such as specific signal values, etc., to provide a thorough understanding of the present invention. However it will be obvious to those skilled in the art that the present invention may be practiced without such specific details. In other instances, circuits well-known have been shown in block diagram form in order not to obscure the present invention in unnecessary detail.

EMBODIMENTS

The nonvolatile semiconductor memory includes a memory cell transistor, or memory cell transistors having an electric charge storage layer, so as to provide an enhancement mode transistor. The enhancement mode transistor functions as a select gate transistor by applying a functional select gate control signal to a word line connected thereto, so as to inject electric charges into the electric charge storage layer. A functional select gate control circuit is connected with the word line connected to the memory cell transistor, which functions as a select gate transistor. The functional select gate control circuit generates the functional select gate control signal.

The present invention relates to a NAND nonvolatile semiconductor memory cell matrix having a structure that has a floating gate at a charge storage layer, or a MONOS structure, and a NAND nonvolatile semiconductor memory system. By making the word lines of a memory cell array function as select gate lines, the block size unit for writing/erasing can be set arbitrarily in each NAND column, so that divided write/erase operation in the memory cell array can be accomplished. A method will be disclosed where, maintaining the high-density of memory cell transistors of the NAND flash memory, the block size unit for writing/erasing data in the memory cell array is set arbitrarily, and any word line in the memory cell array is used as a select gate line to accomplish divided write/erase. Technology is described which handles a unit of data smaller than the number of the memory cell transistors contained in the NAND string multiplied by the page length (page size). The data unit for writing/erasing can be set arbitrarily later in the NAND nonvolatile semiconductor memory system. Here, the term "page length" corresponds to the number of bit lines simultaneously written at one time, and is equal to the number of memory cell transistors written in the memory cell transistors connected to one word line. Here, when bit line shields are used, the page length refers to half the number of bit lines physically arranged because even numbered bit lines and odd numbered bit lines are alternately selected and unselected. Further, when bit line shields are not used, the page length corresponds to the number of physically arranged bit lines.

Therefore, in a first embodiment, the circuitry, planar pattern structure, operation mode, element cross-section structure, manufacturing method, and matrix circuitry will be described centered on making memory cell transistors of a NAND nonvolatile semiconductor memory function as select gate transistors. In a second embodiment, an example of the circuit system structure where circuitries of the nonvolatile semiconductor memory described in the first embodiment are combined will be described. Further, in a third embodiment, the system structure taking into account the usage of the nonvolatile semiconductor memory described in the first embodiment will be described. Yet further, in a fourth embodiment, an example of the system block structure of the nonvolatile semiconductor memory, described in the first to the third embodiment, will be described. Still further, in a fifth embodiment, examples where the nonvolatile semiconductor memory described in the first embodiment is applied to specific systems such as a memory card and an IC card will be described.

Note that, in the description below, the NAND flash memory will be described within a scope in which the common concept of making memory cell transistors function as select gate transistors can be applied. The memory cell transistor is a floating-gate type, a MONOS type, or a modified type of the floating-gate and MONOS types.

An embodiment of the present invention will be described with reference to the accompanying drawings. The same or similar reference numerals are applied to the same or similar parts and elements throughout the drawings below. The following embodiments describe examples of the device and methods embodying the technologies of the present invention, but is not intended to limit the present invention and its scope to the details below. It should be understood that various changes can be made thereto without departing from the spirit and scope of the invention as defined by the appended claims.

Comparative Example

In a NAND flash memory, as shown in FIG. 1, a plurality of, e.g. 16, memory cell transistors M0 to M15 form part of a memory cell unit 70, enclosed by a dashed line, are connected in series in the a column direction. A bit-line-side select gate transistor SG1 is connected to one end of the series, and a source-line-side select gate transistor SG2 is connected to the other end of the series.

The gates of the memory cell transistors M0 to M15 are connected respectively to word lines WL0 to WL15. The gate of the bit-line-side select gate transistor SG1 is connected to a bit-line-side select gate line SGD. The gate of the source-line-side select gate transistor SG2 is connected to a source-line-side select gate line SGS.

The source region of the bit-line-side select gate transistor SG1 is connected to a bit line BL, as a data line. The source region of the source-line-side select gate transistor SG2 is connected to a common source line CS.

In the memory cell unit 70, a plurality of NAND strings (not shown) are arranged and connected in the direction along the bit line BL. Furthermore, for each bit line BL, a plurality of NAND strings having identical circuitry (not shown) are provided in the direction along the word lines WL0 to WL15.

Such NAND strings are arranged by a cascade connection in series. A plurality of structures in which the ends of a NAND string is provided with contacts. Memory cell transistors are connected to the contacts via the bit-line-side select gate transistor SG1 and the source-line-side select gate transistor SG2 consecutively arranged at both ends.

A plurality of word lines WL0 to WL15 for memory cell transistors are linearly formed parallel to each other in the row direction. Select gate lines SGD, SGS are linearly formed parallel to each other and parallel to the word lines WL0 to WL15 as well as for memory cell transistors respectively provided on both sides of a group of the plurality of memory cell transistors. The plurality of memory cell transistors M0 to M15 have gate lengths equal to each other. Moreover, a pair of select gate transistors SG1, SG2 on both sides of a group of the memory cell transistors M0 to M15 have gate lengths equal to each other, which are usually larger than that of the memory cell transistor.

Spaces F of the same width is provided between the word lines WL0 to WL15 for memory cell transistors arranged in the row direction (F being a minimum feature size). The width of the space F is equal to the gate length of the memory cell transistors. Furthermore, the space F is the same as the space F between the memory cell transistors provided, between the select gate transistors respectively adjacent to both ends of the group of the memory cell transistors and the outermost memory cell transistors.

In the column direction orthogonal to the row direction in which the word lines WL0 to WL15 for memory cell transistors are arranged, element active area regions parallel to each other are formed. These element active area regions are individually surrounded by a plurality of element isolation regions formed parallel to each other in the column direction, so that the active area regions are separated from each other.

A pair of select gate transistors is formed on both sides of a group of a plurality, e.g. 16, of memory cell transistors arranged in the column direction to form a NAND string. On the end of the NAND string, another NAND string is formed following a space of, for instance, approximately 2F which has a width of approximately twice the space F between the memory cell transistors. Here, a contact is formed on the element active area region between the select gate transistors of the adjacent NAND strings.

In FIG. 1, a plurality of memory cell transistors connected in series constitutes a NAND memory cell unit 70, which is a part of a memory cell array. The memory cell transistors are connected at their sources and drains with each other in series via the diffused layer regions provided on the element active area regions.

First Embodiment

In the first embodiment of the present invention, the circuitry, planar pattern structure, operation mode, element cross-section structure, manufacturing method, and matrix circuitry will be described centered on memory cell transistors functioning as select gate transistors. The number of select gate lines and/or transistors can be one, two, or three as required as long as the cutoff characteristic is ensured. In addition, different electrical potentials may be applied to the select gate lines and/or transistors, or for each group of a predetermined number of bit lines the select gate lines may be short-circuited so that the electrical potential is the same.

In the first embodiment of the present invention, by replacing some word lines in the memory cell array with select gate lines, the NAND flash memory can be made to operate by having the region surrounded by the select gate lines and/or transistors as the writing/erasing unit. First, writing by injecting electric charges into a floating gate of a memory cell transistor makes the memory cell transistor operated as an enhancement mode select gate transistor. Here, if the cutoff characteristic cannot be ensured with only one select gate transistor, a plurality of (two or more) word lines connected in series are made to function as a select gate transistor. At this time, a select gate transistor provided by injecting electronic charges into a floating gate of a memory cell transistor indicates that any memory cell transistor can become a select gate transistor. Therefore, an arbitrary word line in the NAND column is selected as a select gate line and the memory cell transistors in the region surrounded by the select gate lines and/or transistors become a block as the writing/erasing unit. That is, a data unit smaller than a typical page size can be handled. The typical page size is determined by the number of the memory cell transistors contained in the NAND string multiplied by the page length. Hence, it is possible to provide a nonvolatile semiconductor memory with an improved writing/erasing speed due to the small block size of the writing/erasing unit, or a nonvolatile semiconductor memory, which has a high degree of efficiency in utilizing memory cell arrays with a less wasteful data region.

Figure 47:
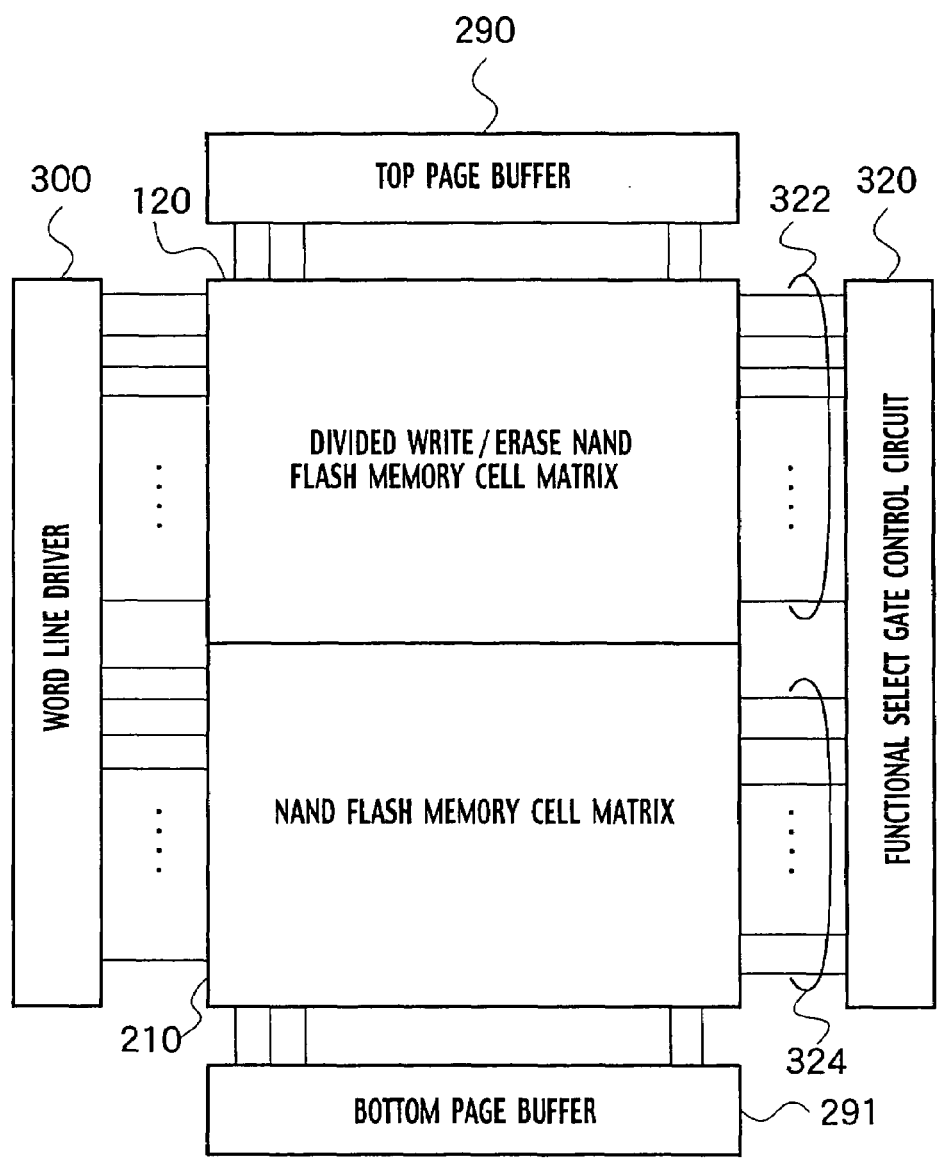
FIG. 47 is a view of the block structure of a nonvolatile semiconductor memory system according to a fourth modified example of the third embodiment of the present invention.
Figure 48:
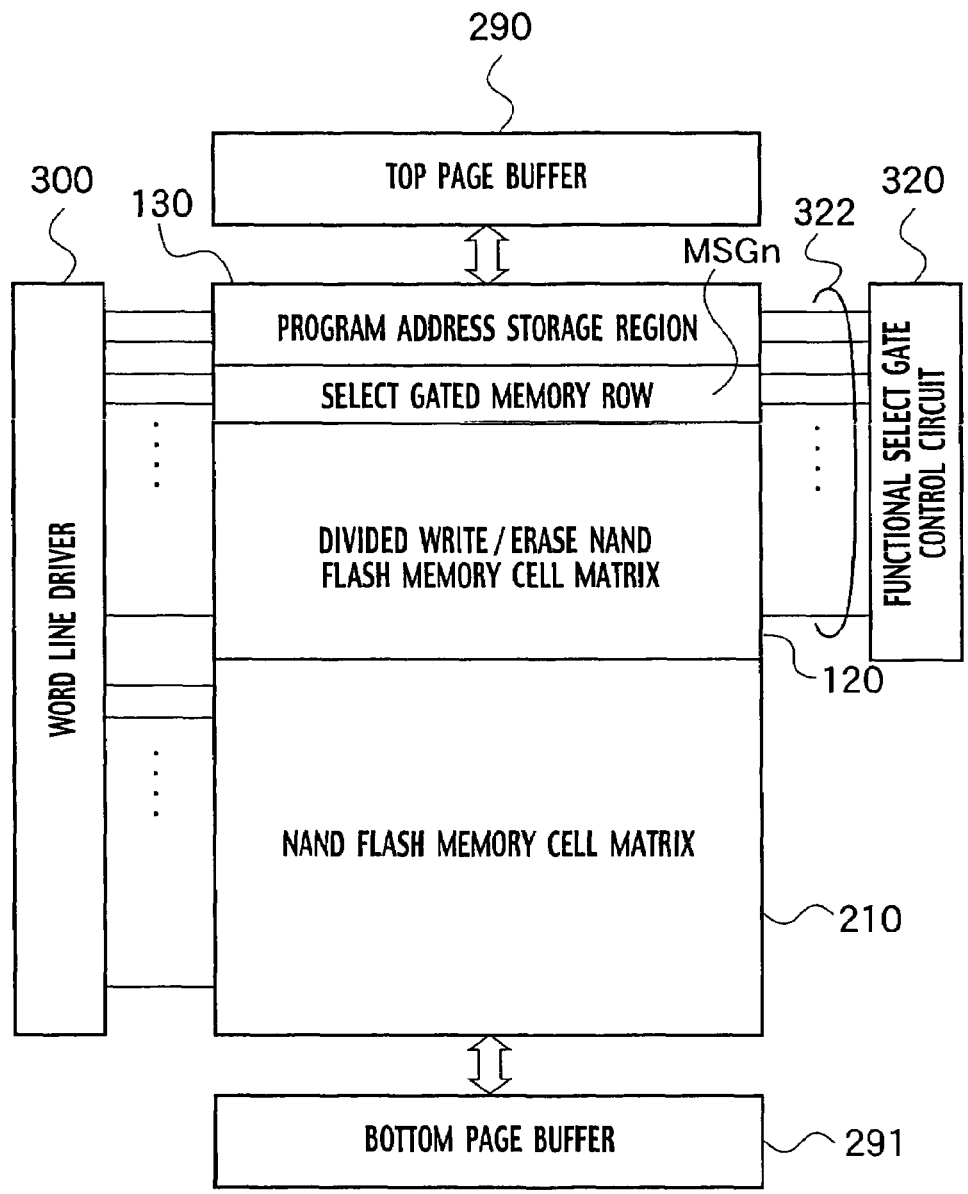
FIG. 48 is a view of the block structure of a nonvolatile semiconductor memory system according to a fifth modified example of the third embodiment of the present invention.

As shown in FIG. 2 to FIG. 7, a nonvolatile semiconductor memory cell matrix connectable to a functional select gate control circuit 320 generating a functional select gate control signal SGCS, such as shown in FIG. 47 and FIG. 48, includes a plurality of word lines WL0~WL32 arranged in a row direction, a bit line BL arranged in a column direction, and a plurality of memory cell transistors M1~M32 arranged in the column direction, each of the memory cell transistors having an electric charge storage layer 14, an electric charge storage state of the memory cell transistors M1~M32 being controlled by one of the word lines WL0~WL32, at least one of the memory cell transistors functions as a first select gate transistor MSGm by receiving the functional select gate control signal SGCS through the word line WLm, and injects an electric charge into the electric charge storage layer so as to form an enhancement mode transistor.

As shown in FIG. 2, FIG. 3 and FIG. 4, the nonvolatile semiconductor memory cell matrix may include a second select gate transistor MSGD arranged adjacent to one of the memory cell transistors disposed at one end side of the arrangement of the memory cell transistors M1~M32, and selects the memory cell transistors M1~M32 disposed in the arrangement, and a first select gate line SGD connected to a gate of the second select gate transistor.

Figure 7:
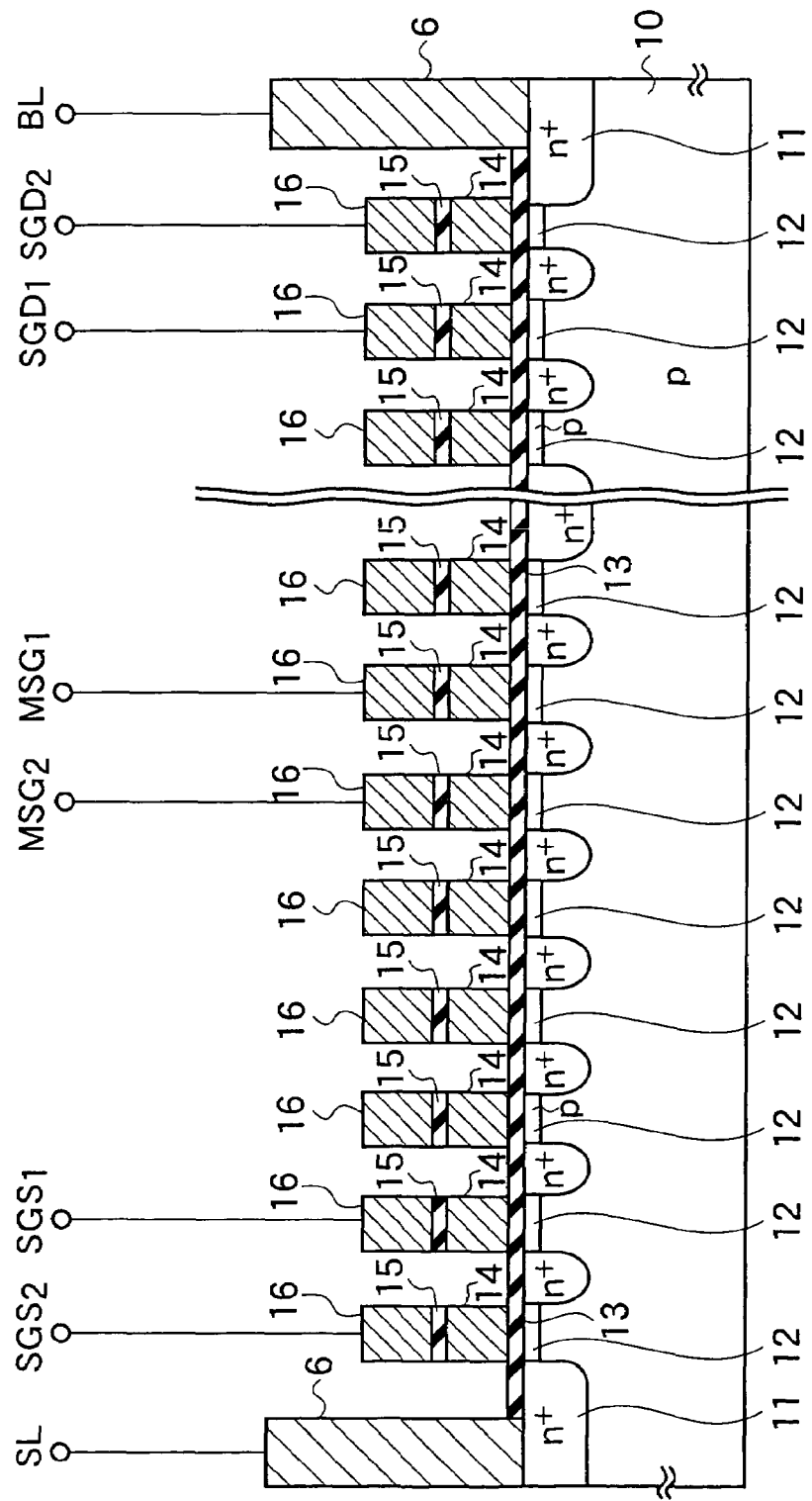
FIG. 7 is a schematic view of the element cross-section structure of a NAND flash memory according to a fifth modified example of the first embodiment of the present invention.

As shown in FIG. 7, the nonvolatile semiconductor memory cell matrix includes a plurality of select gate transistors (SGS1, SGS2), (SGD1, SGD2) connected in series adjacent to one of the memory cell transistors disposed at one end side of the arrangement of the memory cell transistors M1~M32, and selects the memory cell transistors M1~M32 disposed in the arrangement. Among the plurality of select gate transistors, a threshold voltage of a select gate transistor SGS1, SGD1 neighboring to the one end side of the arrangement is less than or equal to a threshold voltage of another select gate transistor SGS2, SGD2.

As shown in FIG. 5 and FIG. 6, among memory cell transistors M1~M32, another one of memory cell transistors function as another select gate transistors.

As shown in FIG. 3, the nonvolatile semiconductor memory cell matrix may includes a third select gate transistor MSGS arranged adjacent to one of the memory cell transistors disposed at the other side of the arrangement of the memory cell transistors M1~M32, and selects the memory cell transistors M1~M32 disposed in the arrangement, and a second select gate line SGS is connected to a gate of the third select gate transistor MSGS.

Planar Pattern and Basic Circuitry

FIGS. 2A and 2B are a structure view of a planar layout pattern and circuitry view of the NAND flash memory cell unit according to the first embodiment of the present invention. The first embodiment uses a design rule of F as an example. The gate length of a bit-line-side select gate line SGD, a source-line-side select gate line SGS, control gate lines (word lines) WL1 to WLm, WLm+1 through WLn to WL32 are the same as F. Note that the spaces between the bit-line-side select gate line SGD and the word line WL1, between the source-line-side select gate line SGS and the word line WL32, and between the word lines WL1 to WL32 have the same width F. Also, note that a contact opening BC for a bit line BL is provided above the bit-line-side select gate line SGD, and that a contact opening SC for a source line SL is provided below the source-line-side select gate line SGS.

The nonvolatile semiconductor memory cell matrix according to the first embodiment of the present invention, as shown in FIG. 2, is characterized in that in terms of the circuitry, memory cell transistors connected to the word lines WLm, WLm+1, and WLn are selected arbitrarily from among the plurality of word lines that are made to function as select gate lines and constitute memory cell transistor rows MSGm, MSGm+1, and MSGn functioning as select gate lines, respectively. By making not only the bit-line-side select gate line SGD and the source-line-side select gate line SGS on both sides of a NAND string, but also specific memory cell transistors from among the memory cell transistors M1 to M32 to function as select gate transistors, the number of memory cell transistors connected in series in the NAND string can be adjusted to an arbitrary size number. In the above example, memory cell transistors connected to the consecutive word lines WLm, WLm+1 are made to function as select gate transistors. This produces an effect of improving the cutoff characteristic of the transistors functioning as select gate transistors. If the electric current cutoff performance can be ensured as a memory cell transistor connected to the word line WLn in the above example, it is needless to say that only one select gate transistor may be used. In the first embodiment, it is obvious that the NAND string is divided into three parts.

First Modified Example of the First Embodiment

In the first embodiment, a memory cell array structure including memory cell transistors alone is formed not only by making part of the memory cell transistors of the NAND flash memory to be select gate transistors, but also by removing a select gate transistor itself of the pair in the NAND flash memory. Further, by adopting a method of making memory cell transistors function as select gate transistors to the memory cell array structure, the unit for writing/erasing can be reduced, or optimized.

Figure 3A:
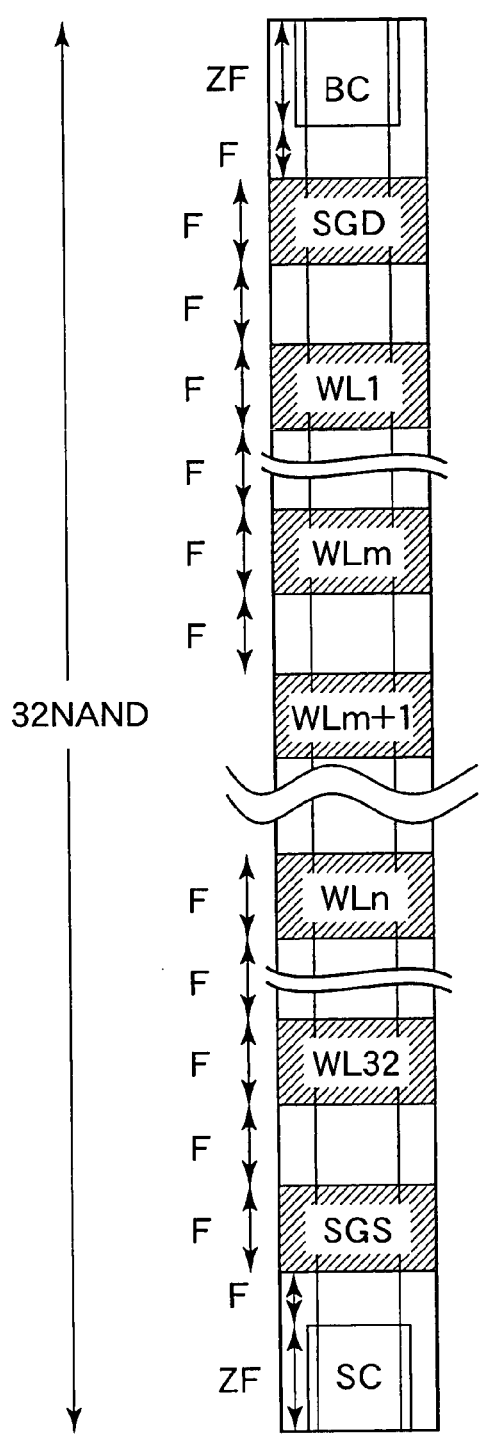
FIG. 3A is a schematic plan view of the layout pattern of a NAND flash memory according to a first modified example of the first embodiment of the present invention.
Figure 3B:
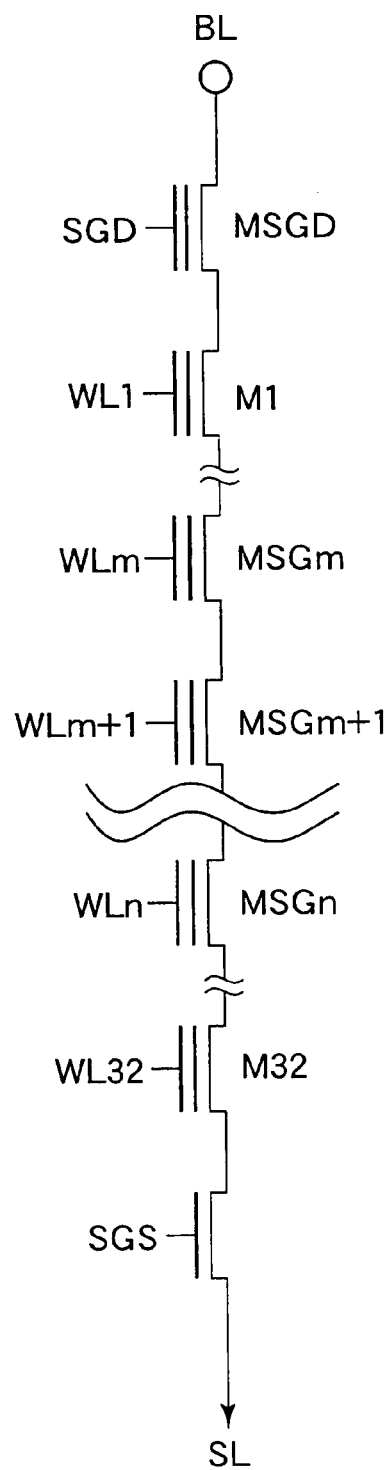
FIG. 3B is a circuitry view corresponding to FIG. 3A.

FIGS. 3A and 3B are a structure view of a planar layout pattern and a circuitry view of the NAND flash memory cell unit according to a first modified example of the first embodiment. As shown in FIG. 3, similar to the first embodiment, in terms of circuitry, memory cell transistors connected to the word lines WLm, WLm+1, and WLn, selected arbitrarily from among the plurality of word lines, are made to function as select gate transistors and constitute memory cell transistor rows MSGm, MSGm+1, and MSGn functioning as select gate lines, respectively. Further, the first modified example is characterized in that select gate transistor row connected to the bit-line-side select gate line SGD is constituted by the memory cell transistor row MSGD functioning as a select gate line. Among the bit-line-side select gate line SGD and the source-line-side select gate line SGS on both sides of the NAND strings, the transistor row constituting one side of the bit-line-side select gate line SGD, is constituted by memory cell transistors MSGD instead of MOS type select gate transistors, so that the memory cell transistors MSGD can be made to function as a select gate line, as required. The first modified example is the same as in the first embodiment that, by making specific memory cell transistors of memory cell transistors M1 to M32 function as select gate transistors, the number of memory cell transistors connected in series in a NAND string can be adjusted to an arbitrary number.

Second Modified Example of the First Embodiment

Figure 4A:
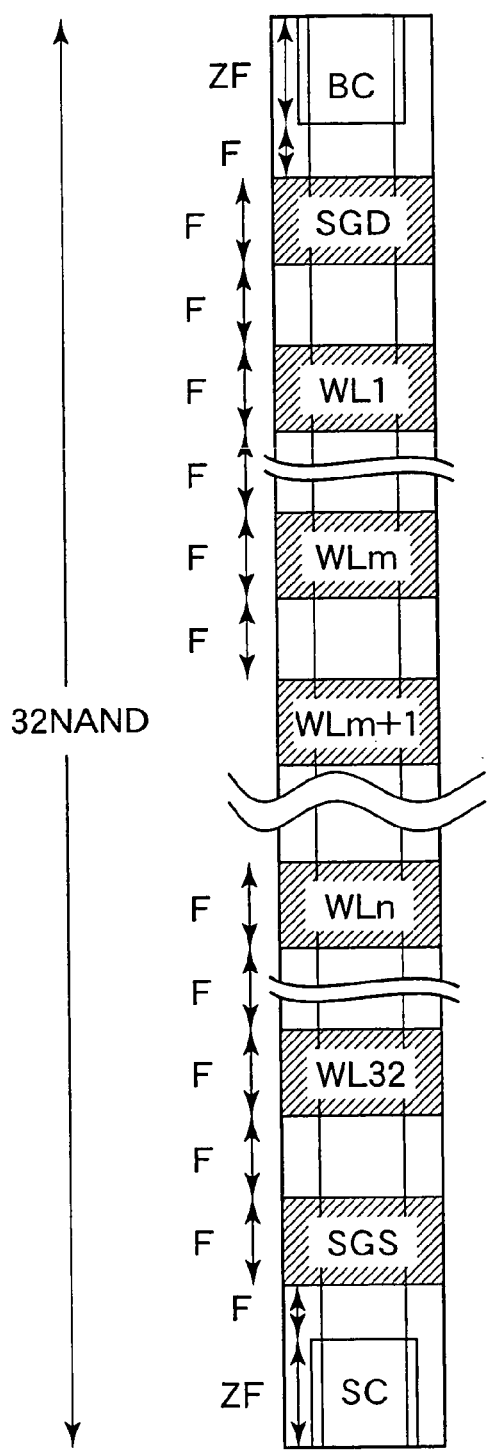
FIG. 4A is a schematic plan view of the layout pattern of a NAND flash memory according to a second modified example of the first embodiment of the present invention.
Figure 4B:
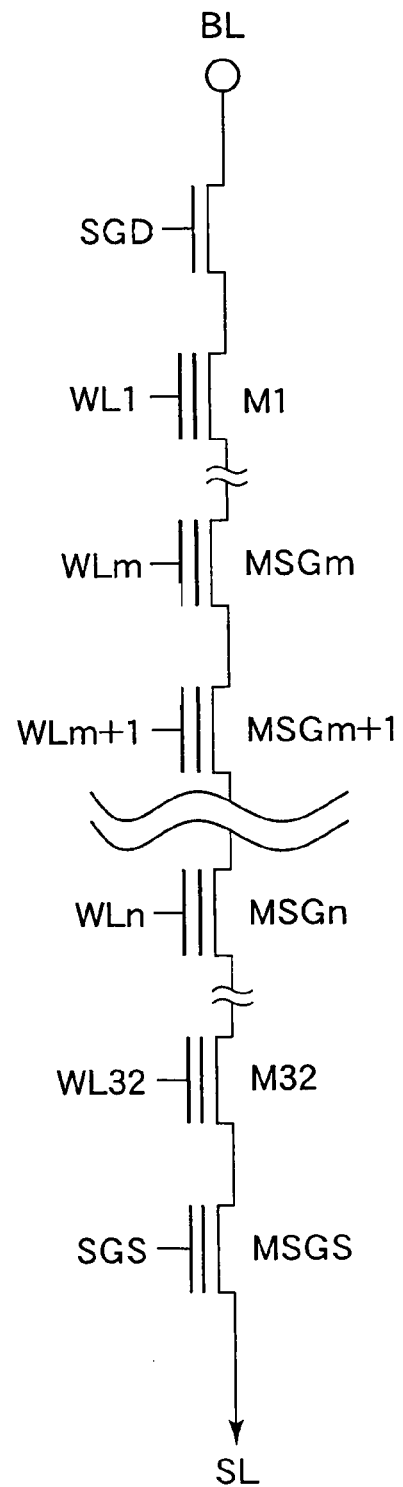
FIG. 4B is a circuitry view corresponding to FIG. 4A.

FIGS. 4A and 4B are a structure view of a planar layout pattern and a circuitry view of the NAND flash memory cell unit according to a second modified example of the first embodiment. As shown in FIG. 4, in terms of circuitry, the second modified example is the same as in the first embodiment in that, memory cell transistors connected to the word lines WLm, WLm+1, and WLn selected arbitrarily from among the plurality of word lines are made to function as select gate transistors and constitute memory cell transistor rows MSGm, MSGm+1, and MSGn functioning as select gate lines, respectively. Further, the second modified example is characterized in that a select gate transistor row connected to the source-line-side select gate line SGS is constituted by a memory cell transistor row MSGS functioning as a select gate line. The transistor row constituting one side of the source-line-side select gate line SGS, out of the bit-line-side select gate line SGD and the source-line-side select gate line SGS on both sides of NAND strings, is arranged by memory cell transistors instead of MOS transistors, so that the memory cell transistors can be made to function as select gate transistors as required. The second modified example is the same as in the first embodiment that, by making specific memory cell transistors of memory cell transistors M1 to M32 function as select gate transistors, the number of memory cell transistors connected in series in a NAND string can be adjusted.

Third Modified Example of the First Embodiment

In the first embodiment, a memory cell array structure including memory cell transistors alone is formed, not only by making part of the memory cell transistors of the NAND flash memory to be select gate transistors, but also by removing both of the select gate transistors themselves in the NAND flash memory. Further, by adopting a method of making memory cell transistors function as select gate transistors to the memory cell structure, reduction or optimization of the unit for writing/erasing can be achieved.

Figure 5A:
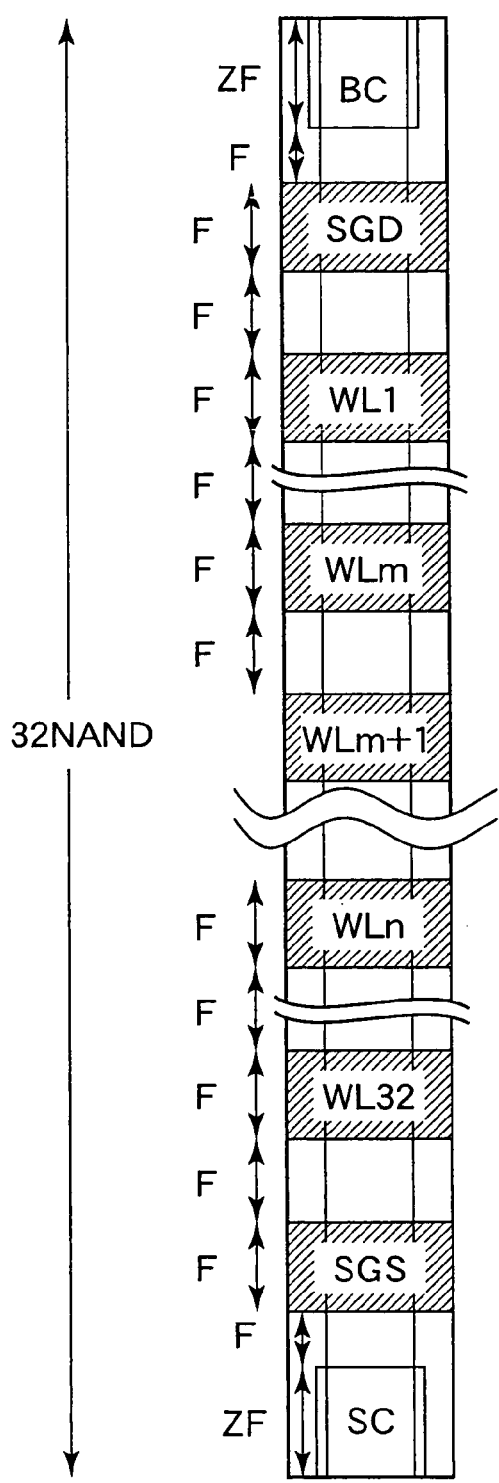
FIG. 5A is a schematic plan view of the layout pattern of a NAND flash memory according to a third modified example of the first embodiment of the present invention.
Figure 5B:
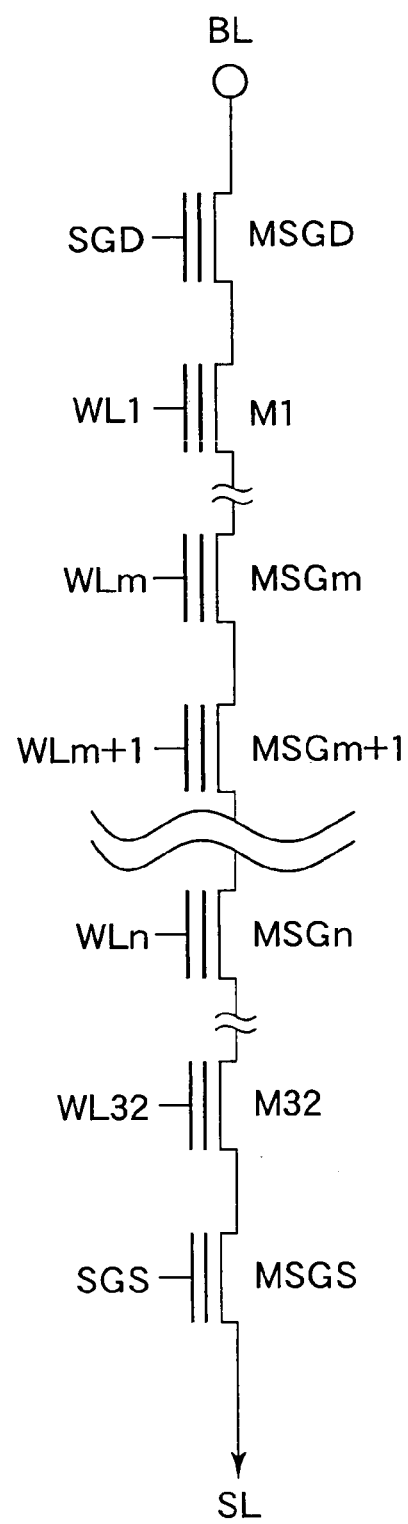
FIG. 5B is a circuitry view corresponding to FIG. 5A.

FIGS. 5A and 5B are a structure view of a planar layout pattern and a circuitry view of the NAND flash memory cell unit according to a third modified example of the first embodiment. As shown in FIG. 5, in terms of circuitry, the third modified example is the same as in the first embodiment in that, memory cell transistors connected to the word lines WLm, WLm+1, and WLn are selected arbitrarily from among the plurality of word lines and are made to function as select gate transistors and constitute memory cell transistor rows MSGm, MSGm+1, and MSGn functioning as select gate transistors, respectively. Further, the third modified example is characterized in that a select gate transistor connected to the bit-line-side select gate line SGD is constituted by a memory cell transistor row MSGD functioning as a select gate line and that select gate transistors connected to the source-line-side select gate line SGS is constituted by a memory cell transistor row MSGS functioning as a select gate line. The transistor rows constituting both the bit-line-side select gate line SGD and the source-line-side select gate line SGS on both sides of a NAND string are constituted by arranging memory cell transistors instead of MOS transistors so that the memory cell transistors can be made to function as select gate transistors as required. The third modified example is the same as the first embodiment in that, by making specific memory cell transistors of memory cell transistors M1 to M32 function as select gate transistors, the number of memory cell transistors connected in series in a NAND string can be adjusted to an arbitrary number. In the third modified example, a NAND string can be configured without distinguishing a MOS transistor from a memory cell transistor used for a select gate transistor.

Fourth Modified Example of the First Embodiment

Figure 6A:
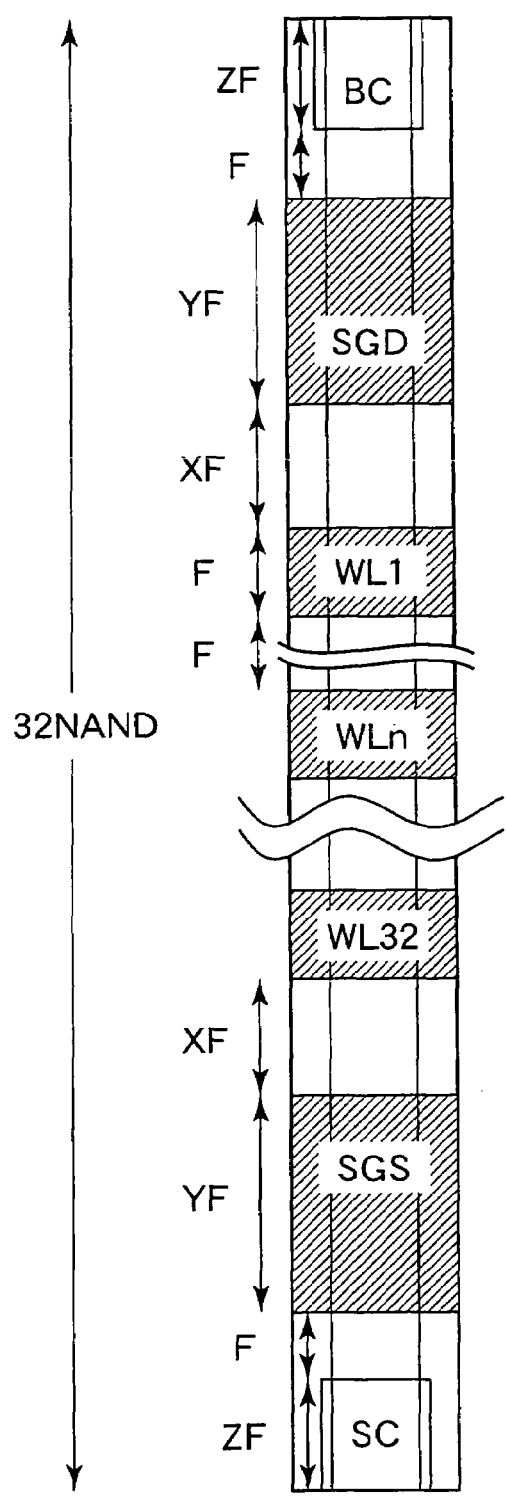
FIG. 6A is a schematic plan view of the layout pattern of a NAND flash memory according to a fourth modified example of the first embodiment of the present invention.
Figure 6B:
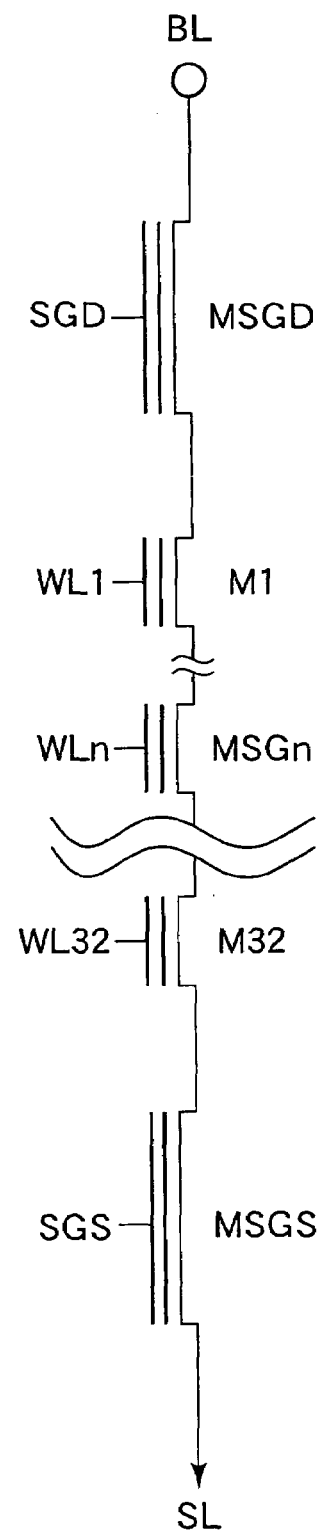
FIG. 6B is a circuitry view corresponding to FIG. 6A.

FIGS. 6A and 6B are a structure view of a planar layout pattern and a circuitry view of the NAND flash memory cell unit according to a fourth modified example of the first embodiment of the present invention. In this example, the gate length YF of the bit-line-side select gate line SGD and the source-line-side select gate line SGS is longer than the gate length F of control gates (word lines) WL1 to WL32. The reason for the difference in length is to maintain good cutoff characteristic of the select gate transistors. In addition, the gate length of, and the spaces between, the control gates (word lines) WL1 to WL32 is the same, i.e., F. Note that a contact opening BC for a bit line BL is provided above the bit-line-side select gate line SGD, and that a contact opening SC for a source line SL is provided below the source-line-side select gate line SGS. The nonvolatile semiconductor memory cell matrix according to the fourth modified example of the first embodiment of the present invention, as shown in FIG. 6, is characterized in that, in terms of the circuitry, a memory cell transistor connected to the word line WLn selected arbitrarily from among the plurality of word lines is made to function as a select gate transistor, and constitute a memory cell transistor row MSGn which functions as a select gate line. By making not only the bit-line-side select gate line SGD and the source-line-side select gate line SGS on the both sides of a NAND string, but also a specific memory cell transistor from among memory cell transistors M1 to M32 to function as a select gate transistor, the memory cell transistors connected in series in the NAND string can be divided into two.

Further, the fourth modified example is characterized in that a select gate transistor connected to the bit-line-side select gate line SGD is constituted by a memory cell transistor row MSGD functioning as a select gate line and that select gate transistors connected to the source-line-side select gate line SGS is constituted by a memory cell transistor row MSGS functioning as a select gate line. The transistor rows constituting both the bit-line-side select gate line SGD and the source-line-side select gate line SGS on both sides of a NAND string are constituted by arranging memory cell transistors instead of MOS transistors so that the memory cell transistors can be made to function as select gate transistors as required.

A scaling-rule for miniaturizing this NAND flash memory cell is now considered. Taking the design rule F as an example, as shown in FIG. 6, when Y is a positive integer greater than one, the gate length of the bit-line-side select gate line SGD is YF and the source-line-side select gate line SGS is also YF, and are longer than the gate length F of control gates (word lines) WL1 to WL32. In addition, when X is a positive integer greater than one, the space XF between the word line WL1 closest to the bit line BL and the bit-line-side select gate line SGD, and the space XF between the word line WL32 closest to the source line SL and the source-line-side select gate line SGS are wider than the spaces F between the word lines.

The reason that the gate length YF of the bit-line-side select gate line SGD and the source-line-side select gate line SGS is longer than the gate length F of control gates (word lines) WL1 to WL32 is, as previously mentioned, to increase the value of the punch through breakdown voltage of both select gate transistors. However an additional reason is to prevent the channel potential of a write inhibited NAND column, boosted by capacitive-coupling at writing, from decreasing due to leakage currents through the select gate transistors. If punch-through occurs in a select gate transistor and thus the write inhibited electrical potential is reduced, a write error occurs in the unselected writable memory cell transistor. The reason why space XF between the word line WL1 closest to the bit line BL and the bit-line-side select gate line SGD, and the space XF between the word line WL32 closest to the source line SL and the source-line-side select gate line SGS are wider than the spaces F between the word lines, is to improve the process margin of a plurality of word lines WL including with an un-periodical pattern of the source-line-side select gate line SGD and/or the source-line-side select gate line SGS. The tendency that the gate length of the bit-line-side select gate line SGD and the source-line-side select gate line SGS are longer than the word lines WL1 to WL32, and that the space between the word line WL1 closest to the bit line BL and the bit-line-side select gate line SGD and the space between the word line WL32 closest to the source line SL and the source-line-side select gate line SGS are wider than the spaces F between the word lines becomes more prominent as the design rule becomes finer. Note that BC and SC are contact openings for the bit line BL and the source line SL, respectively.

Fifth the Modified Example of the First Embodiment (Element Cross-Section Structure)

In the first embodiment of the present invention, the nonvolatile semiconductor memory cell matrix according to the fifth modified example, as shown in the element cross-section structure of FIG. 7, has a series of memory cell transistors of a floating gate structure and contact plugs 6 for the bit line BL and the source line SL. The structure forms a NAND string, configured on a p-type semiconductor substrate 10.

The memory cell transistor has a laminated structure consisting of a first conductive layer 14 placed on a gate insulating film 13 to function as a tunnel gate insulating film; an inter-gate insulating film 15; and a second conductive layer 16 to function as a control gate. The first conductive layers 14 electrically insulated from each other, operate as floating gate electrodes of nonvolatile memory cell transistors capturing and injecting electrons. The operational of the memory cell transistor is same as an operational of a usual NAND flash memory cell transistor. The source/drain diffusion layers 11 of the memory cell transistors are arranged in series so as to form common regions, respectively, in a series of memory cell transistors as a NAND string. Channel ion-implanted layers 12 are formed in the channel portions between the sources and the drains.

The fifth modified example is characterized in that select gate transistors are provided by not particularly making the MOS transistors as select gate transistor parts and by making the memory cell transistor function as select gate transistors without particularly forming MOS transistors as select gate transistors. The parts of the memory cell transistors connected to the source-line-side select gate lines SGS1, SGS2 and the bit-line-side select gate lines SGD1, SGD2 are considered as the memory cell transistors which function as select gate transistors. Furthermore, in the fifth modified example, of the consecutive memory cell transistors in a NAND string, memory cell transistor rows MSG1, MSG2 that function as select gate lines are formed. That is, two select gate transistors are provided on each of the source side and bit line side of the NAND string. In addition, two select gate transistors are provided, which are two consecutive select gate transistors at an arbitrary location in the memory cell transistors in the NAND string.

According to the configuration of the fifth modified example, the nonvolatile semiconductor memory cell matrix with select gate transistors having good cutoff characteristics, and an arbitrary data write/erase unit and a high degree of freedom in changing the size of the data write/erase unit is achieved.

(Operating Method)

(Operation of Memory Cell)

Figure 8A:
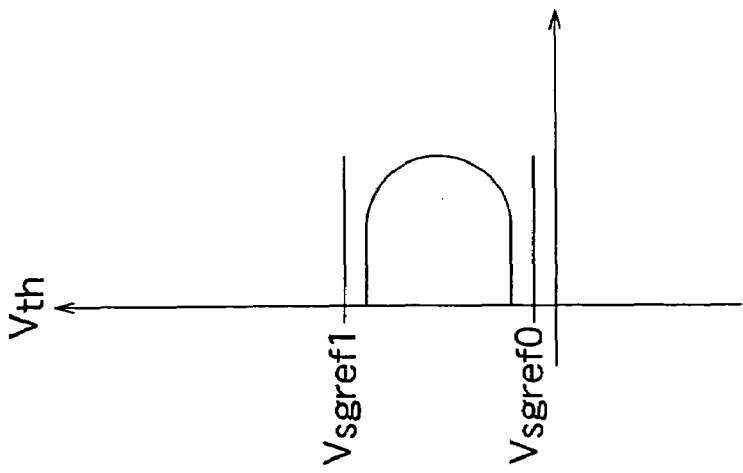
FIG. 8A is a view for explaining the operation method for a memory cell as a basic unit in a nonvolatile semiconductor memory according to the first embodiment of the present invention and showing the threshold value characteristic of a four-value memory.
Figure 8B:
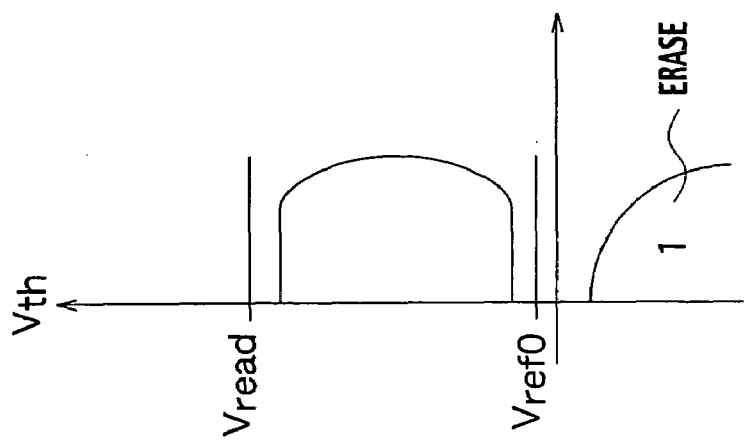
FIG. 8B is a view for explaining the operation method for a memory cell as a basic unit in the nonvolatile semiconductor memory according to the first embodiment of the present invention and showing the threshold value characteristic of a binary memory.

The method for operating a memory cell as a basic unit of the nonvolatile semiconductor memory cell matrix, according to the first embodiment of the present invention, is shown in FIGS. 8A and 8B.

Figure 8C:
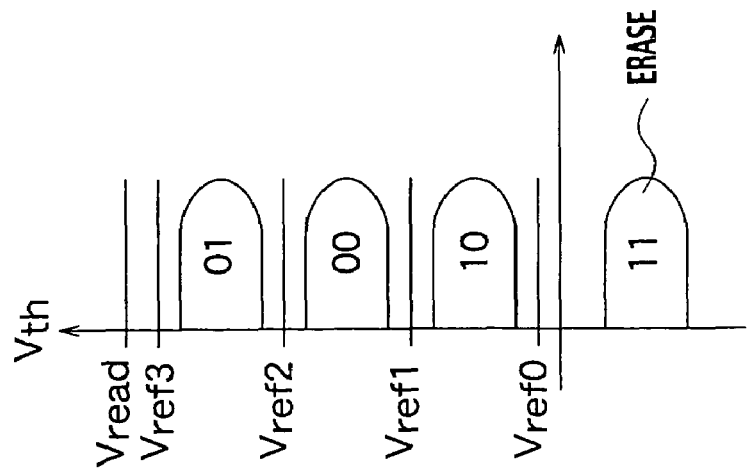
FIG. 8C is a view showing the threshold value characteristic of a memory cell transistor functioning as a select gate transistor.

FIG. 8 denotes histograms showing the distribution of threshold voltages. In FIG. 8, the ordinate represents the threshold voltage, and the abscissa represents the frequency. FIG. 8A shows the case when the memory cell operated as a four-value memory, and FIG. 8B shows the case when the memory cell operated as a binary memory. Moreover, FIG. 8C shows the threshold voltage characteristic of a memory cell transistor functioning as a select gate transistor. The memory cell transistor functioning as a select gate transistor may be placed at a position where a select gate transistor is originally placed so as to connect to a source line SL or a bit line BL, or may be a memory cell transistor in a series of memory cell transistors. Voltages applied to a memory cell transistor shown in FIGS. 8A and 8B are completely independent of voltages applied to a memory cell transistor functioning as a select gate transistor shown in FIG. 8C. The threshold voltage characteristic shown in FIG. 8A indicates the operating method for achieving a four-value memory, and the distribution of threshold voltages is set so that a read voltage Vread is divided into approximately three equal parts. For example, when "11" indicates an erase state, a write state "10", is distributed between threshold voltage levels Vref0 and Vref1, and the memory cell transistor is at an ON state when the voltages are higher than the threshold voltage level Vref1. The memory cell transistor is at an OFF state at voltages lower than the threshold voltage level Vref0. For a write state of "00", voltages are distributed between threshold voltage levels Vref1 and Vref2, and the memory cell transistor is at an ON state at voltages higher than the threshold voltage level Vref2. The memory cell transistor is at an OFF state at voltages lower than the threshold voltage level Vref1. For a write state of "01", voltages are distributed between threshold voltage levels Vref2 and Vref3, and the memory cell transistor is at an ON state at voltages higher than the threshold voltage level Vref3. The memory cell transistor is at an OFF state when voltages are lower than the threshold voltage level Vref2.

On the other hand, the threshold voltage characteristic of FIG. 8B shows the operating method for achieving a binary memory. For example, when the erase state is expressed by levels at and below Vref0, the erase state enables a write state of "1" to be indicated. Moreover, the memory cell transistor is at an ON state at voltages higher than the threshold voltage level Vread, and the memory cell transistor is at an OFF state at voltages lower than the threshold voltage level Vref0.

On the other hand, the threshold voltage characteristic of the memory cell transistor, which functions as a select gate transistor, as shown in FIG. 8C, holds a threshold voltage characteristic similar to a common MOS transistor. That is, the select gate transistor is at an ON state at voltages higher than the threshold voltage level Vsgref1, and the select gate transistor is at an OFF state at voltages of lower than the threshold voltage level Vsgref0.

By applying the read voltage Vread, the threshold voltage levels Vref0, Vref1, Vref2 and Vref3, and the like shown in FIGS. 8A, 8B to the second conductive layer 16, which acts as the control gate of a memory cell transistor and is connected to word line WL, the operation of the memory cell transistor can be achieved. As specific values, for example, the Vread is 5V and the Vref0 is 0V. The values of Vref1, Vref2, and Vref3, and the like need only be set so as to secure sufficient threshold levels by dividing the read voltage Vread into three equal parts. On the other hand, in the threshold voltage characteristic of the memory cell transistor functioning as a select gate transistor shown in FIG. 8C, the threshold voltage level Vsgref1 should be set, for example, between 1.5 and 2V and the threshold voltage level Vsgref0 to 0V.

(Operation Mode 1)

Figure 9:
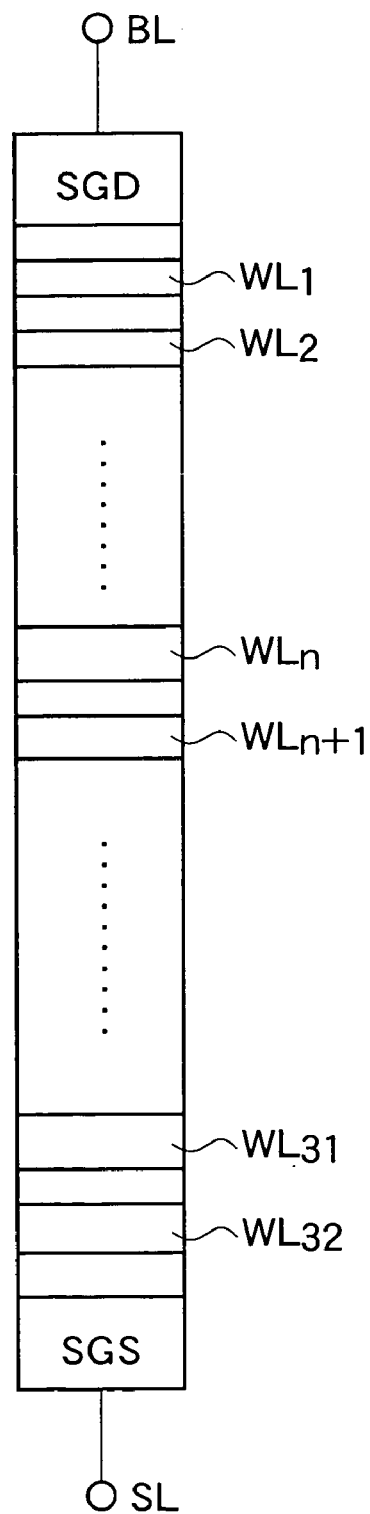
FIG. 9 is a view for explaining the first operation method for the nonvolatile semiconductor memory according to the first embodiment of the present invention and showing an example of making a memory cell transistor in a NAND string, connected with a word line WLn, function as a select gate transistor.
Figure 10:
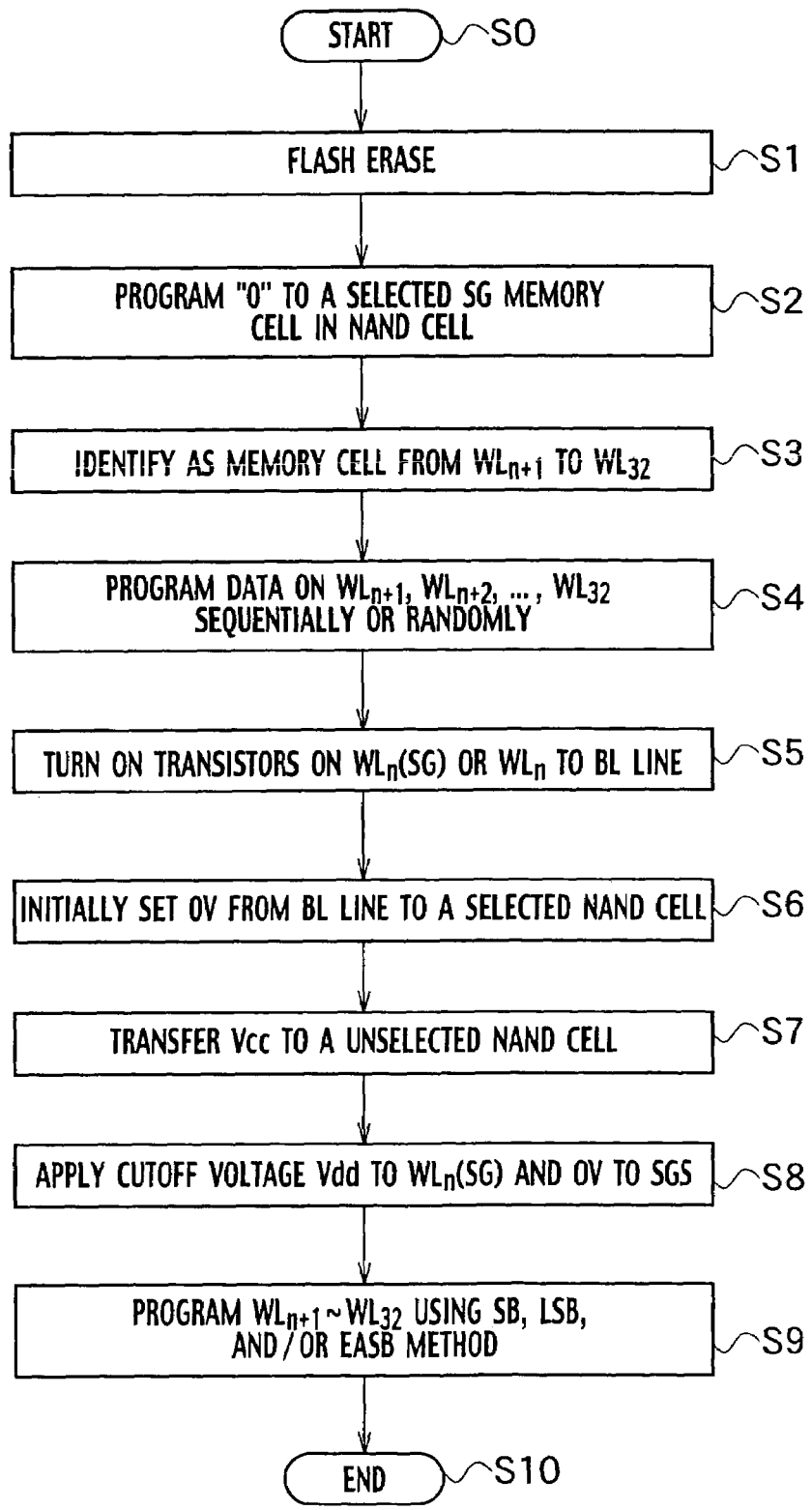
FIG. 10 is a flow chart for explaining the operation when making the memory cell transistor connected with the word line WLn function as a select gate transistor.

The first method for operating the nonvolatile semiconductor memory cell matrix according to the first embodiment of the present invention, as shown in FIG. 9, can be described with reference to an example where a memory cell transistor connected to a word line WLn in a NAND string functions as a select gate transistor. FIG. 9 illustrates schematically a single NAND string. An operation can be described using a flow chart of FIG. 10 in a case where, in the word lines WL1 through WLn, WLn+1 to WL32 sandwiched by the bit-line-side select gate line SGD and the source-line-side select gate line SGS, the memory cell transistor connected to the word line WLn functions as a select gate transistor.

(a) The operation starts at step S0, and in step S1 the flash erase of memory cell transistors is performed. Here, the memory cell transistors are erased in an erase unit, i.e. an erase block, instead of the entire chip.

(b) Next in step S2, "0" is programmed by injecting electrons into a floating gate of a SG (select gate) memory cell transistor in the memory cell transistors, which constitute a NAND string.

(c) Next in step S3, the memory cell transistors connected to the word lines WLn+1 to WL32 are identified as memory cell transistors.

(d) Next in step S4, the memory cell transistors connected to the word lines WLn+1 to WL32 are programmed sequentially in order or randomly as memory cell transistors.

(e) Next in step S5, the memory cell transistors of word line WLn (SG), which is connected with the memory cell transistor row MSGn functioning as a select gate line, or memory cell transistors connected between WLn and WL1 on bit line BL side are set to an ON state.

(f) Next in step S6, a low-potential bit line voltage VBL=LOW, e.g. 0V, is initially set from bit line BL to the memory cell transistor row MSGn functioning as a select gate line.

(g) Next in step S7, a high-potential bit line voltage VBL=HIGH, e.g. Vcc, is transferred to an unselected NAND memory cell transistor.

(h) Next in step S8, a cutoff voltage (OFF voltage), e.g. Vdd, is applied to the word line WLn connected with the memory cell transistor row MSGn functioning as a select gate line. A low potential, e.g. 0V, is set to the source-line-side select gate line SGS.

(i) Next in step S9, the memory cell transistors connected to the word lines WLn+1 to WL32 are programmed by use of a self boost method, a local self boost method, or an erased area self boost method. The operation ends at step S10.

In the above, the position of WLn can be selected arbitrarily. Moreover, the value of n can be set to an arbitrary position according to the frequency of the operating mode, when desired. In this way, the method of handling a data unit smaller than the number of the memory cell transistors contained in a NAND string multiplied by the page length (equal to page size) can be achieved.

(Operation Mode 2)

Figure 11:
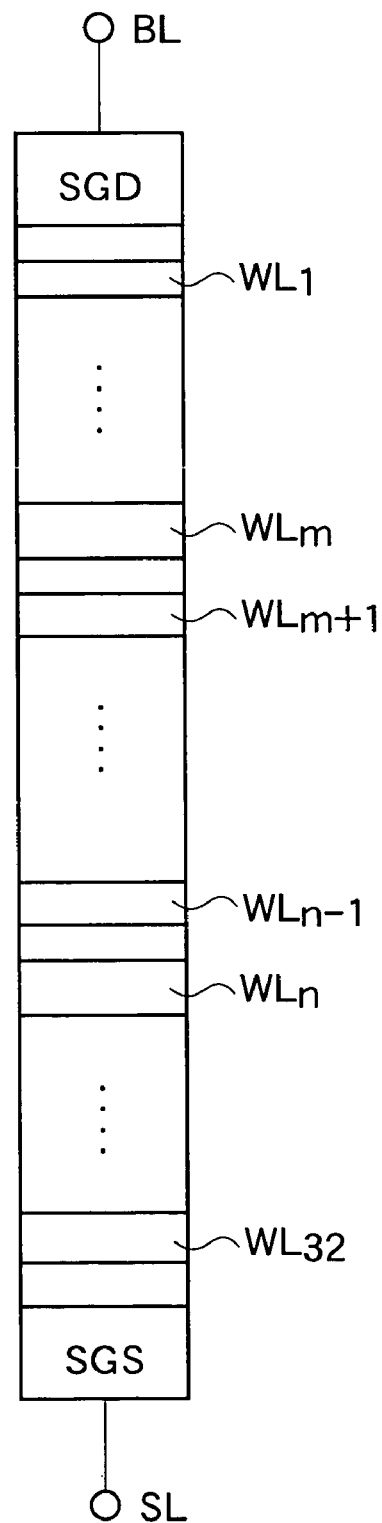
FIG. 11 is a view for explaining the second operation method for the nonvolatile semiconductor memory according to the first embodiment of the present invention and showing an example of making memory cell transistors in a NAND string, connected with two word lines WLm, WLn function as select gate transistors.
Figure 12:
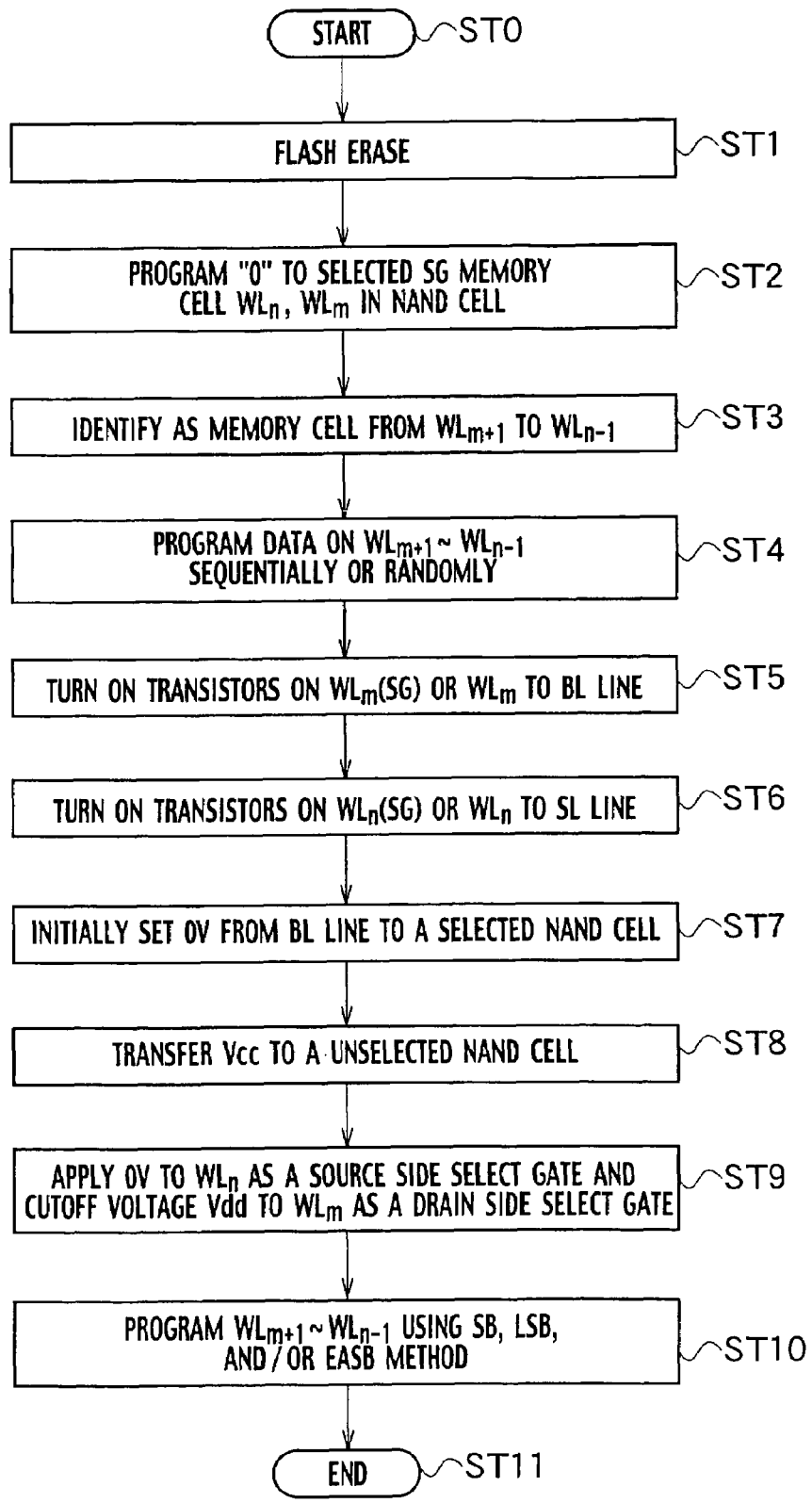
FIG. 12 is a flow chart for explaining the operation when making the memory cell transistors connected with the word lines WLm, WLn function as select gate transistors.

The second method for operating the nonvolatile semiconductor memory cell matrix according to the first embodiment of the present invention, as shown in FIG. 11, can be described with reference to an example where memory cell transistors connected to the two word lines WLm, WLn in a single NAND string is made to function as select gate transistors. FIG. 11 illustrates a NAND string schematically. An operation can be described using a flow chart of FIG. 12 in a case where, in the word lines WL1 through WLm, WLm+1 through WLn, and WLn+1 to WL32 sandwiched by the bit-line-side select gate line SGD and the source-line-side select gate line SGS, the memory cell transistors connected to the word lines WLm, WLn will function as select gate transistors.

(a) The operation starts at step ST0, and in step ST1 the flash erase of memory cell transistors is performed. Here, the memory cell transistors are erased in an erase unit, i.e. an erase block, instead of the entire chip.

(b) Next in step ST2, "0" is programmed by injecting electrons into the memory cell transistors connected to the word lines WLn, WLm, as (SG) select gate memory cell transistors in the memory cell transistors which configure a NAND string.

(c) Next in step ST3, the memory cell transistors connected to the word lines WLm+1 to WLn−1 are identified as memory cell transistors.

(d) Next in step ST4, the memory cell transistors connected to the word lines WLm+1 to WLn−1 are programmed sequentially or randomly as memory cell transistors.

(e) Next in step ST5, the memory cell transistors of word line WLm (SG), which is connected with the memory cell transistor row MSGm functioning as a select gate line, or memory cell transistors between WLm and WL1 on bit line BL side are set to an ON state.

(f) Next in step ST6, the transistors of word line WLn (SG), which are connected with the memory cell transistor row MSGn functioning as a select gate line, or memory cell transistors between WLn and WL32 on source line SL side are set to an ON state.

(g) Next in step ST7, a low-potential bit line voltage VBL=LOW, e.g. 0V, is initially set from the bit line BL to the memory cell transistor row MSGm functioning as a select gate line.

(h) Next in step ST8, a high-potential bit line voltage VBL=HIGH, e.g. Vcc, is transferred to an unselected NAND memory cell transistor.

(i) Next in step ST9, a cutoff voltage (OFF voltage), e.g. Vdd, is applied to the word line WLm connected with the memory cell transistor row MSGm functioning as a select gate line. A low potential, e.g. 0V, is set to the word line WLn connected with the memory cell transistor row MSGn functioning as a select gate line on the source line side.

(j) Next in step ST10, the memory cell transistors connected to the word lines WLm+1 to WLn−1 are programmed by use of a self boost method, a local self boost method, or an erased area self boost method, and the operation ends at step ST11.

In the above, it is needless to say that the positions of word lines WLm and WLn can be selected arbitrarily. Moreover, the values of m, n can be set to any desired position according to the frequency of the operating mode. In this way, the method of handling a data unit smaller than the number of the memory cell transistors contained in a NAND string multiplied by the page length (equal to page size) can be achieved. In the case of the second operating mode, a series of memory cell transistors, which constitute a NAND string, can be divided into more, i.e. three, parts compared with the first operating mode.

Sixth Modified Example of the First Embodiment (Cross-Section Structure of MONOS Structure Element)

Figure 13:
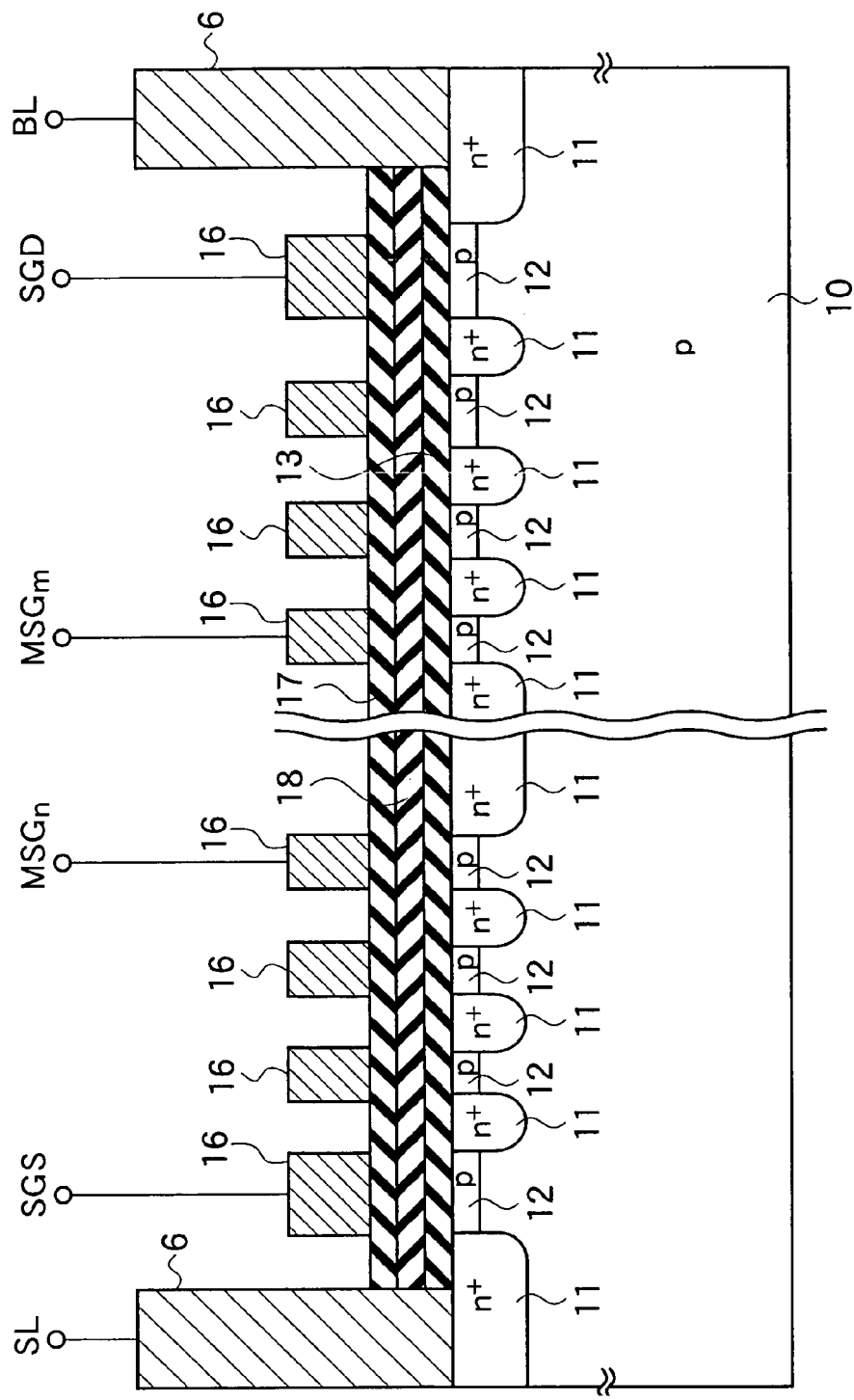
FIG. 13 is an element cross-section structure view of a MONOS structure of a nonvolatile semiconductor memory according to a sixth modified example of the first embodiment of the present invention.

In the first embodiment of the present invention, the nonvolatile semiconductor memory cell matrix according to the sixth modified example, as shown in the element cross-section structure of FIG. 13, has a series of memory cell transistors of a MONOS structure and contact plugs 6 for the bit line BL and the source line SL on a p-type semiconductor substrate 10. A series of memory cell transistors form a NAND string. The memory cell transistor has a laminated structure consisting of an electric charge layer 18 made of an SiN film on a gate insulating film 13 functioning as a tunnel gate insulating film; a block insulating film 17; and a conductive layer 16 functioning as a control gate. The electric charge layer 18 formed by an SiN film captures or injects electrons to operate as a nonvolatile memory cell, the same as a common NAND flash memory of a MONOS structure. The source/drain diffusion layers 11 of the memory cell transistors are arranged in series so as to form common regions in a series of memory cell transistors forming a NAND string. A channel ion implanted layer 12 is formed in the channel portions between the sources and the drains as required.

The sixth modified example is characterized in that select gate transistors are provided without particularly forming MOS transistors of select gate transistors, by making the select gate transistors configured by the MONOS structure the same as the structure of the memory cell transistor, to function as the select gate transistor of the memory cell transistor. The memory cell transistors connected to the portions of the source-line-side select gate line SGS and the bit-line-side select gate line SGD correspond to memory cell transistors function as the select gate transistors. Furthermore, in the sixth modified example, memory cell transistor rows MSGm, MSGn are formed as select gate lines of the isolated memory cell transistors in a NAND string.

That is, one select gate line is provided on each of the source side and bit line side of the NAND string. In addition, two select gate lines are provided at an arbitrary location of the memory cell transistors in the NAND string. According to the configuration of the sixth modified example, also in the MONOS structure, a nonvolatile semiconductor memory cell matrix having an arbitrary write/erase data unit and moreover, having a good cutoff characteristic, with a high degree of freedom in changing the size of the data write/erase unit, can be achieved.

Seventh Modified Example of the First Embodiment (Plan Pattern of Matrix Structure)

Figure 14:
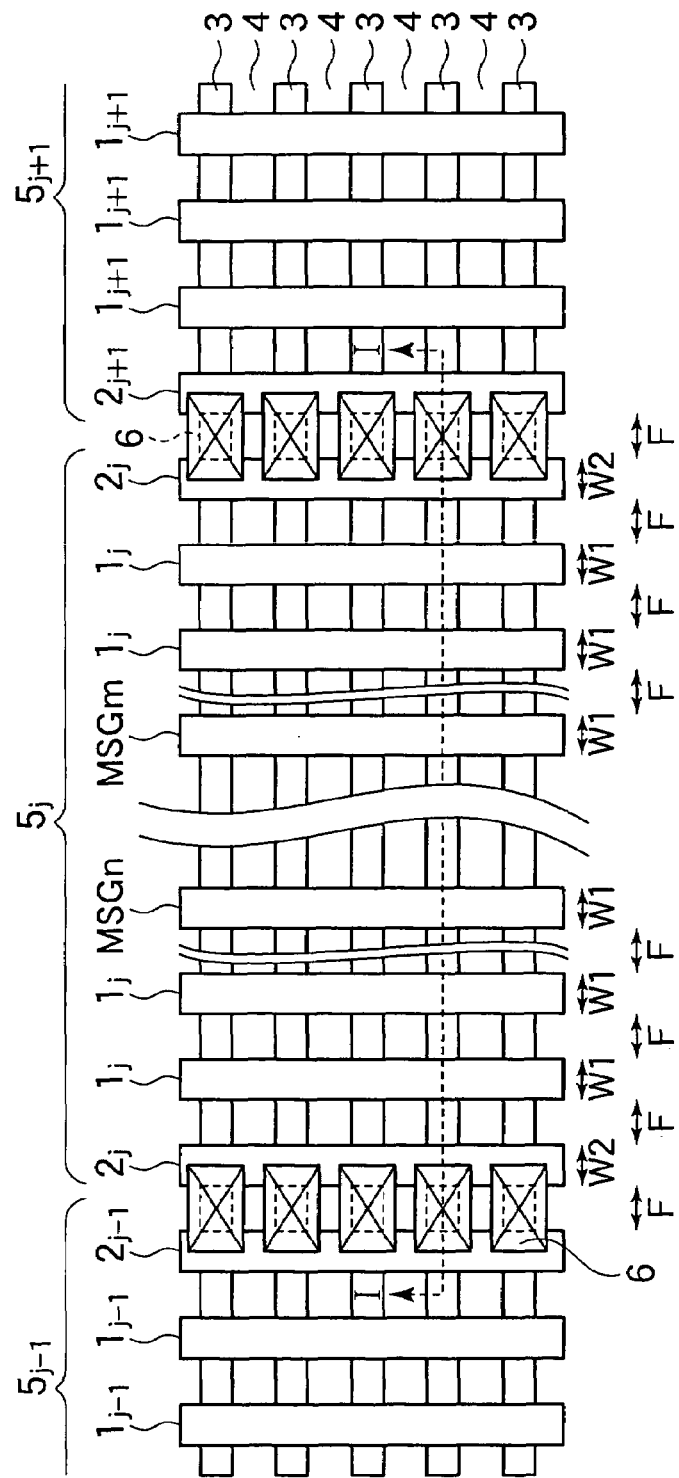
FIG. 14 is a plan view showing the structure of a nonvolatile semiconductor memory according to a seventh modified example of the first embodiment of the present invention.

FIG. 14 shows a planar form of the matrix structure of the memory cell units of the NAND nonvolatile semiconductor memory cell matrix according to a seventh modified example of the first embodiment of the present invention.

FIG. 14 shows an example in which, of the memory cell transistors forming the NAND string, memory cell transistors corresponding to word lines WLm, WLn constitute memory cell transistor rows MSGm, MSGn functioning as select gate lines.

As shown in FIG. 14, a plurality of linear memory cell gates $1_j$ is formed parallel to each other. On both sides of the plurality of memory cell gates $1_j$, a select gate 2 on each side is formed parallel to each other and linearly parallel to the memory cell gate $1_j$. Here, the plurality of memory cell gates $1_j$ has the same gate length W1. Note that the plurality of memory cell gates $1_j$ may consist of a number such as eight or sixteen arranged in the column direction. Furthermore, the select gates $2_j$ has the same gate length W2. The gate length W2 may be equal to or different from the gate length W1 of the memory cell gate $1_j$.

Spaces F (F being a minimum feature size) of the same width are provided between the memory cell gates $1_j$. The space F is equal to the gate length W1 of the memory cell gate $1_j$. Furthermore, in the example shown in FIG. 14, a spaces F of the same width as the space F between the memory cell gates $1_j$ are provided between the select gates $2_j$ adjacent thereto.

In the column direction orthogonal to the row direction in which the memory cell gates $1_j$ are elongated, element active area regions 3 are formed parallel to each other. The element active area regions 3 are divided individually by a plurality of element isolation regions 4 formed in parallel to each other in the column direction. Contact plug 6 is formed on the element active area region 3 between select gates $2_j$, $2_{j−1}$ of adjacent NAND strings $5_j$, $5_{j−1}$. Likewise, contact plugs 6 are formed on the element active area regions 3 between select gates $2_j$, $2_{j+1}$ of adjacent NAND strings $5_j$, $5_{j+1}$.

As described above, the memory cell units formed of a plurality of NAND strings $5_j$, $5_{j+1}$, $5_{j+2}$, etc., has a gate length of a constant line and space and is arranged with a uniform pitch. In addition, the channel length of the select gates $2_{j−1}$, $2_j$, and $2_{j+1}$ can also be miniaturized to that of the memory cell gates $1_{j−1}$, $1_j$, and $1_{j+1}$. The select gates $2_{j−1}$, $2_j$, and $2_{j+1}$ function as select gate transistors having a gate length of W2.

Element Cross-Section Structure of Seventh Modified Example

Example of Floating Gate Structure

Figure 15:
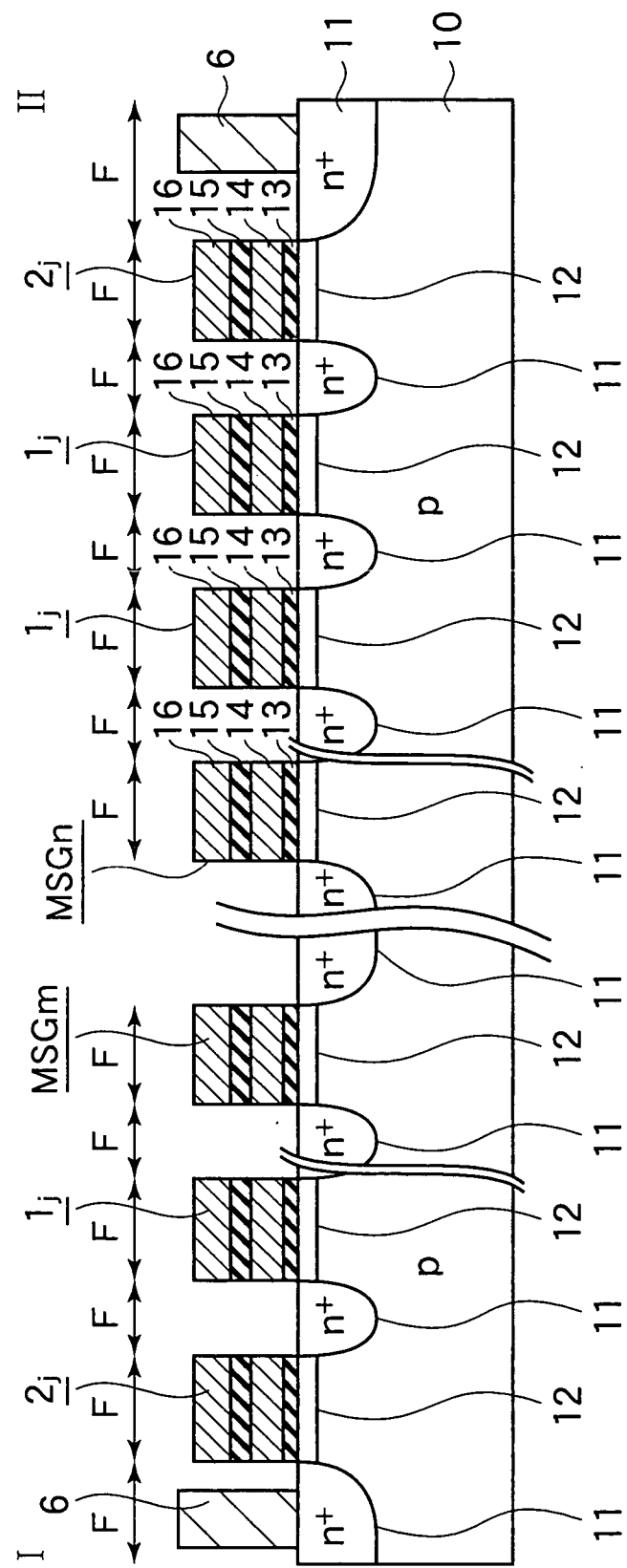
FIG. 15 is a cross-sectional view showing the structure of the nonvolatile semiconductor memory according to the seventh modified example of the first embodiment of the present invention.

FIG. 15 shows a cross-section structure view of the NAND string $5_j$ along the line I-I of FIG. 14. As shown in FIG. 15, the memory cell gates $1_j$ and the select gates $2_j$ are provided in a p-well formed on a semiconductor substrate 10. In the semiconductor substrate 10, source/drain diffusion layers 11 are provided around the memory cell gates $1_j$ and the select gates $2_j$. In the semiconductor substrate 10, underneath the memory cell gates $1_j$ and the select gates $2_j$, channel ion implanted layer 12 is formed, respectively. Furthermore, contact plug 6 is connected to the source/drain diffusion layer 11 on the outer side of the select gates $2_j$ on both sides of the NAND string $5_j$.

In each of the memory cell gates $1_j$ and the select gates $2_j$, a first conductive layer 14, which is a charge storage layer to function as a floating gate, is formed via a gate insulating film 13 on the semiconductor substrate 10. A second conductive layer 16 that is to function a control gate is formed via an inter-gate insulating film 15 on the first conductive layer 14. The inter-gate insulating film 15 is formed by a material such as a silicon oxide film, a silicon nitride film, and a laminated film of a silicon oxide film, that is an ONO film. Alternatively, an aluminum oxide such as an alumina film; a laminated structure insulating film made of an aluminum oxide and a silicon oxide; a laminated structure insulating film of an alumina film, a silicon nitride film, and a silicon oxide film; or hafnium oxide may be used as the inter-gate insulating film.

Here, in the select gates $2_j$, due to the presence of the inter-gate insulating film 15, only the lower charge storage layer 14 is given an electrical potential and the upper second conductive layer 16, to be a control gate, remains electrically isolated.

In contrast with the memory cell gate $1_j$, in the select gate $2_j$, only the first conductive layer 14, which is the first layer, is given an electrical potential. In this case, the first conductive layer 14 is pulled-out onto element isolation regions 4 (see FIG. 14) shown in the front and the back of the drawing and an electrical potential is given thereto independently of the second conductive layer 16.

Eighth Modified Example of the First Embodiment (Planar Pattern of Matrix Structure)

Figure 16:
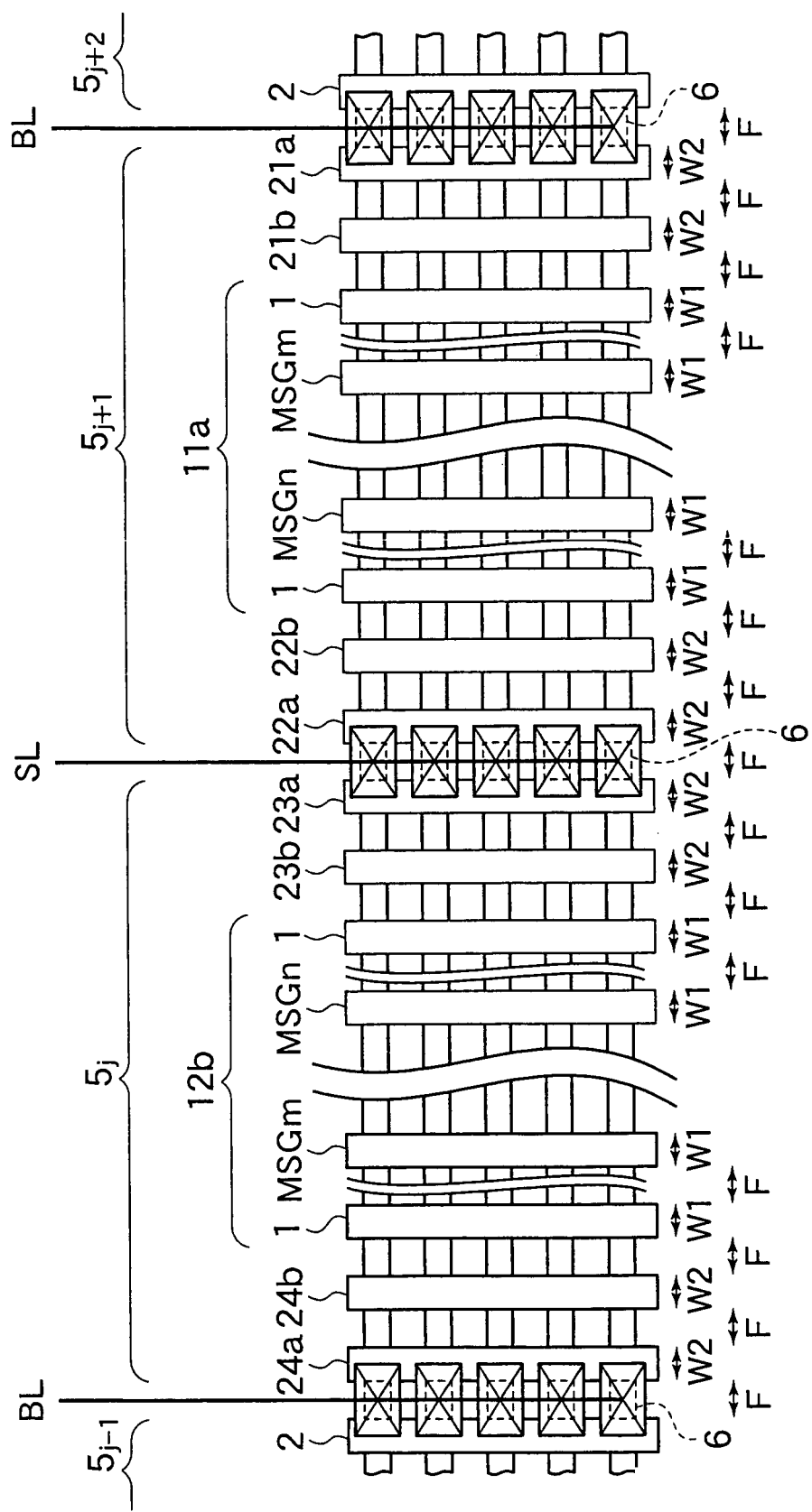
FIG. 16 is a plan view of a nonvolatile semiconductor memory according to an eighth modified example of the first embodiment of the present invention and explaining an arrangement of NAND string patterns that are repeated mirror-symmetrical to extend laterally in a column direction.

FIG. 16 shows a planar form of the matrix structure of a plurality of memory cell units of the NAND nonvolatile semiconductor memory cell matrix according to an eighth modified example of the first embodiment of the present invention.

FIG. 16 shows an example in which, of the memory cell transistors forming the NAND string, memory cell transistors corresponding to word lines WLm, WLn constitute memory cell transistor rows MSGm, MSGn functioning as select gate lines. Furthermore, the example is characterized in that two select gate transistors are provided for each of the bit-line-side and source-line-side select gate transistors. As mentioned above, making memory cell transistors function as select gate transistors can also be applied to the original select gate transistors.

A comparison with the case of having a single select gate transistor to the case of having a plurality of select gate transistors is provided. A relationship is shown between the standardized cell size and a scaling unit F of the NAND flash memory in the case of having a single select gate transistor and the case of having a plurality of select gate transistors intersect at a specific value F0. In the case of having a single select gate transistor, it is seen that as miniaturization advances, the standardized cell size increases rapidly. On the other hand, in the case of having a plurality of select gate transistors, the increase of the standardized cell size is suppressed. In the case of having a plurality of select gate transistors, even if the scaling unit F becomes finer, by suppressing the increase of the standardized cell size, the NAND flash memory can provide its original performance.

Moreover, in the NAND string 5 of the nonvolatile semiconductor memory cell matrix, if the space between the select gate 2 and the memory cell gate 1 is F, the margin for patterning irregular patterns is reduced, but when all of the memory cell gate 1 and the select gate 2 are arranged at the same pitch, it is unnecessary to be concerned about the reduction of the local lithography margin. That is, a processing margin can be improved by making all patterns of the memory cell gates $1_j$ have a common line and space, and the select gates $2_j$ have the same gate length as the memory cell gate $1_j$.

In the plan view of FIG. 16, it can also be seen that when the number of the select gate transistors is two, and that when NAND string expands in the direction $5_j$, $5_{j+1}$, etc., a description of a pattern form repeated mirror-symmetrically extends laterally in the column (bit line) direction. A first group of memory cell gates $11a$ of a NAND string $5_{j+1}$ has first select gate groups $21a$, $21b$ adjacent to the drain side and second select gate groups $22a$, $22b$ adjacent to the source side. A second group of memory cell gates $12b$ of a NAND string $5_j$ has third select gate groups $23a$, $23b$ adjacent to the source side and fourth select gate groups $24a$, $24b$ adjacent to the drain side. The NAND strings 5, as shown in FIG. 16, are positioned in a pattern symmetric with respect to a drain-side bit line BL or a source-side source line SL.

According to the NAND nonvolatile semiconductor memory cell matrix of the eighth modified example of the first embodiment of the present invention, in the matrix structure, the position of WLm, WLn can be selected arbitrarily. Moreover, the values of m, n can be set arbitrarily to positions, which correspond to the frequency of the operating mode. In this way, the method of handling a unit of data smaller than the number of the memory cell transistors contained in the NAND string multiplied by the page length (equal to page size) can be achieved.

Ninth Modified Example of the First Embodiment (Planar Pattern of Matrix Structure)

Figure 17:
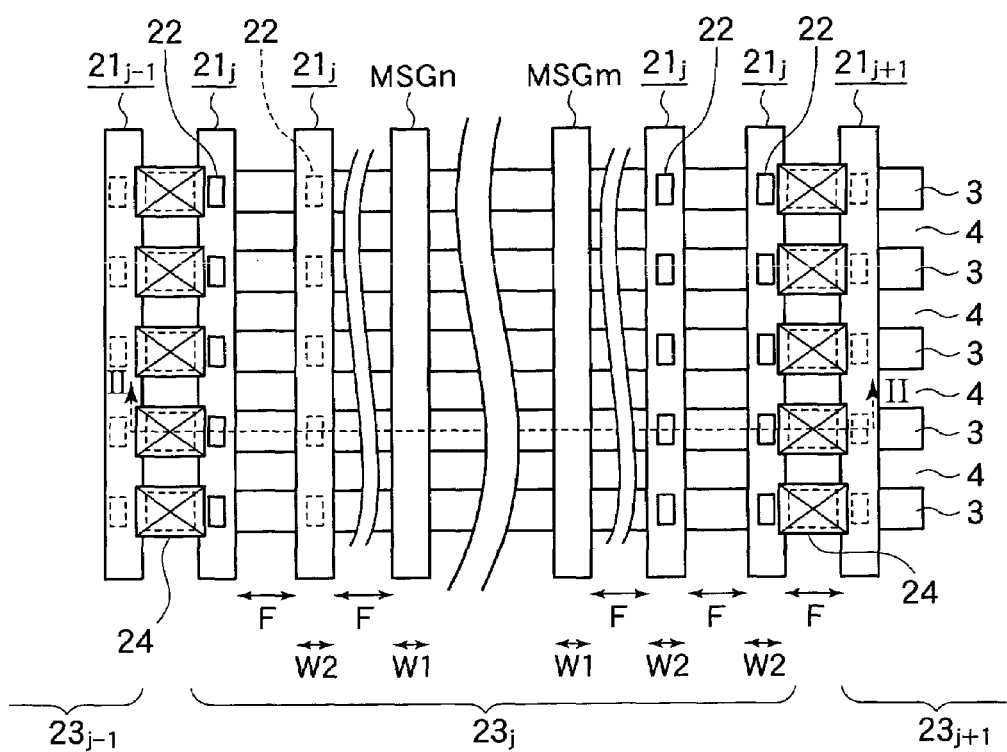
FIG. 17 is a plan view showing the structure of a nonvolatile semiconductor memory according to a ninth modified example of the first embodiment of the present invention.

FIG. 17 is a planar form of a plurality of memory cell units according to a ninth modified example of the first embodiment of the present invention. FIG. 17 shows an example in which, of the memory cell transistors forming the NAND string, memory cell transistors corresponding to word lines WLm, WLn constitute memory cell transistor rows MSGm, MSGn functioning as select gate lines.

As shown in FIG. 17, select gates $21_j$, $21_j$ are elongated in the row direction and are disposed parallel to each other in the column direction. Here, a plurality of memory cell transistors has the same gate length W1. Note that the plurality of memory cell transistors in a NAND string $23_{j-1}$, $23_j$, $23_{j+1}$ may consist of a number such as eight or sixteen. Furthermore, the pairs of select gates $21_j$, $21_j$ arranged on both sides of the NAND string $23_{j-1}$, $23_j$, and $23_{j+1}$ have the same gate length W2. The gate length W2 may be equal to or different from the gate length W1 of the memory cell transistor.

Spaces F of the same width are provided between the memory cell gates. The space F may be equal to or different from the gate length W1 of the memory cell transistors. Further, the value of the space F may be equal to or different from the gate length W2 of the select gate $21_j$. Furthermore, spaces F of the same width as the space F between the memory cell gates are provided between the select gates $21_j$ and the memory cell gates adjacent thereto. In the column direction orthogonal to the row direction, element active area regions 3 are formed parallel to each other. The element active area regions 3 are divided individually by a plurality of element isolation region 4 formed in parallel to each other in the column direction orthogonal to a plurality of word lines. A plurality of openings 22 for implanting ions into the channel region of the select gate transistor are provided on each of the element active area regions 3 of each select gates $21_j$.

Moreover, in the plan view of FIG. 17, impurity ions are implanted by an ion implantation technique using self-alignment through the openings 22 indicated by broken lines. Centers of the openings 22 are in the vicinity of the intersections of the element active area regions 3 and the select gates $21_j$. As a result, although the select gates $21_j$ and the memory cell transistors are arranged to be fine-lined and closely packed, the impurity concentrations of the different channels can be controlled individually by self-alignment. The sources and drains for each of the memory cell transistors are connected with each other in series via the element active area regions 3.

A NAND string $23_j$ is configured by pairs of select gates $21_j$ formed respectively on both sides of a plurality of, e.g. 16, memory cell transistors. Other NAND strings $23_{j-1}$, $23_{j+1}$ are formed on both sides of the NAND string $23_j$ with spaces the same as the space F of the memory cell gates there between. Contact plugs 24 are formed on the element active area regions 3 of select gates $21_{j-1}$, $21_j$ of adjacent NAND strings $23_{j-1}$, $23_j$.

As described above, in the memory cell transistors, the gate lengths are arranged at a constant line and space and arranged with uniform pitches. In addition, the channel length of the select gates 21 is made as short as that of the memory cell transistors. The select gates 21 are used in pairs as a select gate transistor.

Element Cross-section Structure of Ninth Modified Example

Floating Gate Structure

Figure 18:
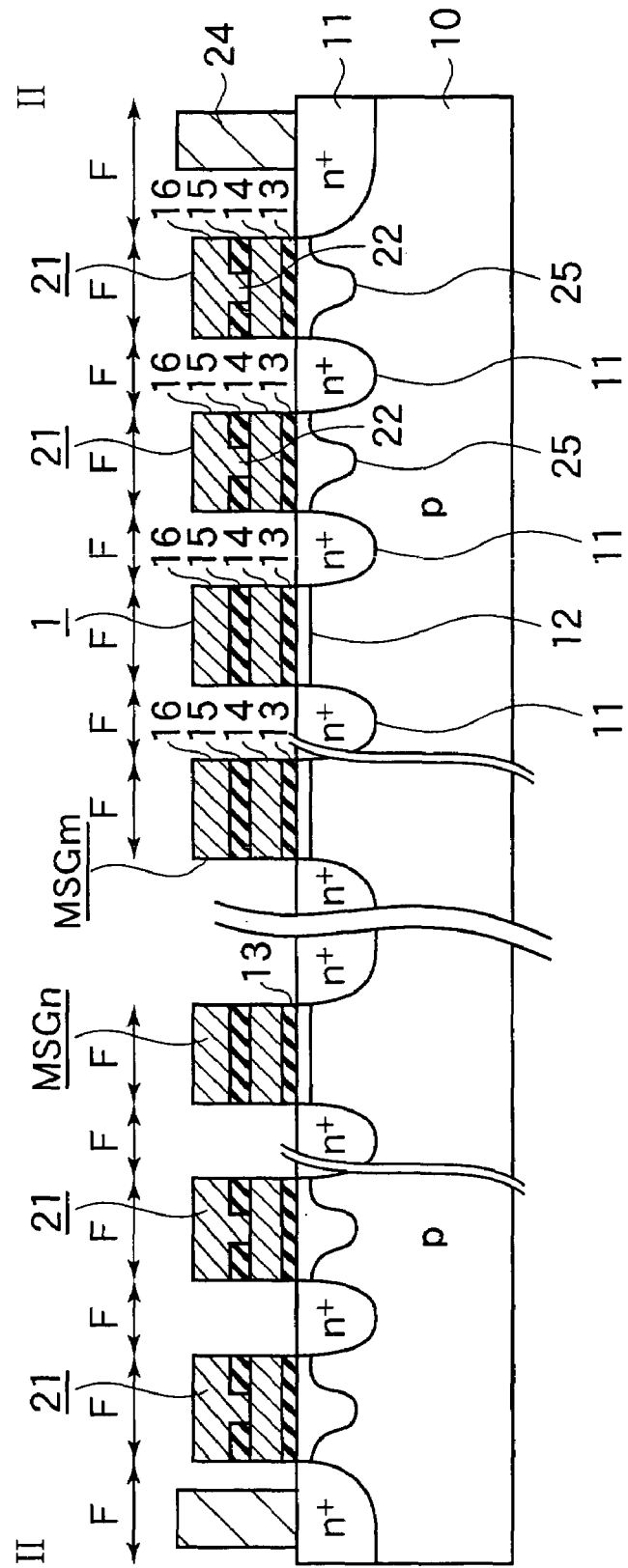
FIG. 18 is a cross-sectional view showing the structure of the nonvolatile semiconductor memory according to the ninth modified example of the first embodiment of the present invention.

FIG. 18 shows a cross-section along line II-II of FIG. 17. As shown in FIG. 18, the memory cell gates 1 and the select gates 21 are provided on a semiconductor substrate 10. In the semiconductor substrate 10, source/drain diffusion layers 11 are provided adjacent to the memory cell gates 1 and the select gates 21. In the semiconductor substrate 10 underneath the memory cell gates 1, channel ion implanted layers 12 are formed. In addition, underneath the select gates 21, channel ion implanted layers 25 are formed where implantation is performed through the openings 22. Contact plugs 24 are connected to the source/drain diffusion layers 11 on the outer side of the select gates 21 at the ends of the NAND string 23.

In each of the memory cell gates 1, a first conductive layer 14 is formed that is to be a floating gate charge storage layer via a gate insulating film 13 on the semiconductor substrate 10. A second conductive layer 16 that is to be a control gate is formed via an inter-gate insulating layer 15 on the first conductive layer 14. The inter-gate insulating film 15 is made of a laminated film of a material such as a silicon oxide film, a silicon nitride film, and an ONO film. Alternatively, aluminum oxide such as an alumina film; a laminated structure insulating film made of an aluminum oxide and silicon oxide; a laminated structure insulating film of an alumina film, a silicon nitride film, and a silicon oxide film; or deposited hafnium oxide may be used as the inter-gate insulating film.

Here, in the select gates 21, a first conductive layer 14 is formed that is to be a floating gate charge storage layer via a gate insulating film 13 on the semiconductor substrate 10. An inter-gate insulating layer 15 is formed on the first conductive layer 14. In the inter-gate insulating layer 15, an opening 22 is provided. On the inter-gate insulating layer 15 and the opening 22, a second conductive layer 16 is formed to be a control gate. The opening 22 is filled with the same conductive material as the second conductive layer 16, and the second and first conductive layers 16 and 14 are electrically connected thereby. Similar to each memory cell transistors, the inter-gate insulating layer 15 is made of a laminated film of a material such as a silicon oxide film, a silicon nitride film, and an ONO film, that is, a laminated film of a silicon oxide film. Alternatively, aluminum oxide such as an alumina film; a laminated structure insulating film made of an aluminum oxide and silicon oxide; a laminated structure insulating film made of an alumina film, a silicon nitride film, and a silicon oxide film; or deposited hafnium oxide may be used as the inter-gate insulating layer 15 of the select gate transistors.

In the semiconductor substrate 10, near the surfaces of the regions between source/drain diffusion layers 11, channel ion implanted layers 12 are formed in contact with the source/drain diffusion layers 11. Furthermore, near the surface of the semiconductor substrate 10, channel ion implanted layers 25 are formed for the select gate transistors containing at least channel regions of the select gate transistor immediately below the openings 22. The impurity concentrations of the channel ion implanted layers 25 for the select gate transistors are higher than that of the channel ion implanted layers 12 for the memory cell transistors. The channel ion implanted layers 25 are formed deeper in the semiconductor substrate 10 than the channel ion implanted layers 12 for the memory cell transistors. Here, the dimension of the openings 22 provided in the inter-gate insulating layer 15 under the select gates 21 is about half the length of the select gates 21. Note that by controlling the length of the openings 22 of the select gate 21, the length of the channel ion implanted layers 25 of the select gate transistors can be changed. In addition, by controlling the quantity of dosage of implanted ions into the portion below select gates 21 through the openings 22 independently of the memory cell transistors, the value of impurity concentrations in the channel ion implanted layers 25 of the select gate transistors can be freely set. Note that the impurity concentrations of the channel portion of the select gate 21 is, for example, about $10^{17}$ cm$^{-3}$, and that the height of the memory cell gate 1 is formed equal to that of the select gate 21.

According to the ninth modified example of the first embodiment of the present invention, in both the NAND flash memory and a flash memory cell having select gate transistors, such as a AND flash memory, a memory cell structure easy to fabricate in a reduced dimension by lithography can be achieved by making the select gate transistors have the same gate length as the memory cell transistors and arranging the select gate transistors and the memory cell transistors with the same pitches.

As described above, an electrical potential can be supplied to the first conductive layer 14 by the select gate 21. The select gate 21 functions as a common MOSFET, and laminated gate structure of the select gate transistor is the same in composition and size as that of the memory cell transistor, except that the select gate has openings 22.

In addition, in the ninth modified example of the first embodiment of the present invention, because the impurity concentration of the channel region of the select gate transistor can be set higher than that of the channel region of the memory cell transistor, the threshold value of the select gate transistor can be set higher than that of the memory cell transistor, so that a nonvolatile semiconductor memory cell matrix having the current cutoff characteristic necessary for a select gate transistor can be provided.

Moreover, in the select gate transistor, the first conductive layer 14, which is to be a floating gate, and the second conductive layer 16, which is to be a floating gate, are connected via the openings 22 provided in the inter-gate insulating films 15. By making the nonvolatile semiconductor memory have such a configuration, a nonvolatile semiconductor memory can be provided which has select gate transistors with an appropriate channel ion implanted concentrations, and memory cell transistors having a low channel ion implanted concentrations, which are appropriate for miniaturization. The configuration provides various favorable characteristics such as good data/write characteristics, data retention characteristics, and high resistance to readout stress.

Manufacturing Method

Example of Floating Gate Structure

Next, with reference to FIGS. 18 to 29, the manufacturing method for the nonvolatile semiconductor memory cell matrix according to a ninth modified example of the first embodiment of the present invention will be described. FIGS. 18 to 29 correspond to partial or entire cross-section along line II-II of FIG. 17.

Figure 19:
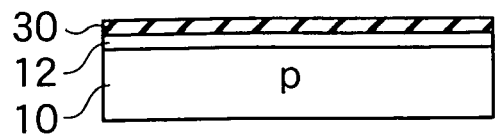
FIG. 19 is a cross-sectional view showing a process in a method of manufacturing the nonvolatile semiconductor memory according to the ninth modified example of the first embodiment of the present invention.

(a) A sacrificial silicon oxide film 30 is formed on a semiconductor substrate 10 of p-type silicon. Next, p-type wells, or double wells and the like consisting of n-type and p-type wells are formed and activated, depending on device requirements. Next, when n-type transistors are formed in the region where semiconductor substrate 10 or wells are formed thereupon, a same p-type impurity such as boron (B) is implanted simultaneously to both the memory cell transistor and the select gate transistor in order to control the channels to form channel ion implanted layers 12 near the surface of the semiconductor substrate 10 as shown in FIG. 19.

Figure 20:
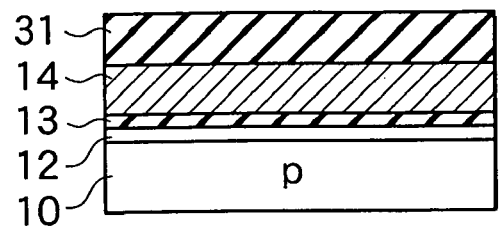
FIG. 20 is a cross-sectional view showing a process in the method of manufacturing the nonvolatile semiconductor memory according to the ninth modified example of the first embodiment of the present invention.

(b) The sacrificial silicon oxide film 30 formed for the ion implantation is removed, and a gate insulating film 13 is formed. Then, for example, polysilicon as a gate electrode material for floating gate electrodes is deposited to form a first conductive layer 14, which is to be a floating gate. In order to make the polysilicon conductive, polysilicon having, e.g., phosphorus doped beforehand is used. The phosphorus ions may be ion implanted. Next, as shown in FIG. 20, a mask material 31 in order to define element isolation regions 4, such as a silicon nitride film ($Si_3N_4$), is deposited on the first conductive layer 14 which is to be a floating gate.

Figure 21:
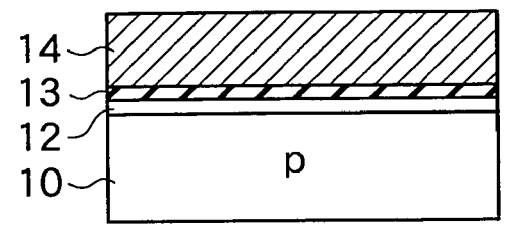
FIG. 21 is a cross-sectional view showing a process in the method of manufacturing the nonvolatile semiconductor memory according to the ninth modified example of the first embodiment of the present invention.
Figure 22:
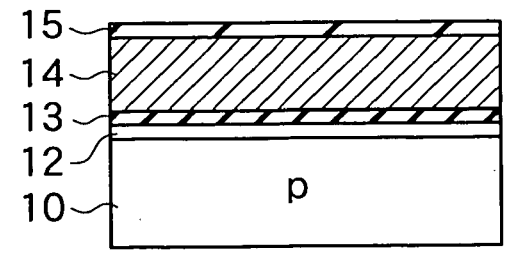
FIG. 22 is a cross-sectional view showing a process in the method of manufacturing the nonvolatile semiconductor memory according to the ninth modified example of the first embodiment of the present invention.
Figure 23:
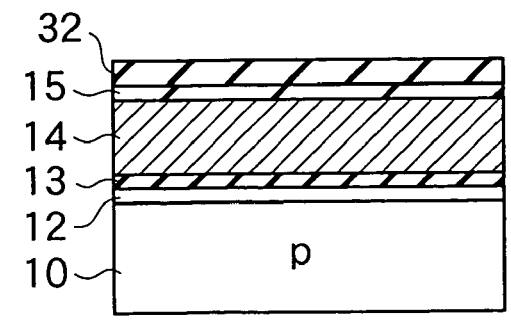
FIG. 23 is a cross-sectional view showing a process in the method of manufacturing the nonvolatile semiconductor memory according to the ninth modified example of the first embodiment of the present invention.

(c) As shown in FIG. 21, the mask material 31, which is a silicon nitride film, is removed. Furthermore, as shown in FIG. 22, an inter-gate insulating layer 15, e.g. an ONO film, is deposited on the exposed surface. Then, as shown in FIG. 23, polysilicon as a mask material 32 and other mask material, such as a silicon oxide film, are deposited on the inter-gate insulating film 15.

Figure 24:
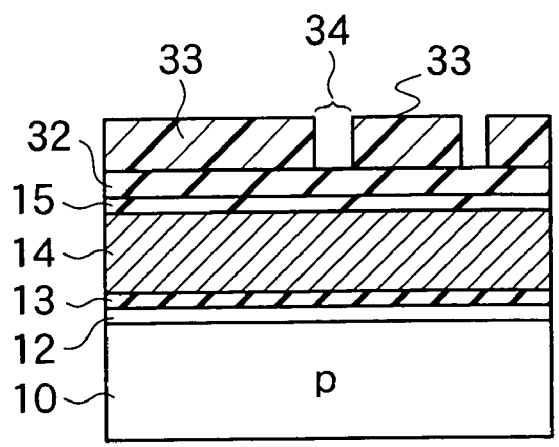
FIG. 24 is a cross-sectional view showing a process in the method of manufacturing the nonvolatile semiconductor memory according to the ninth modified example of the first embodiment of the present invention.

(d) As shown in FIG. 24, openings 34 are made to a photoresist 33 deposited on the mask material 32 for regions planned to be channels for the select gate transistors of the memory cell unit by lithography patterning. FIG. 24 shows a case where two openings 34 are provided.

Figure 25:
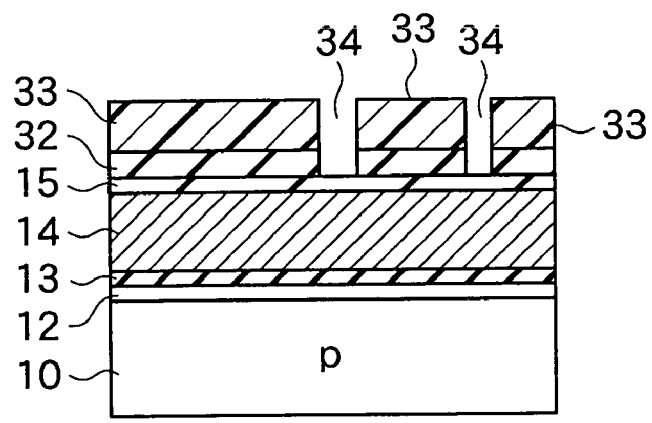
FIG. 25 is a cross-sectional view showing a process in the method of manufacturing the nonvolatile semiconductor memory according to the ninth modified example of the first embodiment of the present invention.

(e) As shown in FIG. 25, openings are made in the mask material 32 immediately under the openings 34 of the photoresist 33 by etching. For the patterning of the mask material 32, a processing method, which enables minimum dimensions to be processed by the latest available semiconductor device manufacturing technology, may be used. Generally, a submicron processing technology of having the highest performance will be used. Hence, with respect to the opening 34 provided in the mask material 32, misalignment is minimized.

Figure 26:
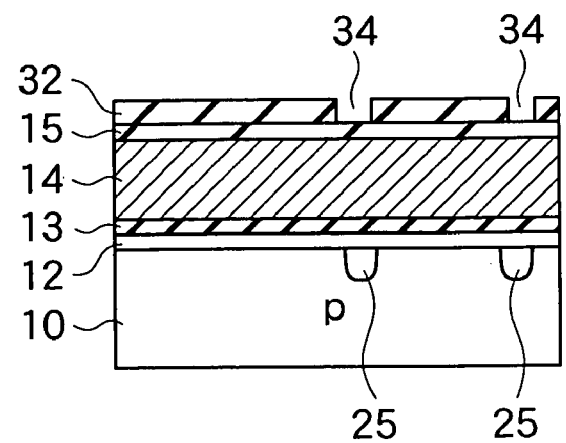
FIG. 26 is a cross-sectional view showing a process in the method of manufacturing the nonvolatile semiconductor memory according to the ninth modified example of the first embodiment of the present invention.

(f) As shown in FIG. 26, after removing the photoresist 33, ions are implanted into regions to be channels for the select gate transistors in the semiconductor substrate 10 through the inter-gate insulating films 15, the first conductive layer 14 which is to be a floating gate, and the gate insulating layer 13, to form ion implanted layers 25 for the select gate transistor channel. For the implanted ion species boron is usually used. However, in the case of a surface channel type pMOS, phosphorous may be used. Here, the mask material 32 is present on the memory cell transistor regions and has such a film thickness that the ion species implanted are attenuated therein. Concurrently, the acceleration energy of ion-implantation is arranged so that ions reach the semiconductor substrate 10 through the charge storage layer 14. Here, ion implantation is performed in the absence of the photoresist 33. However the photoresist 33 may be removed after ion implantation is performed with the photoresist 33 remaining.

Figure 27:
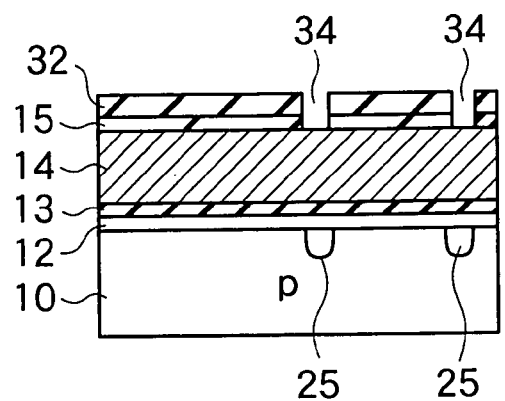
FIG. 27 is a cross-sectional view showing a process in the method of manufacturing the nonvolatile semiconductor memory according to the ninth modified example of the first embodiment of the present invention.

(g) As shown in FIG. 27, openings are made by etching through the inter-gate insulating films 15 under the openings 34. Here, the ion implantation to form the channel ion implanted layers 25 of the select gate transistors may be performed after making openings by etching in the inter-gate insulating films 15. Moreover, when ions are implanted with the inter-gate insulating films 15 remaining, the surface of the first conductive layer 14 constituted by a polycrystalline silicon layer is prevented from being contaminated, with the inter-gate insulating films 15 used as a protecting film.

Figure 28:
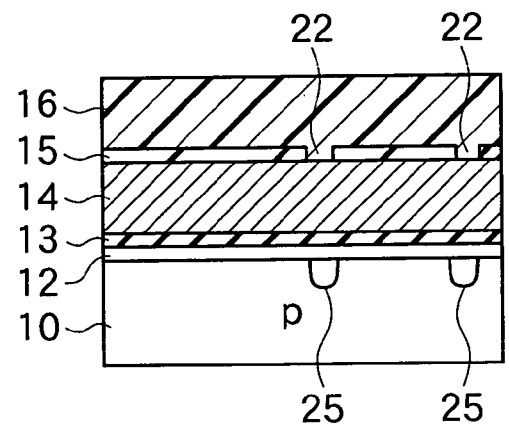
FIG. 28 is a cross-sectional view showing a process in the method of manufacturing the nonvolatile semiconductor memory according to the ninth modified example of the first embodiment of the present invention.

(h) As shown in FIG. 28, the mask material 32 is peeled off. Next, polysilicon and metal-silicide such as WSi (tungsten silicide) are deposited for the second conductive layer 16 as a control gate. Here, for example, only polysilicon may be deposited as a control gate material. In this case, after depositing polysilicon and performing gate-processing, electrodes of silicide can be formed by use of a salicide (Self-Aligned Silicide: self aligning silicide forming technology) method.

Figure 29:
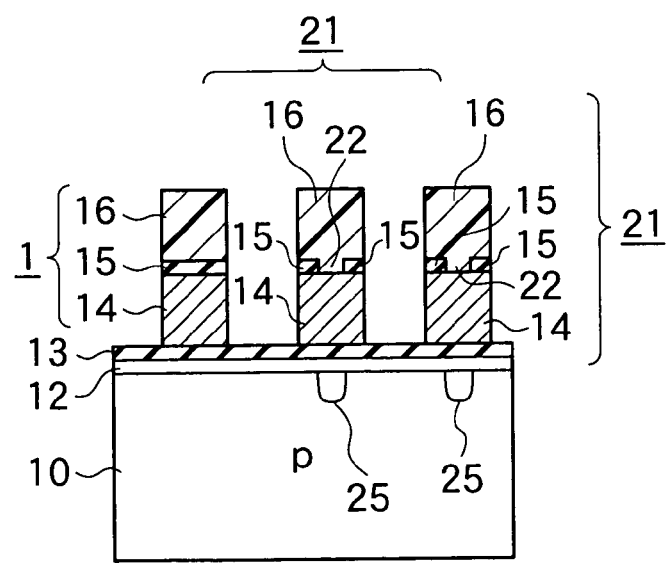
FIG. 29 is a cross-sectional view showing a process in the method of manufacturing the nonvolatile semiconductor memory according to the ninth modified example of the first embodiment of the present invention.

(i) As shown in FIG. 29, patterning is performed on the gate electrode regions by lithography, the laminated gate structure is processed by etching to form memory cell transistor consisting of the charge storage layer 14, the inter-gate insulating films 15, and the control gate 16. Also, the etching process forms the select gate transistor consisting of the charge storage layer 14, the inter-gate insulating films 15, and the control gate 16 such that the select gate transistors have the same gate length and pitch with the memory cell transistors. The etching process is performed by RIE. Here, for each memory cell unit, a pair of select gates 21 is formed on each end of the memory cell.

Figure 30:
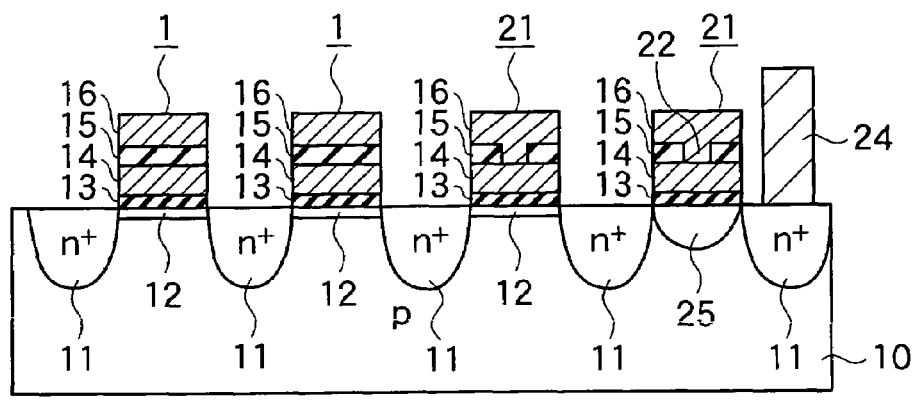
FIG. 30 is a cross-sectional view showing the structure of a nonvolatile semiconductor memory according to a tenth modified example of the first embodiment of the present invention.

(j) As shown in FIG. 30, using the electrodes of the control gates 16 of the memory cell gate 1 and of the select gate 21 having a laminated gate structure as a mask, impurity ions are implanted into the semiconductor substrate 10 to form the source/drain diffusion layers 11. In particular, by implanting ions in order to electrically short-circuit the first conductive layer 14 which is to be a floating gate and the control gate 16 after making openings 22 in the inter-gate insulating film 15 of the select gate transistor, the structure of the ninth modified example of the first embodiment is feasible without an additional lithography process. The manufacturing method uses a method where part of the inter-gate insulating film 15 separating the charge storage layers 14 from the control gates 16, is removed. The method is applied to the select gate 21 in the memory cell unit. While the method makes contact to the charge storage layers 14, when the following conditions are satisfied during the manufacturing process, ion implantation can be performed only into the channel region of the select gate 21 through the first conductive layer 14, formed to be a floating gate.

That is, a channel region impurity concentration is formed different for the memory cell gate 1 and the select gate 21, when the impurities by ion implantation attenuate in the mask material so that implanted impurity ions does not reached to the memory cell gate 1 through the charge storage layer 14, and in addition, implanted impurity ions reached to the channel of the select gate transistor through the charge storage layer 14 and the gate insulating film 13 on the select gate 21. In this case, the channel regions can be formed to satisfy the characteristics of the memory cell gate 1 and the select gate 21, respectively. Thus, the respective characteristics can be improved without an additional lithography process and with a self-alignment process.

Ion implantation by self-alignment into the select gate 21 can be performed, with no misalignment, so that a desired channel impurity concentration of the select gate 21 can be formed.

Here, the margin of mask alignment accuracy in ion implantation can be expanded for controlling the threshold voltages of the first bit-line-side select gate transistor provided with the bit-line-side select gate line SGD1 and the first source-line-side select gate transistor provided with the source-line-side select gate line SGS1. Therefore, even if a mask is misaligned in ion implantation so that the threshold voltage of the first bit-line-side select gate transistor provided with the bit-line-side select gate line SGD1 and the first source-line-side select gate transistor provided with the source-line-side select gate line SGS1 becomes lower than that of the second bit-line-side select gate transistor provided with the bit-line-side select gate line SGD2 and the second source-line-side select gate transistor provided with the source-line-side select gate line SGS2, the problem of resistance to leakage current does not occur because there are at least two select gate transistors on each bit-line side and source-line side. As a result, spaces between the bit-line-side select gate line SGD1 and the control gate line WL1 adjacent thereto and spaces between the source-line-side select gate line SGS1 and the control gate line WL32 adjacent thereto need not be widened and the spaces can be reduced to the same dimension as the spaces between the control gates.

According to the above manufacturing method, the select gate transistors and the memory cell transistors can be formed independently by self-alignment to have different channel impurity concentrations.

As described above, a memory cell array having a channel region of the select gate transistors and a channel region in a memory cell transistor with different impurity concentrations are formed respectively by self-alignment. Here, in the gate insulating film 13 under the charge storage layer 14 of the select gate transistors, some ions remain after channel-ion-implantation. The region where the ions are remained is a peripheral region including the region directly under the opening 22 made in the inter-gate insulating film 15 on the charge storage layer 14.

According to the ninth modified example of the first embodiment, impurity ions are not required to be implanted through the gate insulating film 13 of the memory cell transistors, and particularly the nonvolatile semiconductor memory cell matrix having floating gates in structure will not have characteristics which degrade.

Further, in the ninth modified example of the first embodiment, it does not matter whether the transistors are an n-type or a p-type, and it does not matter whether impurity ion species implanted for controlling the channels of the memory cell transistor and select gate transistors is boron or phosphorus.

Thus, in the ninth modified example of the first embodiment, with memory cell transistors masked, by implanting ions into the channel regions of the select gate transistors by use of openings 34 corresponding to the channel regions, with the openings accurately opened in a mask material 32, channel ion implantation can be performed without misalignment.

Furthermore, with the memory cell transistor which does not have an opening in the inter-gate insulating film 15 between the first and second conductive layers 14 and 16, i.e. gate electrodes, ions are implanted into the select gate transistor and therefore the concentration in the channel region of the memory cell transistor is set independently of that in the channel region of the select gate transistor.

Tenth Modified Example of the First Embodiment

In the structure of the nonvolatile semiconductor memory cell matrix of a tenth modified example, the structure of the nonvolatile semiconductor memory cell matrix shown in FIG. 18 is modified as shown in FIG. 30. A channel ion implantation layer 25 of high impurity concentrations is formed at an area in the semiconductor substrate 10, which corresponds to an opening portion 22 of the inter-gate insulating film 15 of one of a pair of select gates 21 farthest from the memory cell gate 1. The arrangement makes it possible to improve the cut-off characteristics. Here, the same channel ion implantation layer 12 as the memory cell gate 1 is formed under the select gate 21 adjacent to the memory cell gate 1.

Note that though two select gates 21 are provided on each of the source and drain sides in one NAND string 23, impurity concentration and depth of a channel ion implantation region under the select gate 21 adjacent to the memory cell gate 1 on each of the source and drain sides, or any one thereof, can be set equal to the impurity concentration and channel ion implantation depth of the channel ion implantation region of the memory cell gate 1.

According to the manufacturing method of the tenth modified example, after the process shown in FIG. 21 of the manufacturing method of the ninth modified example of the first embodiment, a region under the select gate 21, where a channel region of the select gate transistor is to be formed and ion implantation is not performed, is coated with a photo-resist layer. The channel ion implantation layer 25 of high impurity concentrations is formed in the semiconductor substrate 10 only to a channel region of a select gate transistor in which the ion implantation is performed under the select gate 21.

In this way, while adopting a gate structure shown in FIG. 18, the side adjacent to a memory cell transistor of the select gate transistor is masked by a photoresist (not shown), the channel ion implantation is performed, and the concentration and depth of the channel ion implantation region is made thinner and shallower than the select gate transistor separated from the memory cell transistor, so that the cut-off characteristic of select gate transistors may be controlled to be different.

That is, the concentration and depth of, the channel ion implantation region of a select gate 21 adjacent to a memory cell transistor is made to be equivalent to the concentration and depth of the channel ion implantation region of the memory cell gate 1. On the other hand, the impurity concentrations and the depth of the channel ion implantation region of the select gate 21 separated from the memory cell transistor 1 is made higher and deeper than the impurity concentrations and the depth of the channel ion implantation region of the memory cell gate 1.

In this case, while the cut-off characteristic of the select gate 21 that is more distantly from the memory cell gate 1 is enhanced, the effect of impurity diffusion onto the select gate 21 on the side closer to the memory cell gate 1 can be suppressed to a lower level. The above-described structure prevents channel impurities from penetrating to the memory cell transistor adjacent to the select gate 21.

Eleventh Modified Example of the First Embodiment

Figure 31:
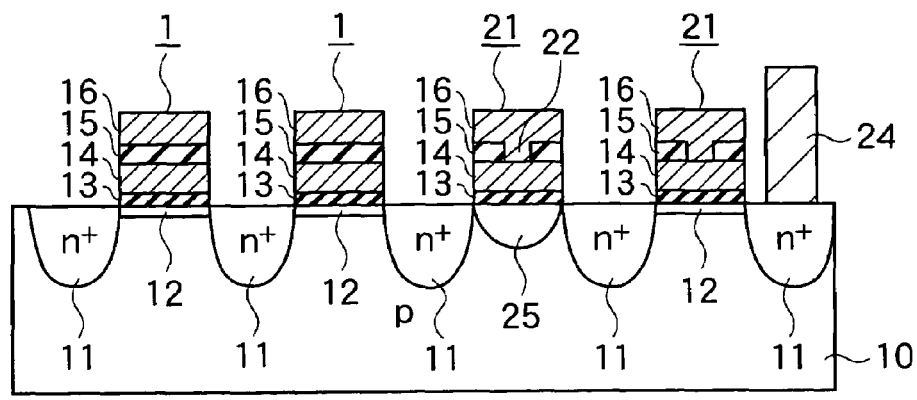
FIG. 31 is a cross-sectional view showing the structure of a nonvolatile semiconductor memory according to an eleventh modified example of the first embodiment of the present invention.

In the structure of the nonvolatile semiconductor memory cell matrix of a eleventh modified example, the structure of the nonvolatile semiconductor memory cell matrix shown in FIG. 18 is modified as shown in FIG. 31. The channel ion implantation layer 25 of high impurity concentrations is formed at an area in the semiconductor substrate 10, which corresponds to a part of an opening 22 of the inter-gate insulating film 15 of one of a pair of select gates 21, which is adjacent to the memory cell gate 1, thus making it possible to improve the cut-off characteristics. Here, the same channel ion implantation layer 12 as the memory cell gate 1 is formed under the select gate 21 separated from the memory cell gate 1.

Note that though two select gates 21 are provided on each of the source and drain sides in one NAND string 23, the impurity concentrations and the depth of a channel ion implantation region under the select gate 21 separated from the memory cell gate 1 on each of the source and drain sides or any one thereof can be set equal to the impurity concentration and channel ion implantation region depth of the channel ion implantation region of the memory cell gate 1.

According to the manufacturing method of the eleventh modified example, after the process shown in FIG. 16 of the manufacturing method of the ninth modified example, a region in which a select gate transistor is to be formed and the ion implantation processing is not performed under the select gate 21 is coated with a photo-resist. The channel ion implantation layer 25 of high impurity concentrations is formed in the semiconductor substrate 10 only to a select gate 21 in which the ion implantation is performed under the select gate 21.

In this way, while adopting a gate structure shown in FIG. 18, the farthest side select gate transistor separated from a memory cell transistor is masked by a photo-resist (not shown), the channel ion implantation is performed, and the impurity concentrations and the depth of the channel ion implantation region is made thinner and shallower than the select gate transistor adjacent to the memory cell transistor, so that the cut-off characteristic of the select gate transistors may be different.

That is, the impurity concentrations and the depth of the channel ion implantation region of the select gate 21 separated from the memory cell gate 1 is set to be equivalent to the impurity concentrations and the depth of the channel ion implantation region of the memory cell gate 1. On the other hand, the impurity concentrations and the depth of the channel ion implantation region of the select gate 21 adjacent to the memory cell gate 1 is made higher and deeper than the impurity concentrations and the depth of the channel ion implantation region of the memory cell gate 1.

In this case, the cut-off characteristic of the select gate transistor located closer to the memory cell is enhanced.

Twelfth Modified Example of the First Embodiment

Figure 32:
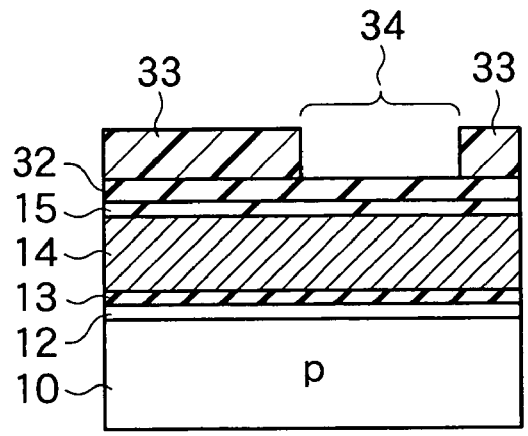
FIG. 32 is a cross-sectional view showing a process in a method of manufacturing the nonvolatile semiconductor memory according to a twelfth modified example of the first embodiment of the present invention.
Figure 33:
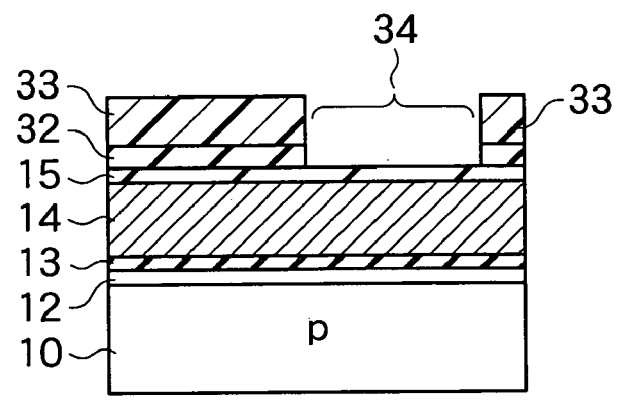
FIG. 33 is a cross-sectional view showing a process in the method of manufacturing the nonvolatile semiconductor memory according to the twelfth modified example of the first embodiment of the present invention.
Figure 34:
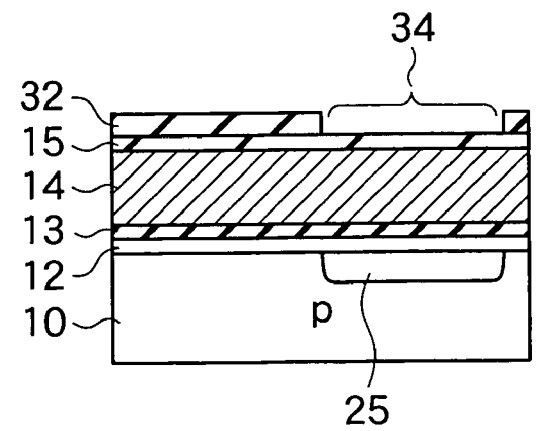
FIG. 34 is a cross-sectional view showing a process in the method of manufacturing the nonvolatile semiconductor memory according to the twelfth modified example of the first embodiment of the present invention.

Instead of the processes of FIGS. 24 to 26, as shown in FIGS. 32 to 34, the opening part 34 is set to be wide, and ion implantation is performed in the region in which the channel of the select gate transistor is to be formed, thus forming the wider channel ion implantation layer 25 of the select gate transistor. The processes shown in FIGS. 32 to 34 have larger margins for processing accuracy compared with the processes of FIGS. 24 to 26.

As shown in FIG. 32, a part of the region in which the channel of the select gate transistor of a memory cell unit is to be formed is patterned by lithography. A photo-resist 33 is deposited on a mask material 32, to have the opening part 34 formed thereon. Here, the opening part 34 is shown as widely opened. As shown in FIG. 33, the mask material 32 disposed directly under the opening part 34 of the photo-resist 33 is etched to create an opening. In patterning of the mask material, a method for processing a minimum feature size F is used. Generally, a fine fabrication technique having the highest performance is used. Hence, misalignment to the opening part provided on the mask material can be suppressed to a minimum.

As shown in FIG. 34, after removing the photo-resist 33, ion implantation techniques are performed in a semiconductor substrate 10 which is to be a channel region of the select gate transistor, through the inter-gate insulating film 15, electric charge storage layer 14 formed as a floating gate electrode, and the gate insulating layer 13, to form the channel ion implantation layers 25 of the select gate transistors. The implanted ion species is usually boron, but in the case of a surface-channel pMOS, phosphorous may also be used.

Here, the memory cell transistor region has a mask material 32, and the configuration of a film thickness therein causes penetration-decay in the implanted ion species in the mask material 32. At the same time, the acceleration energy of ion-implantation is adjusted so as to reach the semiconductor substrate 10 through the charge storage layer 14.

Here, impurity ions are implanted into the area in the absence of the photo-resist 33. However, the photo-resist 33 may be removed after impurity ions are implanted.

According to the manufacturing method of the ninth to twelfth modified examples of the first embodiment, a nonvolatile semiconductor memory cell matrix is provided with enhanced cut-off characteristic of the select gate transistor having a memory cell transistors which function as select gate transistors.

Thirteenth Modified Example of the First Embodiment

Example of Matrix Structure of NAND Flash Memory

Figure 35:
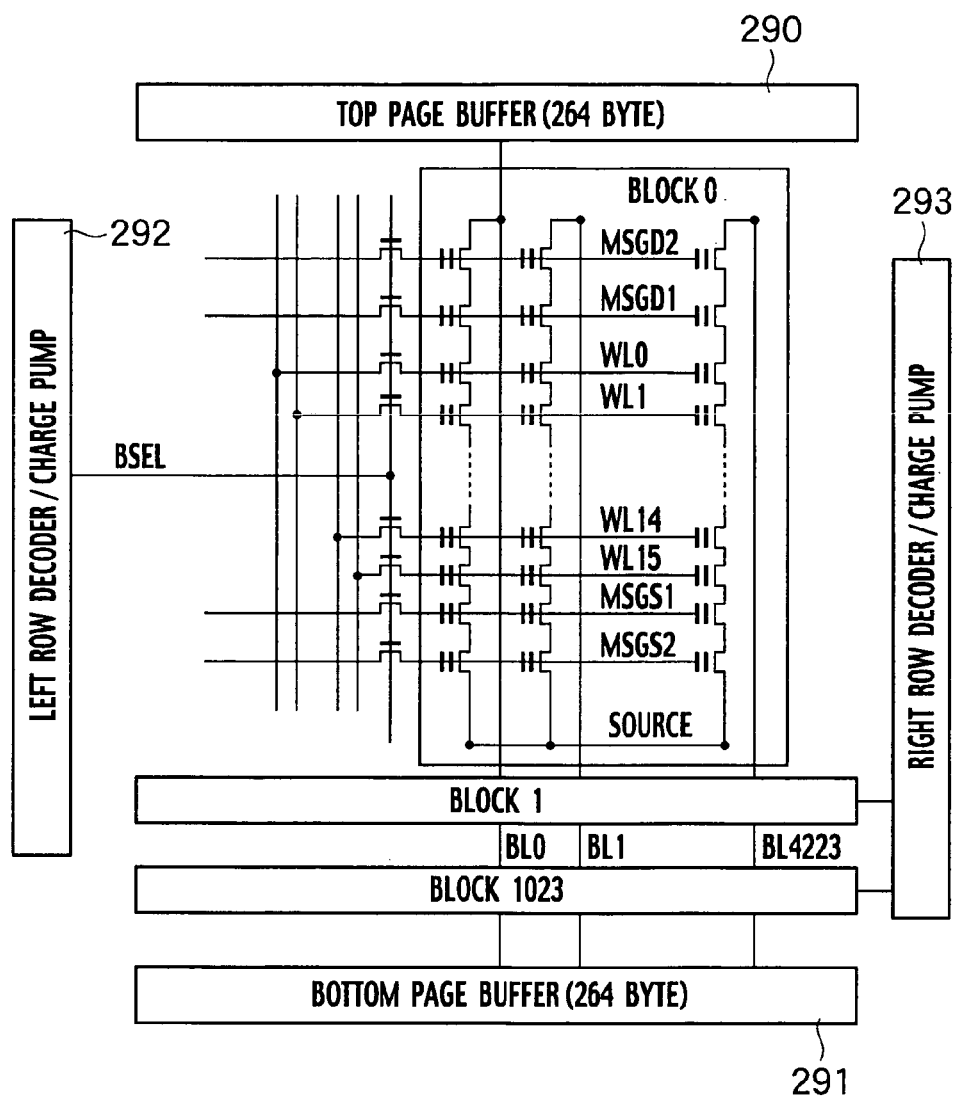
FIG. 35 is a schematic view of the circuitry of a 64 Mbit NAND flash memory as a nonvolatile semiconductor memory according to a thirteenth modified example of the first embodiment of the present invention.

As the nonvolatile semiconductor memory cell matrix according to the thirteenth modified example of the first embodiment of the present invention, a schematic circuit structure of a 64 Mbit NAND flash memory includes, as shown in FIG. 35, select gate lines on the bit line side of NAND strings and select gate lines on the source line side of NAND strings. The select gate lines on the bit line side are constituted by memory cell transistor rows MSGD1 and MSGD2 functioning as two select gate lines. The select gate lines on the source line side are constituted by memory cell transistor rows MSGS1 and MSGS2 functioning as two select gate lines. In FIG. 35, blocks 0 to 1023 are each constituted by a NAND flash memory cell array, and in the periphery, a top page buffer 290, a bottom page buffer 291, a left row decoder/charge pump 292, and a right row decoder/charge pump 293 are arranged. Moreover, in FIG. 35, word lines WL0 to WL15 are arranged parallel to memory cell transistor rows MSGD1 and MSGD2 functioning as select gate lines, and memory cell transistor rows MSGS1 and MSGS2 functioning as select gate lines, and bit lines BL0 to BL4223 are arranged orthogonal to the word lines. The circuit structure of the first embodiment of the present invention or of its first to fourth modified examples, as shown in FIGS. 2 to 6, can be applied to the circuit structure of the thirteenth modified example of the first embodiment of the present invention.

By implementing memory cell transistors so as to function as a select gate transistor connected to arbitrary word line WLn in FIG. 35, memory cell transistors of higher density can be achieved, thus providing a nonvolatile semiconductor memory cell matrix which prevents increase in a write/erase unit block size and is a high-density memory cell capable of high speed rewriting in which a write/erase unit is small or can be arbitrarily set, and a nonvolatile semiconductor memory cell matrix with high degree of freedom in which the write/erase unit can be arbitrarily set.

Example of Circuit System Structure

In the nonvolatile semiconductor memories according to the first embodiment of the present invention, by compositely combining a circuit structure of NAND strings explained in the first embodiment, as shown in FIG. 2 and in the first to third modified examples, as shown in FIG. 3 to FIG. 5, and by use of a memory cell array in which the number of memory cell transistors constructing a NAND column are different, an optimum write/erase unit is achieved more systematically. For example, the circuit system structure can be variably selected in the following manner. First, in a first region, a MOS type select gate transistor is disposed on both sides of the NAND column so as to be operated as a usual NAND flash memory, or the write/erase unit can be changed by changing the memory cell transistor to the select gate transistor in the NAND column, as described above.

Next, in the second region, the MOS type select gate transistor is not necessary, and a memory cell array configured by memory cell transistors including only word lines described in the third modified example, as shown in FIG. 5A and FIG. 5B, can be formed therein. The second region is configured by a comparatively small number of NAND columns, and the second region is used for the region having a small write/erase unit block.

In the second region, high-speed rewriting and rewriting/erasing of data is mainly performed in terms of code storage rather than in terms of data storage. Specifically, by use of the first region as a data storage region, and the second region as a data management region, a nonvolatile semiconductor memory cell matrix with a highly functional system is achieved.

Second Embodiment

Figure 36:
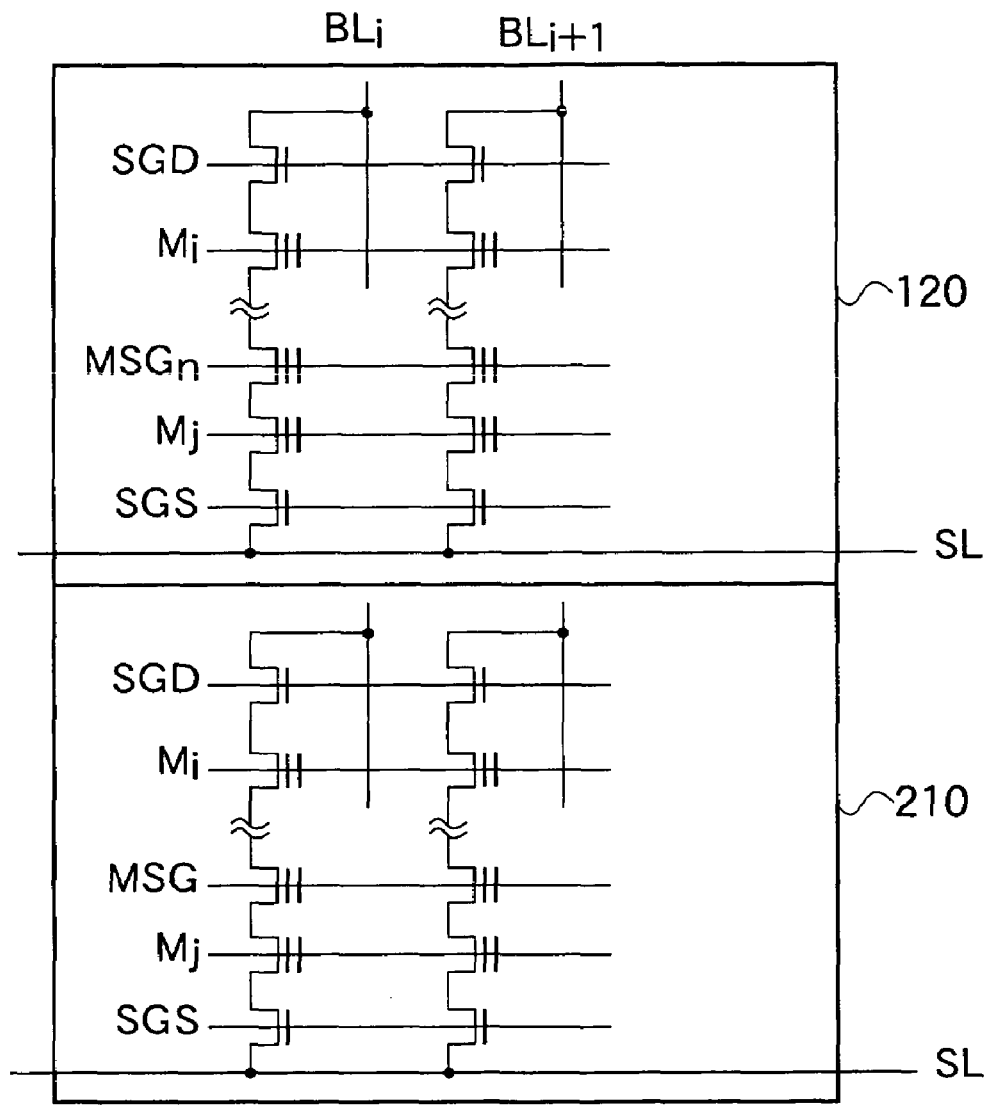
FIG. 36 is a view of the circuit system structure of a nonvolatile semiconductor memory according to a second embodiment of the present invention.

The nonvolatile semiconductor memory cell matrix according to the second embodiment of the present invention, as shown in FIG. 36, has a structure in which a divided write/erase NAND flash memory cell matrix 120 composed of the nonvolatile semiconductor memory cell matrix having a circuit structure explained in the first embodiment, and a NAND flash memory cell matrix 210 having the MOS type select gate transistor disposed on both sides of NAND columns and operating as a usual NAND flash memory, are combined. The divided write/erase NAND flash memory cell matrix 120 has select gate lines SGS, SGD and a source line SL orthogonal to bit lines BLi and BLi+1, and further has memory cell transistor rows Mi and Mj connected to word lines WLi and WLj. A memory cell transistor row MSGn is connected to a word line WLn and functions as a select gate line. The NAND flash memory cell matrix 210 has select gate lines SGS, SGD and a source line SL orthogonal to bit lines Bli and BLi+1, and further has memory cell rows Mi and Mj connected to word lines Wli and WLj. A memory cell transistor row MSG is connected to an arbitrary word line and functions as a select gate line. It is obvious that the NAND flash memory cell matrix 210, as shown in FIG. 36, may have memory cell transistor row MSG functioning as a select gate line configured as a divided write/erase NAND flash memory. The divided write/erase NAND flash memory cell matrix 120 is composed of a relatively small number of NAND columns, and used as an area with a small write/erase unit block, and mainly performs high-speed rewriting and rewriting-erasing of data in terms of code storage rather than in terms of data storage. On the other hand, the NAND flash memory has a large amount of data storing capacity.

According to the second embodiment of the present invention, by using the NAND flash memory cell matrix 210 as a data region and the divided write/erase NAND flash memory cell matrix 120 as a data management region, the nonvolatile semiconductor memory cell matrix with a highly functional system is achieved.

First Modified Example of the Second Embodiment

Figure 37:
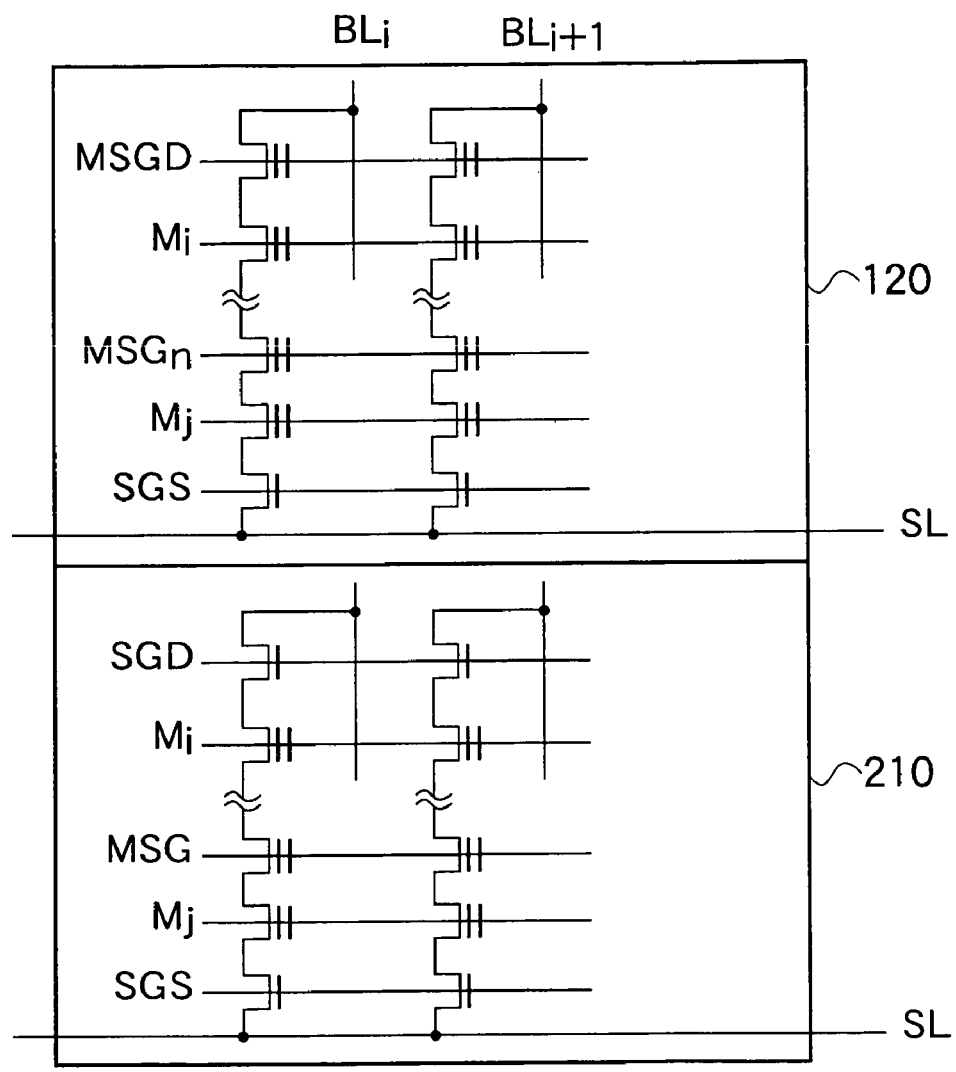
FIG. 37 is a view of the circuit system structure of a nonvolatile semiconductor memory according to a first modified example of the second embodiment of the present invention.

The nonvolatile semiconductor memory cell matrix according to a first modified example of the second embodiment of the present invention, as shown in FIG. 37, has a combination of a divided write/erase NAND flash memory cell matrix 120 constituted by a nonvolatile semiconductor memory cell matrix having the circuit structure described in the first modified example of the first embodiment as shown in FIG. 3, and a NAND flash memory cell matrix 210 operating as a usual NAND flash memory, where MOS type select gate transistors are arranged on both sides of NAND columns. The divided write/erase NAND flash memory cell matrix 120 has a select gate line SGS orthogonal to the bit lines Bli, BLi+1, and memory cell transistor row MSGD functioning as a select gate line, and a source line SL. In addition, the divided write/erase NAND flash memory cell matrix 120 has memory cell transistor rows Mi, Mj connected to word lines WLi, WLj, and a memory cell transistor row MSGn connected to a word line WLn and functioning as a select gate line. The NAND flash memory cell matrix 210 has select gate lines SGS, SGD and a source line SL orthogonal to the bit lines BLi, BLi+1, and further has memory cell rows Mi, Mj connected to word lines WLi, WLj. A memory cell transistor row MSG is connected to an arbitrarily selected word line and functions as a select gate line. It is obvious that the NAND flash memory cell matrix 210, as shown in FIG. 37, may have a memory cell transistor row MSG functioning as a select gate line to constitute a divided write/erase NAND flash memory. The divided write/erase NAND flash memory cell matrix 120 is composed of NAND columns with a comparatively small number of memory cell transistors used as an area with a small write-erase unit block, and mainly performs high-speed rewriting and rewriting/erasing of data in terms of code storage rather than in terms of data storage. On the other hand, the NAND flash memory has a large amount of data storing capacity.

According to the first modified example of the second embodiment of the present invention, by using the NAND flash memory cell matrix 210 as a data storage area and the divided write/erase NAND flash memory cell matrix 120 as a data management area, a highly functional nonvolatile semiconductor memory cell matrix system is achieved.

Second Modified Example of the Second Embodiment

Figure 38:
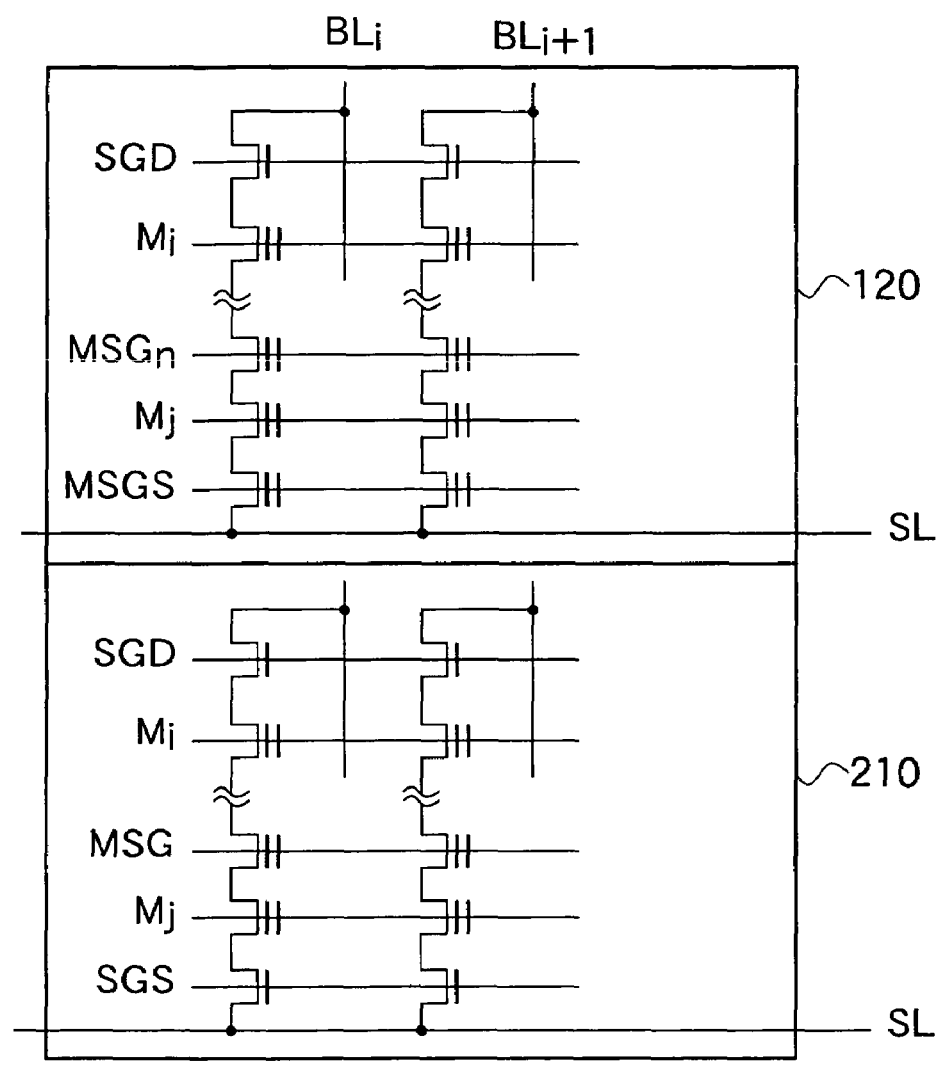
FIG. 38 is a view of the circuit system structure of a nonvolatile semiconductor memory according to a second modified example of the second embodiment of the present invention.

The nonvolatile semiconductor memory cell matrix according to a second modified example of the second embodiment of the present invention, as shown in FIG. 38, has a combination of a divided write/erase NAND flash memory cell matrix 120 constituted by a nonvolatile semiconductor memory cell matrix having the circuit structure described in the second modified example of the first embodiment as shown in FIG. 4, and a NAND flash memory cell matrix 210 operating as a usual NAND flash memory, where MOS type select gate transistors are arranged on both sides of NAND columns. The divided write/erase NAND flash memory cell matrix 120 has a select gate line SGD orthogonal to the bit lines BLi, BLi+1, a memory cell transistor row MSGS functioning as a select gate line, and a source line SL, and further includes memory cell rows Mi, Mj connected to word lines WLi, WLj, and a memory cell transistor row MSGn connected to a word line WLn and functioning as a select gate line. The NAND flash memory cell matrix 210 has select gate lines SGS, SGD and a source line SL orthogonal to the bit lines BLi, BLi+1, and further includes memory cell rows Mi, Mj connected to word lines WLi, WLj, and a memory cell transistor row MSG connected to an arbitrarily selected word line and functioning as a select gate line. It is obvious that the NAND flash memory cell matrix 210, as shown in FIG. 38, may also have a memory cell transistor row MSG functioning as a select gate line to be formed as a divided write/erase NAND flash memory. The divided write/erase NAND flash memory cell matrix 120 is composed of NAND columns with a comparatively small number of memory cell transistors. The region of the divided write/erase NAND flash memory cell matrix 120 is used as a small write-erase unit block, and mainly performs high-speed rewriting and rewriting/erasing of data in terms of code storage rather than in terms of data storage. On the other hand, the NAND flash memory has a large amount of data storage capacity.

According to the second modified example of the second embodiment of the present invention, by using the NAND flash memory cell matrix 210 as a data storage area and the divided write/erase NAND flash memory cell matrix 120 as a data management area, a highly functional nonvolatile semiconductor memory cell matrix is achieved.

Third Modified Example of the Second Embodiment

Figure 39:
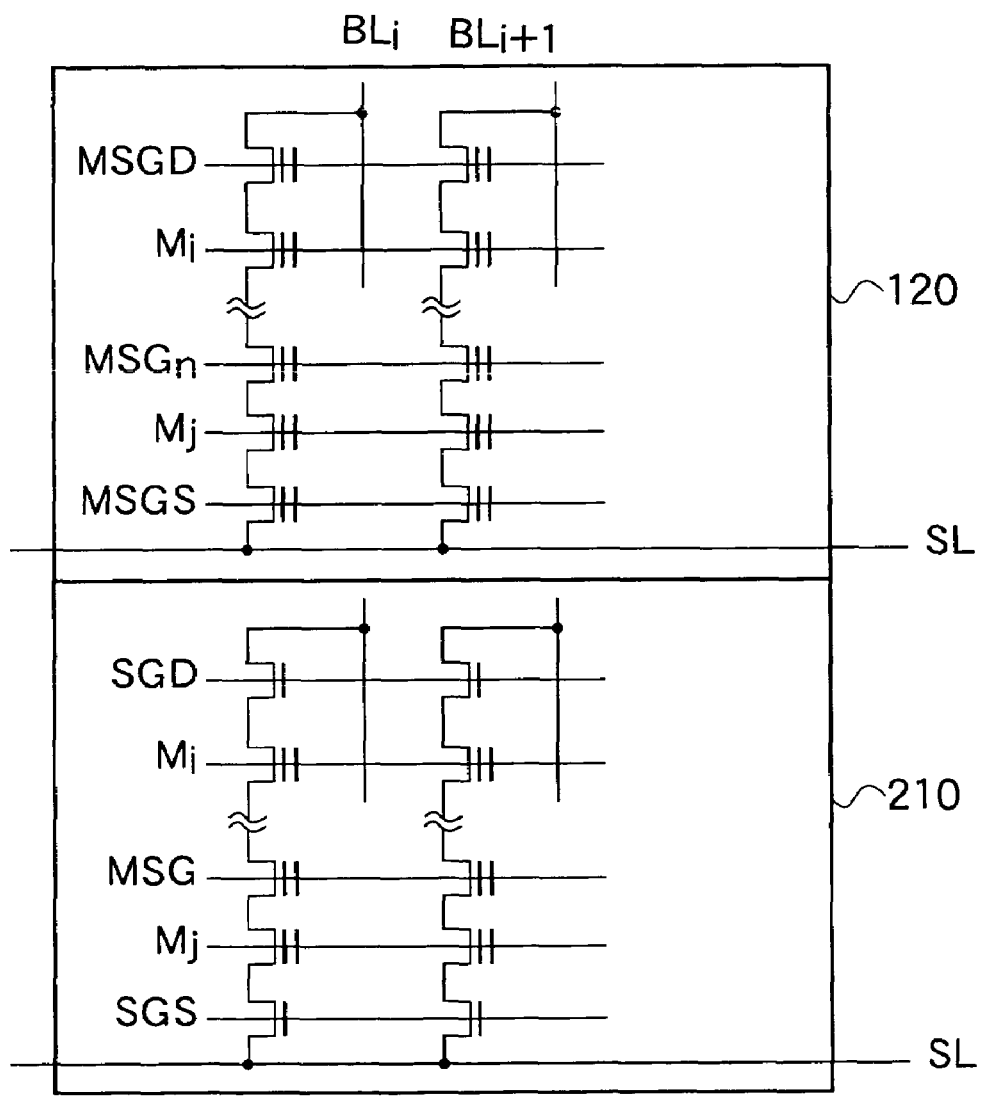
FIG. 39 is a view of the circuit system structure of a nonvolatile semiconductor memory according to a third modified example of the second embodiment of the present invention.

The nonvolatile semiconductor memory cell matrix according to a third modified example of the second embodiment of the present invention, as shown in FIG. 39, has a combination of a divided write/erase NAND flash memory cell matrix 120 constituted by a nonvolatile semiconductor memory cell matrix having the circuit structure described in the third modified example of the first embodiment as shown in FIG. 5, and a NAND flash memory cell matrix 210 operating as a usual NAND flash memory, where MOS type select gate transistors are arranged on both sides of NAND columns. The divided write/erase NAND flash memory cell matrix 120 has memory cell transistor rows MSGS, MSGD functioning as select gate lines, and a source line SL orthogonal to bit lines BLi, BLi+1. Memory cell transistors Mi, Mj are connected to word lines WLi, WLj, and memory cell transistor row MSGn connected to an arbitrary selected word line WLn and functions as a select gate line. The NAND flash memory cell matrix 210 has select gate lines SGS, SGD and a source line SL orthogonal to bit lines BLi, BLi+1, and memory cell rows Mi, Mj connected to word lines WLi, WLj. A memory cell transistor row MSG is connected to an arbitrarily selected word line and functions as a select gate line. It is obvious that the NAND flash memory cell matrix 210, as shown in FIG. 39, may have a memory cell transistor row MSG functioning as a select gate line to constitute a divided write/erase NAND flash memory. The divided write/erase NAND flash memory cell matrix 120 is composed of NAND columns with a comparatively small number of memory cell transistors. The region of the divided write/erase NAND flash memory cell matrix 120 is used as a small write/erase unit block, and mainly performs high-speed rewriting and rewriting/erasing of data in terms of code storage rather than in terms of data storage. On the other hand, the NAND flash memory has a large amount of data storage capacity.

According to the third modified example of the second embodiment of the present invention, by using the NAND flash memory cell matrix 210 as a data area and the divided write/erase NAND flash memory cell matrix 120 as a data management area, a highly functional nonvolatile semiconductor memory cell matrix is achieved.

Fourth Modified Example of the Second Embodiment

Figure 40:
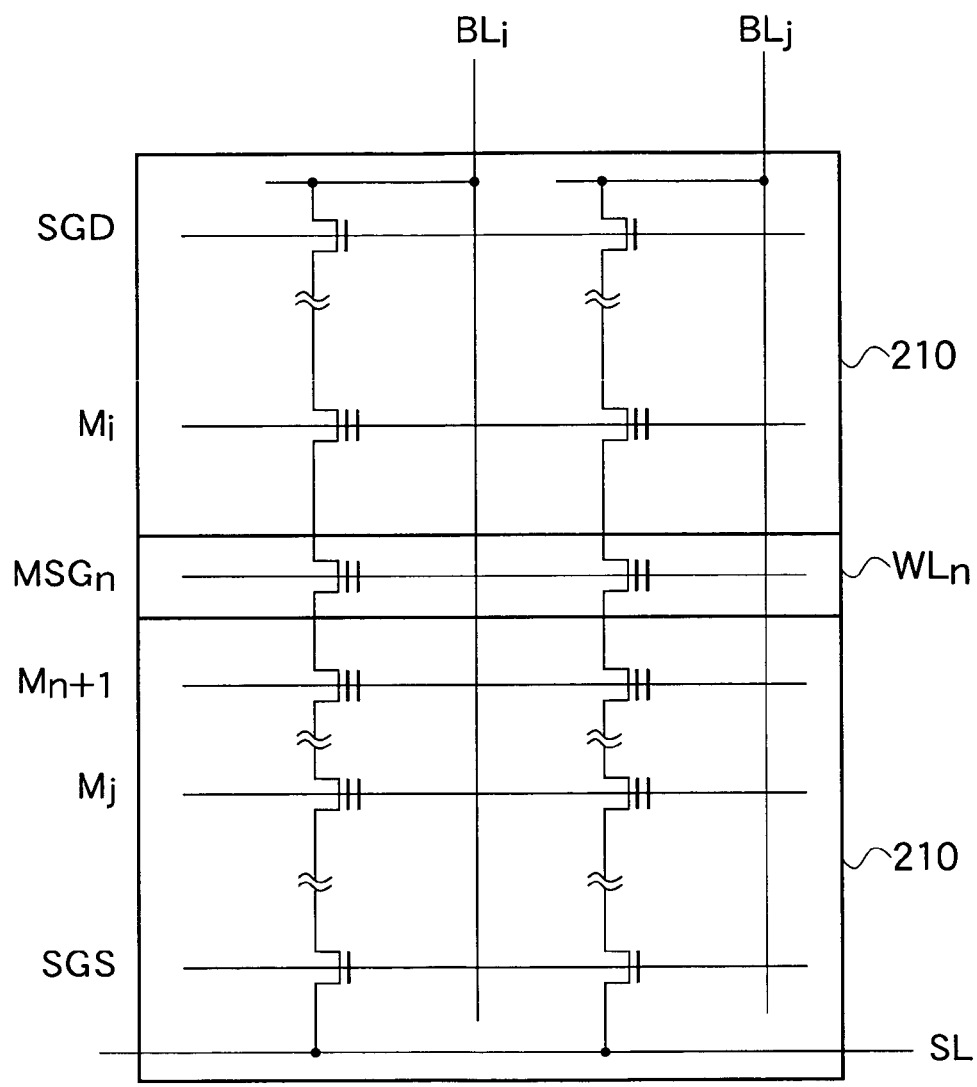
FIG. 40 is a view of the circuit system structure of a nonvolatile semiconductor memory according to a fourth modified example of the second embodiment of the present invention.

The nonvolatile semiconductor memory cell matrix according to a fourth modified example of the second embodiment of the present invention, as shown in FIG. 40, has a very simple structure constituted by a nonvolatile semiconductor memory cell matrix having the circuit structure described in the first embodiment as shown in FIG. 2. It is characterized in that the NAND flash memory cell matrix 210, having MOS type select gate transistors arranged on both sides of the NAND column, and operating as a usual NAND flash memory, is divided into two parts by memory cell transistor row MSGn connected to a word line WLn and functioning as a select gate line. That is, the NAND flash memory cell matrix 210 is divided into a memory cell array part on the bit line BL side of the word line WLn and a memory cell array part on the source line SL side, and one part is composed of NAND columns with a relatively small number of memory cell transistors. The region composed of NAND columns with a relatively small number of memory cell transistors is used as a region having a small write/erase unit block, and mainly performs high speed rewriting and rewriting/erasing of data in terms of code storage rather than in terms of data storage. The other part of the divided memory cell array serves as a NAND flash memory for a large amount of data storage use. By arbitrarily selecting the position of the word line WLn, the memory cell unit sizes of the memory cell array part for data management and the memory cell array part for storing data can be set and changed arbitrarily. The fourth modified example of the second embodiment of the present invention, as shown in FIG. 40, has select gate lines SGS, SGD and a source line SL orthogonal to bit lines BLi, BLi+1. Memory cell transistor rows Mi, Mj are connected to word lines WLi, WLj, and a memory cell transistor row MSGn is connected to a word line WLn and function as a select gate line. It is obvious that the NAND flash memory cell matrix 210 divided into the two parts may have a memory cell transistor row MSG functioning as a select gate line formed therein and inside thereof and may be further divided to be configured in a divided write/erase NAND flash memory.

According to the fourth modified example of the second embodiment of the present invention, the NAND flash memory cell matrix 210 can be arbitrarily divided to have the divided regions used as a data region and a data management region, with a comparatively simple structure, and thus achieves a highly functional nonvolatile semiconductor memory cell matrix.

Fifth Modified Example of the Second Embodiment

The nonvolatile semiconductor memory cell matrix according to a fifth modified example of the second embodiment of the present invention has a very simple structure constituted by a nonvolatile semiconductor memory cell matrix having the circuit structure described in the second modified example of the first embodiment as shown in FIG. 4. Because the entire circuit structure is the same as that of FIG. 40, an explanation will be omitted. The fifth modified example is characterized in that the NAND flash memory cell matrix 210, operating as a usual NAND flash memory having the select gate line SGD arranged on the bit line side of NAND columns and a memory cell transistor row MSGS functioning as a select gate line and connected to a source-line-side select gate line SGS, is divided into two parts by memory cell transistor row MSGn connected to a word line WLn and functioning as a select gate line. That is, the NAND flash memory cell matrix 210 is divided into a memory cell array part on the bit line BL side of the word line WLn, and a memory cell array part on the source line SL side. One part is composed of NAND columns with a relatively small number of memory cell transistors. The region composed of NAND columns with a relatively small number of memory cell transistors is used as a small size write/erase unit block, and mainly performs high speed rewriting and rewriting/erasing of data in terms of code storage rather than in terms of data storage. The other part serves as a NAND flash memory for large capacity data storage. By arbitrarily selecting the position of the word line WLn, the memory cell unit sizes of the memory cell array part for data management and the memory cell array part for storing data can be set and changed arbitrarily. The fifth modified example of the second embodiment of the present invention has a select gate line SGD, a memory cell transistor row MSGS functioning as a select gate line, and a source line SL orthogonal to bit lines BLi, BLi+1. Memory cell rows Mi, Mj are connected to word lines WLi, WLj, and a memory cell transistor row MSGn is connected to a word line WLn and functions as a select gate line. It is obvious that the NAND flash memory cell matrix 210 divided into the two parts may have a memory cell transistor row MSG functioning as a select gate line and the inside thereof may be further divided to be configured as a divided write/erase NAND flash memory.

According to the fifth modified example of the second embodiment of the present invention, the NAND flash memory cell matrix 210 can be arbitrarily divided to have the divided regions used as a data region and a data management region, with a comparatively simple structure, and thus achieves a highly functional nonvolatile semiconductor memory cell matrix.

Sixth Modified Example of the Second Embodiment

The nonvolatile semiconductor memory cell matrix according to a sixth modified example of the second embodiment of the present invention has a very simple structure constituted by a nonvolatile semiconductor memory cell matrix having the circuit structure described in the first modified example of the first embodiment. Because the entire circuit structure is the same as in FIG. 40, an explanation thereof is omitted.

In the sixth modified example, the MOS type select gate transistor is arranged on the source line side of NAND columns, and a memory cell transistor row MSGD functioning as a select gate line is arranged as a bit line side select gate line. In this structure, the NAND flash memory cell matrix 210 operating as a NAND flash memory is divided into two parts by the memory cell transistor row MSGn functioning as a select gate line connected to the word line WLn. That is, the NAND flash memory cell matrix 210 is divided into a memory cell array part on the bit line BL side of the word line WLn and a memory cell array part on the source line SL side. One part is composed of NAND columns with a relatively small number of memory cell transistors. The region composed of NAND columns with a relatively small number of memory cell transistors is used as a small write/erase unit block, and mainly performs high speed rewriting and rewriting/erasing of data in terms of code storage rather than in terms of data storage. The other part serves as a NAND flash memory for large capacity data storage. By arbitrarily selecting the position of the word lines WLn, the memory cell unit sizes of the memory cell array part for data management and the memory cell array part for storing data can be set and changed arbitrarily. The sixth modified example of the second embodiment of the present invention has a select gate line SGS, memory cell transistor row MSGD functioning as a select gate line, and a source line SL orthogonal to bit lines BLi, BLi+1. Memory cell rows Mi, Mj are connected to word lines WLi, WLj, and memory cell transistor row MSGn is connected to a word line WLn and functions as a select gate line. It is obvious that the NAND flash memory cell matrix 210 divided into two parts may have memory cell transistor row MSG functioning as a select gate line and further divided inside to be configured as a divided write/erase NAND flash memory.

According to the sixth modified example of the second embodiment of the present invention, the NAND flash memory cell matrix 210 can be arbitrarily divided to have the divided regions used as a data region and a data management region, with a comparatively simple structure, and thus achieves a highly functional nonvolatile semiconductor device.

Seventh Modified Example of the Second Embodiment

The nonvolatile semiconductor memory cell matrix according to a seventh modified example of the second embodiment of the present invention has a very simple structure constituted by a nonvolatile semiconductor memory cell matrix having the circuit structure described in the third modified example of the first embodiment. Because the entire circuit structure is the same as that of FIG. 40, an explanation thereof is omitted.

In the seventh modified example of the second embodiment, the MOS type select gate transistor is not provided, and the NAND flash memory cell matrix 210 operating as a NAND flash memory constituted by the memory cell including only word line as described in the third modified example of the first embodiment. The NAND flash memory is divided into two parts by the memory cell transistor row MSGn functioning as a select gate line connected to a word line WLn. Furthermore, a memory cell transistor row MSGD functioning as a select gate line is arranged as a bit-line-side select gate line and a memory cell transistor row MSGS functioning as select gate line is arranged as a source-line-side select gate line. That is, the NAND flash memory is divided into two parts such as the memory cell array part on the bit line BL side and the memory cell array part on the source line SL side, bordering on the word line WLn. Then, one of the parts is constituted by a comparatively small number of NAND columns. The region constituted by a comparatively small number of NAND columns is used as a small write/erase unit block, so as to mainly perform high speed rewriting and rewriting/erasing of data in terms of code storage rather than in terms of data storage. The other part serves as a data storage part for large capacity data. By arbitrarily selecting the position of the word lines WLn, the memory cell unit sizes of the memory cell array part for data management and the memory cell array part for storage can be arbitrarily set and changed. The seventh modified example of the second embodiment of the present invention has memory cell transistor rows MSGS, MSGD functioning as select gate lines, and a source line SL arranged orthogonal to bit lines BLi, BLi+1. Memory cell rows Mi, Mj are connected to word lines WLi, WLj, and memory cell transistor row MSGn is connected to a word line WLn and functions as a select gate line. It is obvious that the NAND flash memory cell matrix 210 divided into two parts may also have the memory cell transistor row MSG functioning as a select gate line, and the inside thereof is further divided to be configured as a divided write/erase NAND flash memory.

According to the seventh modified example of the second embodiment of the present invention, by arbitrarily dividing the NAND flash memory cell matrix 210 to be used as a data region and a data management region, with a comparatively simple structure of the nonvolatile semiconductor memory cell matrix, a highly functional nonvolatile semiconductor memory cell matrix is achieved.

Eighth Modified Example of the Second Embodiment

Figure 41:
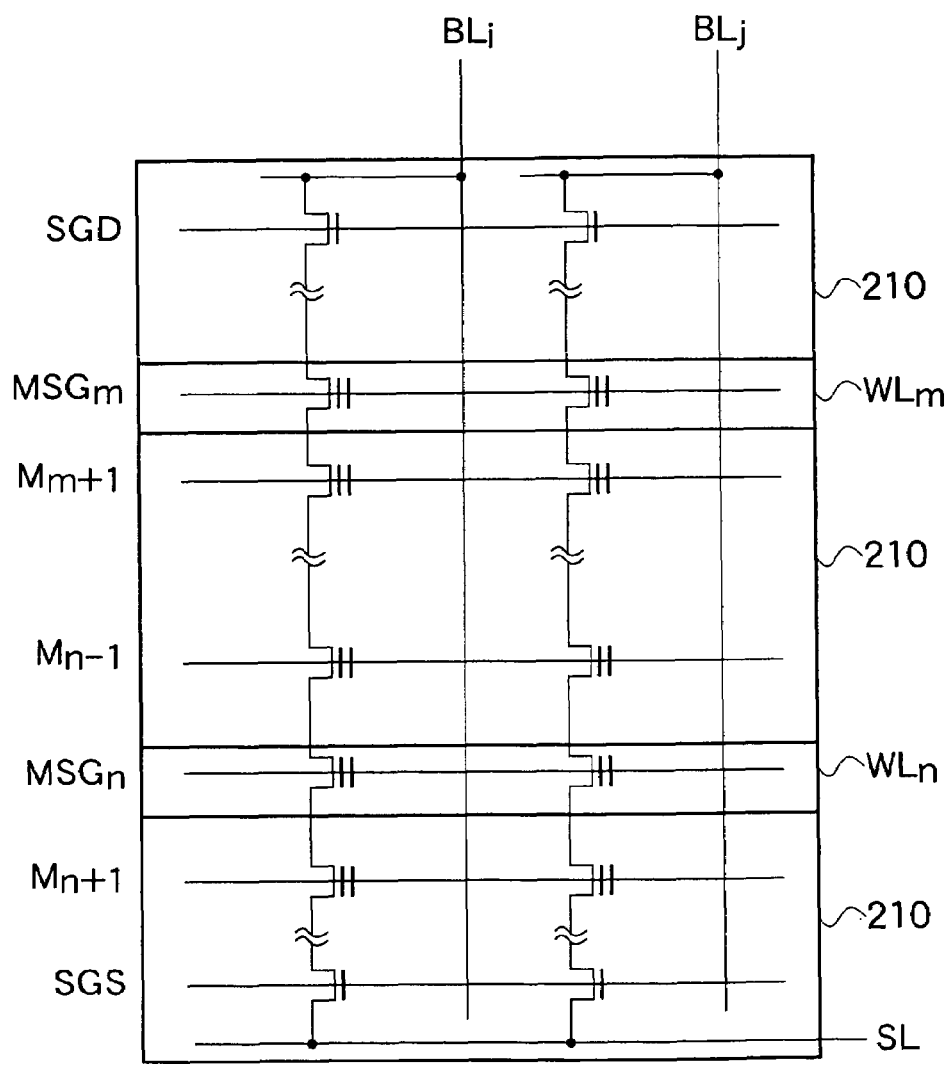
FIG. 41 is a view of the circuit system structure of a nonvolatile semiconductor memory according to an eighth modified example of the second embodiment of the present invention.

The nonvolatile semiconductor memory cell matrix according to an eighth modified example of the second embodiment of the present invention, as shown in FIG. 41, has a very simple structure constituted by a nonvolatile semiconductor memory cell matrix having the circuit structure described in the first embodiment. In the eighth modified example, the MOS type select gate transistor is disposed on both sides of a NAND column, and a NAND flash memory cell matrix 210 operating as a usual NAND flash memory is divided into three parts by memory cell transistor rows MSGm and MSGn functioning as select gate lines connected to word lines WLm and WLn. By dividing the NAND flash memory into three parts, the memory cell array region sandwiched between word line WLn and word line WLm, can be constituted by comparatively small number of NAND columns. The memory cell array part sandwiched between word lines WLn and WLm is used as a region having a small write/erase unit block and configured as a structure for mainly performing high speed rewriting and writing/erasing of data in terms of code storage rather than in terms of data storage. Moreover, the memory cell array part covering the range from the word line WLn to the source line SL may serve as a NAND flash memory for storing large capacity data.

The memory cell array part on the bit line BL side of the word line WLm may not be used as a NAND flash memory. By arbitrarily selecting the position of the word lines WLm, WLn, the memory cell unit sizes of the memory cell array part for data management and the memory cell array part for storing data can be set and changed arbitrarily. The eighth modified example of the second embodiment of the present invention, as shown in FIG. 41, has select gate lines SGS, SGD and a source line SL orthogonal to bit lines BLi, BLi+1. Memory cell rows Mm+1, Mn−1, Mn+1 are connected to word lines WLm+1, WLn−1, WLn+1 and memory cell transistor rows MSGm, MSGn are connected to word lines WLm, WLn and function as select gate lines. It is obvious that the NAND flash memory cell matrix 210 divided into the three parts may have memory cell transistor row MSG functioning as a select gate line and the inside thereof may be further divided to be configured in a divided write/erase NAND flash memory.

According to the eighth modified example of the second embodiment of the present invention, the NAND flash memory cell matrix 210 can be divided arbitrarily to have the divided regions used as a data region and a data management region, with a comparatively simple structure, and thus achieving a highly functional nonvolatile semiconductor memory cell matrix.

Ninth to Eleventh Modified Examples of the Second Embodiment

The nonvolatile semiconductor memory cell matrices according to ninth to eleventh modified examples of the second embodiment of the present invention have very simple structures constituted respectively by nonvolatile semiconductor memories having the circuit structures described in the first to third modified examples of the first embodiment. Because the entire circuit structure is the same as that of FIG. 41, an explanation will be omitted. In the ninth and tenth modified examples, the MOS type select gate transistors are arranged on one side of NAND columns, and in the eleventh modified example, memory cell transistor rows MSGD, MSGS functioning as select gate lines are arranged on both sides of NAND columns. The ninth through eleventh modifications are characterized in that the NAND flash memory cell matrix 210 operating as a usual NAND flash memory is divided into three parts by memory cell transistor rows MSGm, MSGn connected to word lines WLm, WLn and functioning as select gate lines. By dividing the NAND flash memory into three parts, the memory cell array part sandwiched between word line WLn and word line WLm, can be constituted by a comparatively small number of NAND columns. The memory cell array part sandwiched between word lines WLn and WLm is used as a small write/erase unit block, and configured as a structure for mainly performing high speed rewriting and writing/erasing of data in terms of code storage rather than in terms of data storage. Moreover, the memory cell array part covering the range from the word line WLn to the source line SL may serve as a NAND flash memory for storing large capacity data. Furthermore, the memory cell array part on the bit line BL side of the word line WLm may not be used as a NAND flash memory. By arbitrarily selecting the position of the word lines WLm, WLn, the memory cell unit sizes of the memory cell array part for data management and the memory cell array part for storing data can be set and changed arbitrarily.

According to the ninth through eleventh modified examples of the second embodiment of the present invention, the NAND flash memory cell matrix 210 can be divided arbitrarily to have the divided regions used as a data region and a data management region with a simple structure, and thus provides a highly functional nonvolatile semiconductor memory cell matrix.

Twelfth Modified Example of the Second Embodiment

Figure 42:
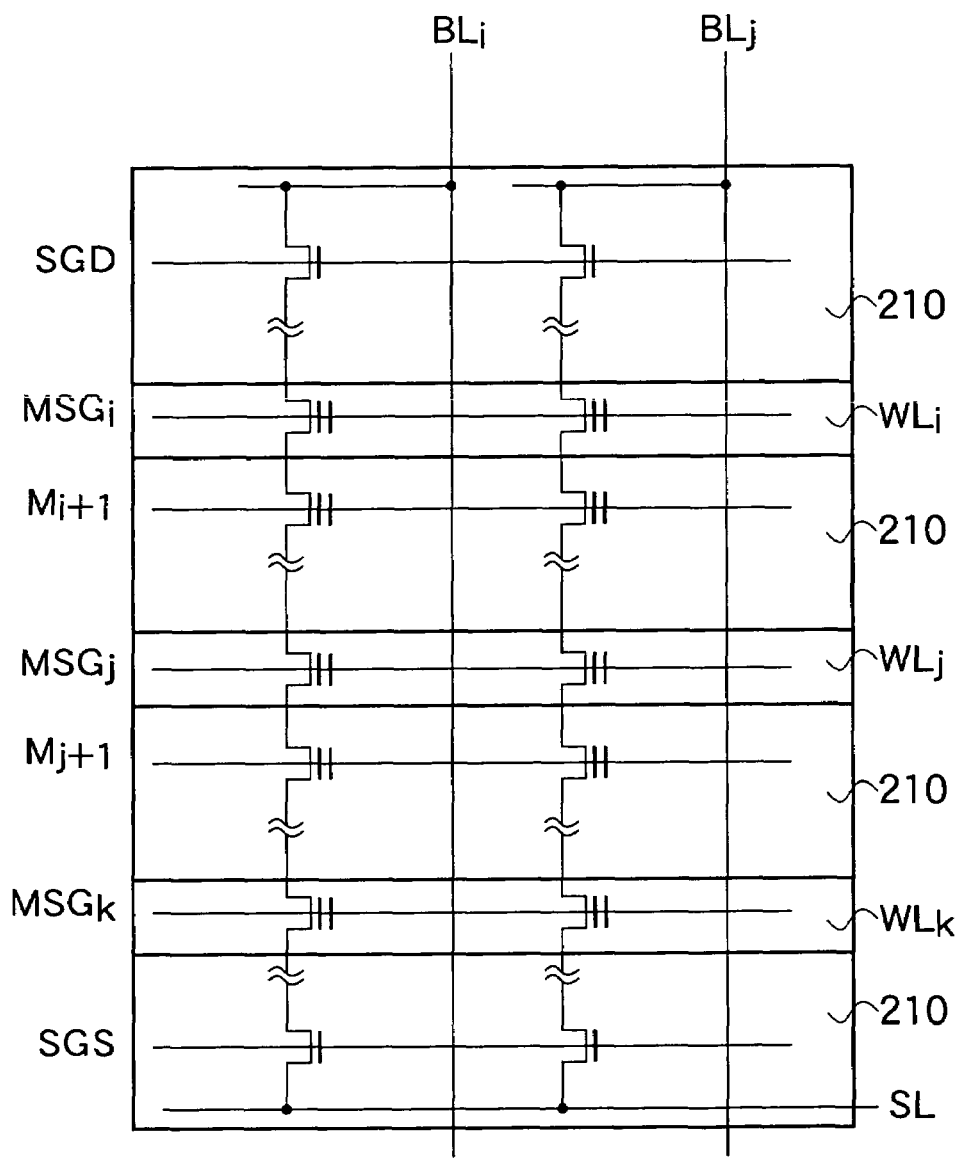
FIG. 42 is a view of the circuit system structure of a nonvolatile semiconductor memory according to a twelfth modified example of the second embodiment of the present invention.

The nonvolatile semiconductor memory cell matrix according to a twelfth modified example of the second embodiment of the present invention, as shown in FIG. 42, has a very simple structure constituted by the nonvolatile semiconductor memory cell matrix having the circuit structure described in the first embodiment. The twelfth modified example is characterized in that the MOS type select gate transistor is disposed on both sides of NAND column, and a NAND flash memory is divided into four parts by memory cell transistor rows MSGi, MSGj, and MSGk functioning as select gate lines connected to word lines WLi and WLj, WLk. By dividing the NAND flash memory into four parts, the memory cell array part sandwiched between word line WLi and word line WLj, and word line WLj and word line WLk can be constituted by a comparatively small number of NAND columns. The memory cell array part sandwiched between word lines WLi and WLj, and word lines WLj and WLk can be used as a region having a small write/erase unit block to be configured in a structure for mainly performing high speed rewriting. Furthermore, the memory cell array ranging from the word line WLk to the source line SL is capable of storing large capacity data. Further, the memory cell array part on the bit line BL side extending from the word line WLi can be configured in a structure not used as a NAND flash memory. By arbitrarily selecting the position of the word lines WLi, WLj, and WLk, the memory size of the memory cell array part for data management and the memory cell array part for storing data can be set and changed arbitrarily. The twelfth modified example of the second embodiment of the present invention, as shown in FIG. 42, has select gate lines SGS, SGD and a source line SL at orthogonal to bit lines BLi, BLi+1. Memory cell transistor rows MSGi, MSGj, MSGk connected to the word lines WLi, WLj, WLk can function as selecting gate lines. It is obvious that the NAND flash memory cell matrix 210 divided into the four parts may have memory cell transistor row MSG functioning as a select gate line, and divided further inside to be used as a divided write/erase NAND flash memory.

According to the twelfth modified example of the second embodiment of the present invention, the NAND flash memory cell matrix 210 can be divided arbitrarily to have the divided regions used as a data region and a data management region with a comparatively simple structure, and thus provides a highly functional nonvolatile semiconductor memory cell matrix.

Thirteenth to Fifteenth modified Examples of the Second Embodiment

The nonvolatile semiconductor memory cell matrices according to the thirteenth through fifteenth modified examples of the second embodiment of the present invention have very simple structures constituted respectively by nonvolatile semiconductor memories having the circuit structures described in the first to third modified examples of the first embodiment. Because the entire circuit structure is the same as in FIG. 42, explanation is omitted. In the thirteenth and fourteenth modified examples, MOS type select gate transistors are arranged on one side of NAND columns, and in the fifteenth modified example, memory cell transistor rows MSGD, MSGS functioning as select gate lines are arranged on both sides of NAND columns. All of the modified embodiments are characterized in that the NAND flash memory cell matrix 210 operating as a usual NAND flash memory is divided into four parts by memory cell transistor rows MSGi, MSGj, MSGk connected to word lines WLi, WLj, WLk and functioning as select gate lines. As divided into four parts in this way, the memory cell array part sandwiched respectively by the word lines WLi, WLj and WLj, WLk is constituted to have NAND columns with a comparatively small number of memory cell transistors. The region constituted to have NAND columns with a comparatively small number of memory cell transistors can be used as a small write/erase unit block and mainly operates high-speed rewriting and rewriting/erasing of data in terms of code storage rather than in terms of data storage. Moreover, the memory cell array part ranging from the word line WLk to the source line SL may be constituted by a NAND flash memory to have a large data storage capacity. Furthermore, the memory cell array part on the bit line BL side of the word line WLi can be configured to have a structure, which is not used as a NAND flash memory. By arbitrarily selecting the position of the word lines WLi, WLj, WLk, the memory cell unit size of the memory cell array part for data management and the memory cell array part for storing data can be set and changed arbitrarily.

According to the thirteenth to fifteenth modified examples of the second embodiment of the present invention, the NAND flash memory cell matrix 210 can be arbitrarily divided to have the divided areas used as a data area and a data management area with a simple structure, and thus provide a highly functional nonvolatile semiconductor memory cell matrix.

Third Embodiment

Example of Nonvolatile Semiconductor Memory System Structure

Figure 43:
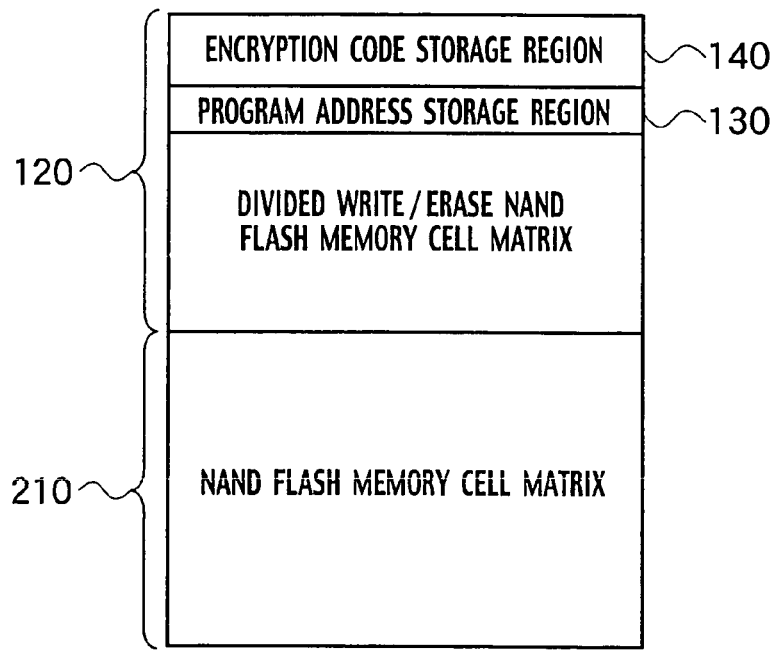
FIG. 43 is a view of the block structure of a nonvolatile semiconductor memory system according to a third embodiment of the present invention.

A nonvolatile semiconductor memory system includes a divided write/erase NAND flash memory cell matrix 120 and a NAND flash memory cell matrix 210, as shown in FIG. 43.

A divided write/erase NAND flash memory cell matrix 120 connectable to a functional select gate control circuit 320 generating a functional select gate control signal SGCS includes a plurality of first word lines arranged in a row direction, a plurality of bit lines arranged in a column direction, a plurality of first memory cell transistors arranged in the column direction, each of the first memory cell transistors having a first charge storage layer, a charge storage state of the first memory cell transistors being controlled by one of the first word lines, at least one of the first memory cell transistors functions as a first select gate transistor by receiving the functional select gate control signal through the word line, and injects a charge into the first electric charge storage layer so as to form an enhancement mode transistor.

A NAND flash memory cell matrix 210 includes a plurality of second word lines arranged in the row direction, the bit lines arranged in the column direction, a plurality of second memory cell transistors arranged in the column direction, each of the second memory cell transistors having a second charge storage layer, a charge storage state of second memory cell transistors being controlled by one of the second word lines.

In the nonvolatile semiconductor memory system, the divided write/erase NAND flash memory cell matrix 120 is divided into three parts by memory cell transistor rows functioning as select gate lines, and further includes at least one of an encryption code storage region 140 and a program address storage region 130, as shown in FIG. 43.

The nonvolatile semiconductor memory system according to the third embodiment of the present invention, as shown in FIG. 43, is configured to include a NAND flash memory cell matrix 210, a divided write/erase NAND flash memory cell matrix 120, a divided program address storage region 130 and a divided encryption code storage region 140 in the divided write/erase NAND flash memory cell matrix 120. The divided write/erase NAND flash memory cell matrix 120 including the program address storage region 130 and the encryption code storage region 140 is constituted by a comparatively small number of NAND columns, and the region of the comparatively small number of NAND columns is used as a small write/erase unit block. Further the region of the comparatively small number of NAND columns mainly performs high-speed rewriting and rewriting/erasing of data in terms of code storage. The NAND flash memory cell matrix 210 is used as a data storage area.

According to the third embodiment of the present invention, the memory cell transistor functioning as a select gate transistor is used, thus providing a nonvolatile semiconductor memory system with high-density memory cell transistors, preventing an increase in the write/erase unit size and permits the write/erase unit to be small or arbitrarily set, and is capable of high-speed rewriting, or high degree of freedom in arbitrarily setting the write/erase unit.

First Modified Example of the Third Embodiment

In the nonvolatile semiconductor memory system, the NAND flash memory cell matrix 210 is divided into two parts by a memory cell transistor row functioning as a select gate line, and further includes an encryption code storage region 140.

Figure 44:
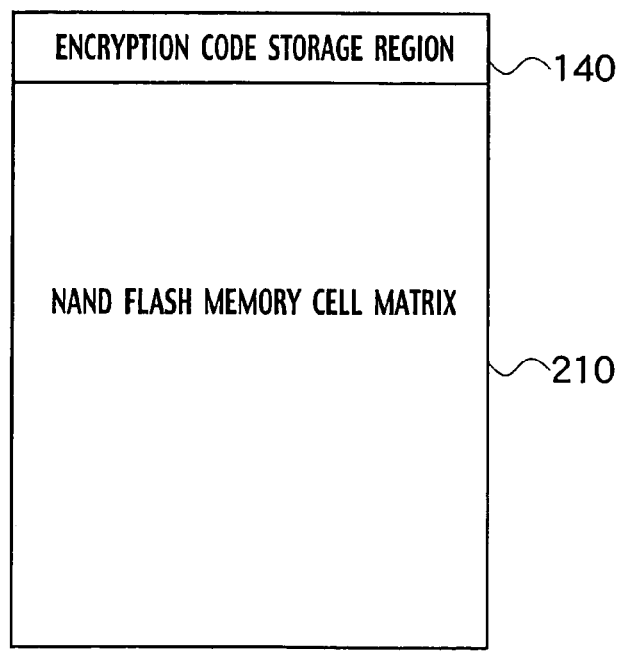
FIG. 44 is a view of the block structure of a nonvolatile semiconductor memory system according to a first modified example of the third embodiment of the present invention.

The nonvolatile semiconductor memory system according to a first modified example of the third embodiment of the present invention, as shown in FIG. 44, is constituted to include a NAND flash memory cell matrix 210 and an encryption information storage region 140. The encryption code storage region 140 is arranged by dividing a region of the NAND flash memory cell matrix 210. The encryption code storage region 140 can be constituted as a divided write/erase NAND flash memory cell matrix 120 as shown in FIG. 43. The encryption code storage region 140 is configured to have NAND columns with a comparatively small number of memory cell transistors. The region configured to have NAND columns with a comparatively small number of memory cell transistors is used as a small write/erase unit block, and mainly performs high-speed rewriting and rewriting/erasing of data in terms of code storage. The NAND flash memory cell matrix 210 is used as a data storage area.

According to the first modified example of the third embodiment of the present invention, the memory cell transistor functioning as a select gate transistor is used, thus providing a nonvolatile semiconductor memory system with high-density memory cell transistors, preventing an increase in the write/erase unit block size with a small or arbitrarily set write/erase unit, and which is capable of high-speed rewriting, or high degree of freedom in arbitrarily setting the write/erase unit.

Second Modified Example of the Third Embodiment

Figure 45:
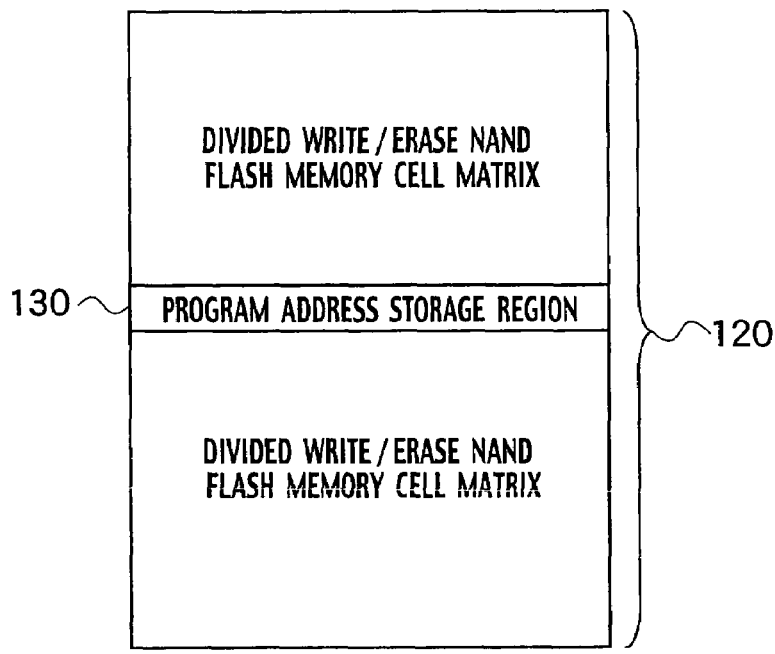
FIG. 45 is a view of the block structure of a nonvolatile semiconductor memory system according to a second modified example of the third embodiment of the present invention.

The nonvolatile semiconductor memory system according to a second modified example of the third embodiment of the present invention, as shown in FIG. 45, is constituted to include a divided write/erase NAND flash memory cell matrix 120 including a program address storage region 130. The program address storage region 130 is arranged by dividing a region of the divided write/erase NAND flash memory cell matrix 120. The program address storage region 130 is configured to have NAND columns with a comparatively small number of memory cell transistors. The region configured to have NAND columns with a comparatively small number of memory cell transistors is used as a small write/erase unit block and mainly operates high-speed rewriting and rewriting/erasing of data in terms of code storage. The divided write/erase NAND flash memory cell matrix 120 can also be used as a data storage area.

According to the second modified example of the third embodiment of the present invention, the memory cell transistor functioning as a select gate transistor is used. Thus, a nonvolatile semiconductor memory system with high-density memory cell transistors is provided and prevents an increase in the write/erase unit block size. The write/erase unit is small or arbitrarily set, and is capable of high-speed rewriting, or high degree of freedom in arbitrarily setting the write/erase unit.

Third Modified Example of the Third Embodiment

Figure 46:
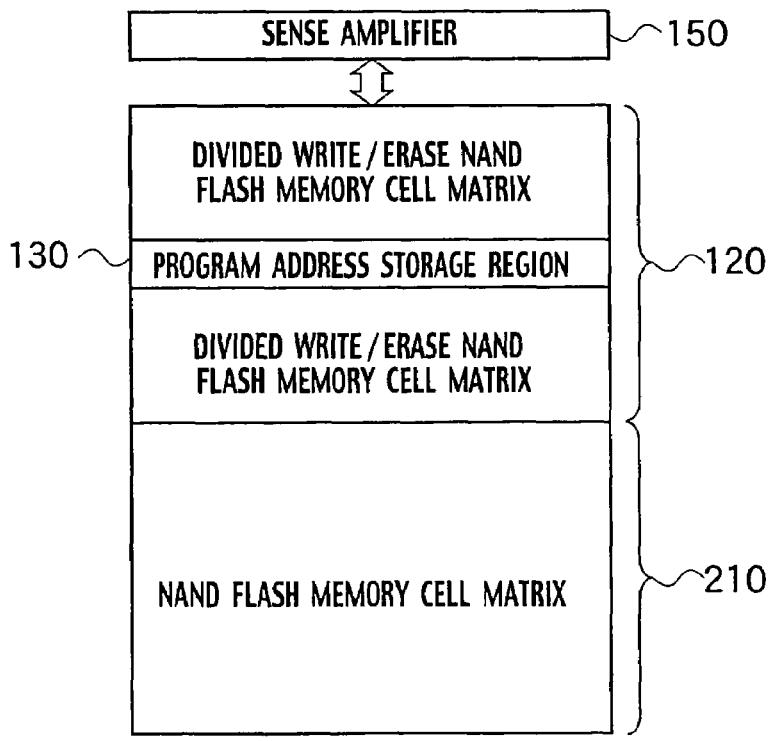
FIG. 46 is a view of the block structure of a nonvolatile semiconductor memory system according to a third modified example of the third embodiment of the present invention.

The nonvolatile semiconductor memory system according to a third modified example of the third embodiment of the present invention, as shown in FIG. 46, is composed of a NAND flash memory cell matrix 210, a divided write/erase NAND flash memory cell matrix 120 including a program address storage region 130, and sense amplifiers 150. The program address storage region 130 is arranged by dividing a region thereof in the divided write/erase NAND flash memory cell matrix 120. The NAND flash memory cell matrix 210 is used as a data storage area. The divided write/erase NAND flash memory cell matrix 120 including the program address storage region 130 is configured to have NAND columns with a comparatively small number of memory cell transistors. The region configured to have NAND columns with a comparatively small number of memory cell transistors is used as a region with a small write/erase unit block, and mainly performs high-speed rewriting and rewriting/erasing of data in terms of code storage. The sense amplifiers 150 can detect the high-speed rewriting and rewriting/erasing of data in terms of code storage.

According to the third modified example of the third embodiment of the present invention, the memory cell transistor functioning as a select gate transistor is used. Thus, a nonvolatile semiconductor memory system with high-density memory cell transistors is provided. The nonvolatile semiconductor memory system prevents an increase in the write/erase unit block size. The write/erase unit is small or arbitrarily set, and is capable of high-speed rewriting, or high degree of freedom in arbitrarily setting the write/erase unit.

Fourth Modified Example of the Third Embodiment

The nonvolatile semiconductor memory system according to a fourth modified example of the third embodiment of the present invention, as shown in FIG. 47, is constituted to include a NAND flash memory cell matrix 210, a divided write/erase NAND flash memory cell matrix 120, a bottom page buffer 291, a word line driver 300, and a functional select gate control circuit 320. The functional select gate control signal lines (SGCSL) 322, 324 are arranged between the functional select gate control circuit 320 and the NAND flash memory cell matrix 210, and between the functional select gate control circuit 320 and the divided write/erase NAND flash memory cell matrix 120. The functional select gate control circuit 320 transmits the functional select gate control signal (SGCS) to the word lines connected to the gate of the memory cell transistors via the functional select gate control signal lines (SGCSL) 322, 324. Furthermore, the functional select gate control circuit 320 can transmit functional select gate control signals (SGCS) to the select gate line connected to the gate of the select gate transistor other than the memory cell transistors via the functional select gate control signal lines (SGCSL) 322, 324. In this case, the select gate transistor may have the same structure as the memory cell transistor, which can function as a select gate transistor.

In the fourth modified example, memory cell transistors connected to word lines arbitrary selected by means of the functional select gate control circuit 320, can be designed to function as select gate transistors in both of the NAND flash memory cell matrix 210 and the divided write/erase NAND flash memory cell matrix 120. The arbitrary selected word lines are connected to the functional select gate control circuit 320 via a plurality of functional select gate control signal lines (SGCSL) 322, 324.

As described above, not only a memory cell transistor but also initially intended to be a source line side select gate transistor, or initially intended to be a bit line side select gate transistor can function as a select gate transistor derived from a memory cell transistor. By setting a plurality of memory cell transistor rows, the divided write/erase NAND flash memory cell matrix 120 may be divided into two, three, or four regions. Also in the NAND flash memory cell matrix 210, it is a matter of course that the memory cell transistor rows functioning as select gate lines are set at arbitrary places, in arbitrary numbers, as needed.

The divided write/erase NAND flash memory cell matrix 120 is configured to have comparatively small numbers of NAND columns. The region configured by comparatively small numbers of NAND columns is used as a small write/erase unit block, and mainly performs high-speed rewriting and rewriting/erasing of data in terms of code storage. The NAND flash memory cell matrix 210 is used as a data storage region.

According to the fourth modified example of the third embodiment of the present invention, the memory cell transistor functioning as a select gate transistor is used. Thus, a nonvolatile semiconductor memory system with high-density memory cell transistors is provided. The nonvolatile semiconductor memory system prevents an increase in the write/erase unit block size. The write/erase unit is small or arbitrarily set, and is capable of high-speed rewriting, or high degree of freedom in arbitrarily setting the write/erase unit.

Fifth Modified Example of the Third Embodiment

The nonvolatile semiconductor memory system according to a fifth modified example of the third embodiment of the present invention, as shown in FIG. 48, is constituted to include a NAND flash memory cell matrix 210, a divided write/erase NAND flash memory cell matrix 120, a bottom page buffer 291, a word line driver 300, and a functional select gate control circuit 320. Further, the NAND flash memory cell matrix 120 is further divided by the memory cell transistor row MSGn shown as a select gate memory row in FIG. 48, to determine the arrangement of the program address storage region 130. Also, a plurality of functional select gate control signal lines (SGCSL) 322 is arranged between the functional select gate control circuit 320 and the divided write/erase NAND flash memory cell matrix 120. The functional select gate control signal (SGCS) is transmitted from the functional select gate control circuit 320 to word lines connected to the gate of the memory cell transistors, via the functional select gate control signal line (SGCSL) 322.

In the fifth modified example, memory cell transistors connected to word lines arbitrary selected by means of the functional select gate control circuit 320, can be designed to function as select gate transistors in the divided write/erase NAND flash memory cell matrix 120. The arbitrary selected word lines are connected to the functional select gate control circuit 320 via a plurality of functional select gate control signal lines (SGCSL) 322. The fifth modified example is characterized in that by means of the functional select gate control circuit 320, any word line can be selected to function as a select gate line in the divided write/erase NAND flash memory cell matrix 120. As described above, not only the memory cell transistor but also initially intended to be a source line side select gate transistor, or initially intended to be a bit line side select gate transistor, is capable of functioning as a select gate transistor derived from a memory cell transistor. In the divided write/erase NAND flash memory cell matrix 120, it is satisfactory that plural numbers of memory cell transistor rows functioning as select gate lines are configured in two divided regions, three divided regions, or four divided regions.

The divided write/erase NAND flash memory cell matrix 120 is configured by a comparatively small number of NAND columns. The region configured by a comparatively small number of NAND columns is used as a region having a small write/erase unit block, and mainly performs high-speed rewriting and rewrite/erase of data in terms of code storage. The NAND flash memory cell matrix 210 is used as a data storage region.

According to the fifth modified example of the third embodiment of the present invention, the memory cell transistor functioning as a select gate transistor is used. Thus, a nonvolatile semiconductor memory system with high-density memory cell transistors is provided. The nonvolatile semiconductor memory system prevents an increase in the write/erase unit block size. The write/erase unit is small or arbitrarily set, and is capable of high-speed rewriting, or high degree of freedom in arbitrarily setting the write/erase unit.

Sixth Modified Example of the Third Embodiment

A monolithic integrated circuit mounted on a semiconductor chip 20 includes a divided write/erase NAND flash memory cell matrix 120, a NAND flash memory cell matrix 210, and a logic circuit, such as a CPU 160 to control the divided write/erase NAND flash memory cell matrix 120.

A divided write/erase NAND flash memory cell matrix 120 connectable to a functional select gate control circuit 320 generating a functional select gate control signal SGCS includes a plurality of first word lines arranged in a row direction, a plurality of bit lines arranged in a column direction, a plurality of first memory cell transistors arranged in the column direction, each of the first memory cell transistors having a first charge storage layer, a charge storage state of the first memory cell transistors being controlled by one of the first word lines, at least one of the first memory cell transistors functions as a first select gate transistor by receiving the functional select gate control signal through the word line, and injects a charge into the first charge storage layer so as to form an enhancement mode transistor.

A NAND flash memory cell matrix 210 includes a plurality of second word lines arranged in a row direction, the bit lines arranged in the column direction, a plurality of second memory cell transistors arranged in a column direction, each of the second memory cell transistors having a second charge storage layer, a charge storage state of the second memory cell transistors being controlled by one of the second word lines.

Figure 49:
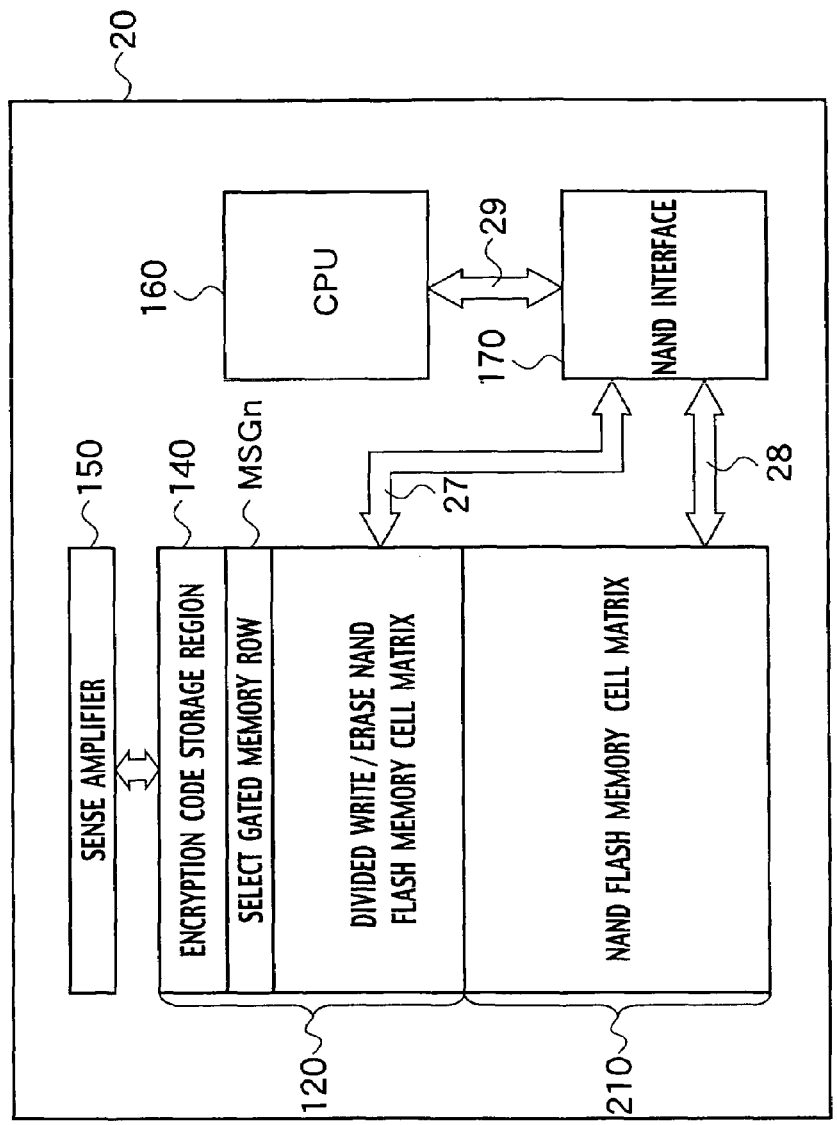
FIG. 49 is a view of the block structure of a nonvolatile semiconductor memory system according to a sixth modified example of the third embodiment of the present invention.

The nonvolatile semiconductor memory system according to a sixth modified example of the third embodiment of the present invention, as shown in FIG. 49, is constituted to include a NAND flash memory cell matrix 210, a divided write/erase NAND flash memory cell matrix 120 including an encryption code information storage region 140, sense amplifiers 150, a NAND interface 170, and a CPU 160, so as to configure a semiconductor integrated circuit chip 20. The NAND interface 170 is connected to the CPU 160 via a bus wire 29. The NAND interface 170 is connected to the divided write/erase NAND flash memory cell matrix 120 via a bus wire 27. The NAND interface 170 is connected to the divided write/erase NAND flash memory cell matrix 120 via a bus wire 28. The encryption code storage region 140 is defined by the memory cell transistor row MSGn functioning as a select gate line in the divided write/erase NAND flash memory cell matrix 120, as shown in FIG. 49. The NAND flash memory cell matrix 210 is used as a data storage area. The divided write/erase NAND flash memory cell matrix 120 including the encryption code storage region 140 is configured by a comparatively small number of NAND columns. The region configured by a comparatively small number of NAND columns is used as a small write/erase unit block, and mainly performs high-speed rewriting and rewriting/erasing of data in terms of code storage. The sense amplifiers 150 can detect high speed rewriting of the divided write/erase NAND flash memory cell matrix 120, and the rewriting/erasing of the code storage data in the encryption code storage region 140.

According to the sixth modified example of the third embodiment of the present invention, the memory cell transistor functioning as a select gate transistor is used. The NAND flash memory cell matrix 210, the divided write/erase NAND flash memory cell matrix 120 including the encryption code information storage region 140, the sense amplifiers 150, and the NAND interface 170 are integrated on the same semiconductor integrated circuit chip 20 with the CPU 160, thus providing a CPU controlled nonvolatile semiconductor memory system. Thus, the CPU controlled nonvolatile semiconductor memory system with high-density memory cell transistors is provided. The nonvolatile semiconductor memory system prevents an increase in the write/erase unit block size. The write/erase unit is small or arbitrarily set, and is capable of high-speed rewriting, or high degree of freedom in arbitrarily setting the write/erase unit.

Fourth Embodiment

Figure 50:
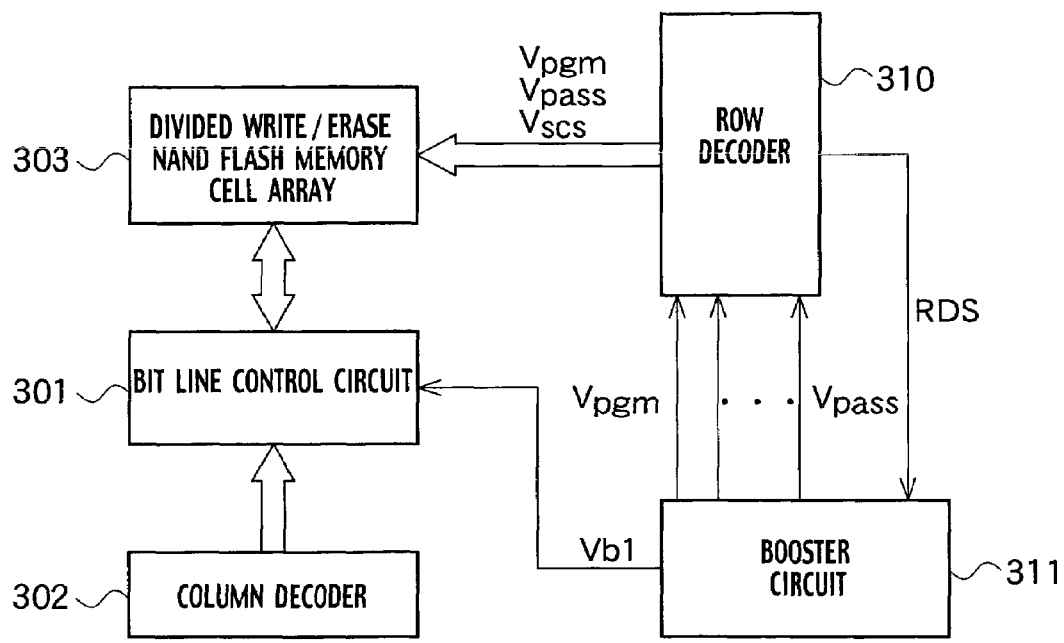
FIG. 50 is a view of the block structure of a nonvolatile semiconductor memory system according to a fourth embodiment of the present invention.

The nonvolatile semiconductor memory system according to the fourth embodiment of the present invention, as shown in FIG. 50, is constituted to include a divided write/erase NAND flash memory cell array 303, a bit line control circuit 301, a row decoder 310, a column decoder 302, and a voltage booster circuit 311. The nonvolatile semiconductor memory system according to the first and/or second embodiment of the present invention as described above, can be applied to the divided write/erase NAND flash memory cell array 303. That is, in the divided write/erase NAND flash memory cell array 303, divided write/erase NAND flash memory cell units are arranged in the row and column directions of a matrix, and word lines, bit lines, select gate lines, source lines and the like are arranged. The divided write/erase NAND flash memory cell array 303 is connected to the bit line control circuit 301 and the row decoder 310. The bit line control circuit 301 is a circuit to perform a latching operation of written data and a sensing operation in a readout mode. The bit line control circuit 301 is connected to the column decoder 302 for decoding a column address signal to select a column of NAND cell units. The voltage booster circuit 311 generates a programming writing voltage voltage Vpgm, a intermediate voltage Vpass, a bit line voltage Vbl, a functional select gate control signal voltage Vsgcs and the like from the power supply voltage. The row decoder 310 supplies a control signal RDS to the voltage booster circuit 311 and receives the writing voltage Vpgm and the intermediate voltages Vpass. The row decoder 310 decodes a row address signal and outputs various voltages for selecting memory cell transistors in the divided write/erase NAND flash memory cell array 303, or for selecting memory cell transistors functioning as a select gate transistor. That is, decoded signals such as the writing voltage Vpgm, the intermediate voltage Vpgm, the functional select gate control signal voltage Vsgcs are supplied from the voltage booster circuit 311. Accordingly, it is possible to select the word line, the select gate line, or the functional select gate control signal line SGCSL in the above-described divided write/erase NAND flash memory cell array 303. Moreover, the bit line control circuit 301 receives the bit line voltage Vbl from the voltage booster circuit 311 and supplies the bit line voltage Vbl to a column of NAND cell units selected by the column decoder 302. Note that FIG. 50 shows only the minimum necessary circuits, and omits showing other circuits such as an address buffer, a data input/output buffer, and a timing generation circuit.

Fifth Embodiment

Operation modes of the nonvolatile semiconductor memory system according to the embodiments of the present invention are broadly classified into three modes referred to as a page mode, a byte mode, and an EEPROM mode having a ROM region.

Figure 51:
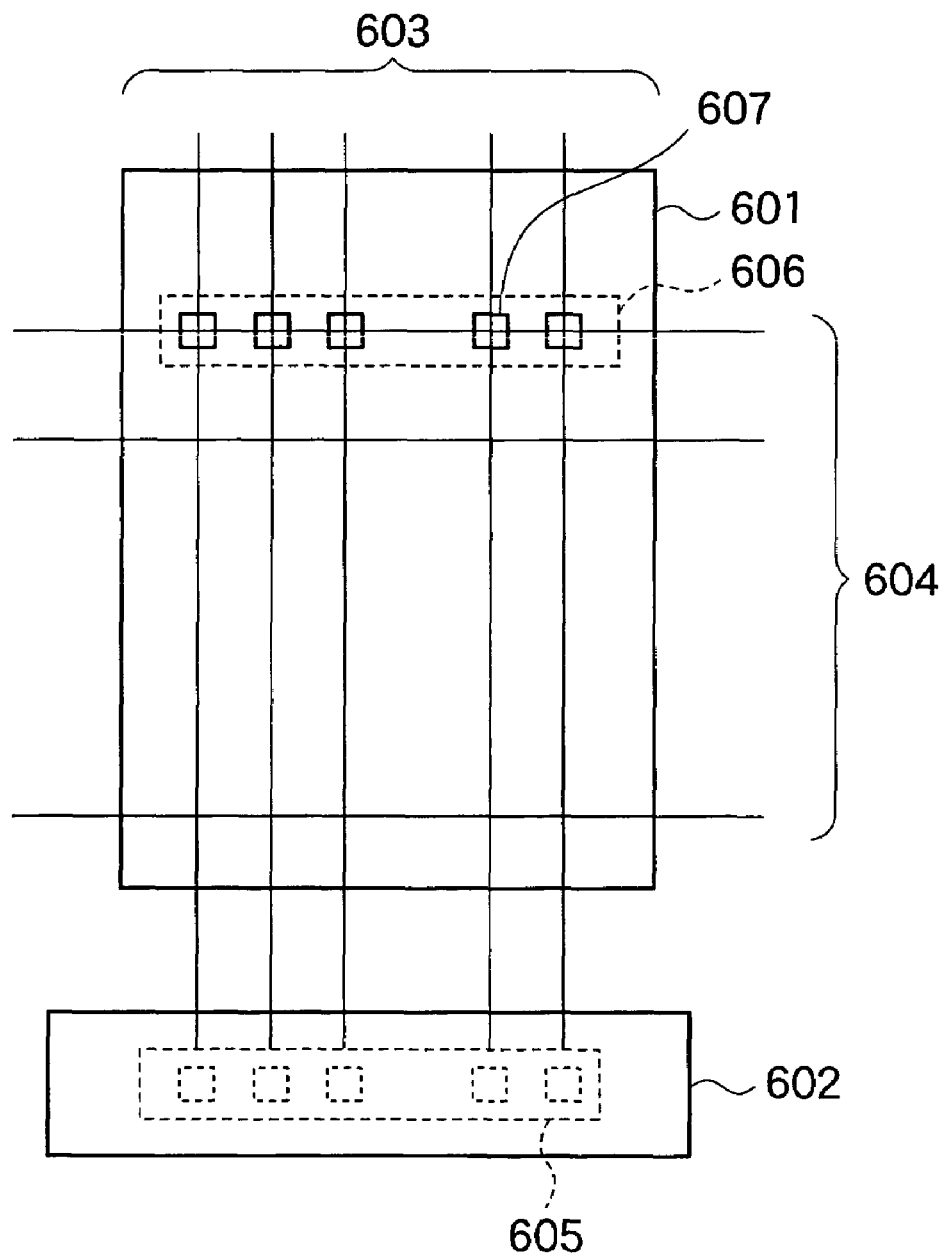
FIG. 51 is a schematic view of the block structure of a page-type flash memory used in a nonvolatile semiconductor memory system according to a fifth embodiment of the present invention.

The page mode, as shown in FIG. 51, is a mode where a memory cell row 606 connected to a word line 604 in a flash memory cell array 601 are read collectively or written collectively into a sense amplifier 602 via bit lines 603, as a memory cell row 605. Specifically, a reading or writing operation for every page is performed. In FIG. 51, memory cell transistor 607 is arranged at intersections of the word lines 604 and the bit lines 603.

Figure 52:
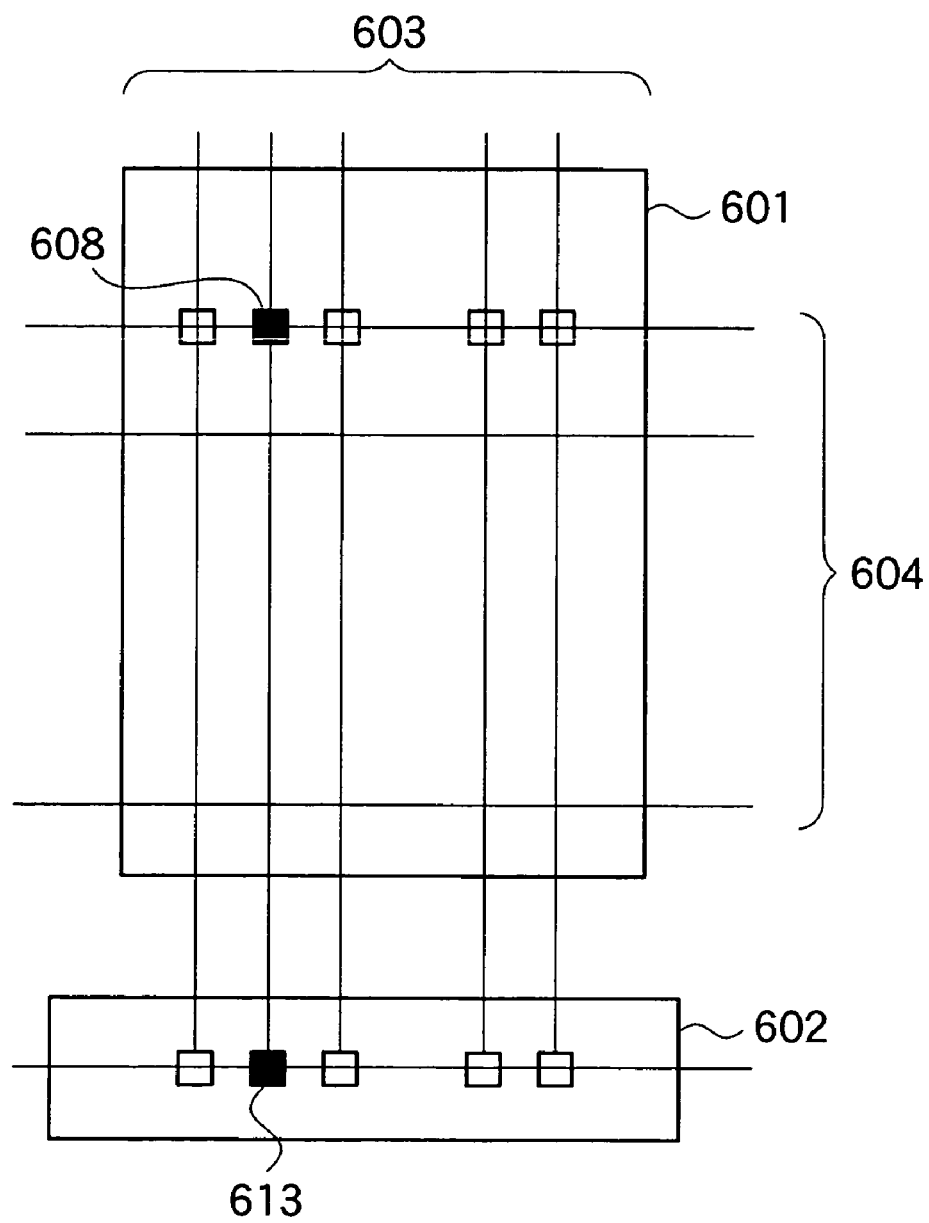
FIG. 52 is a schematic view of the block structure of a byte-type flash memory used in the nonvolatile semiconductor memory system according to the fifth embodiment of the present invention.

On the other hand, the byte mode, as shown in FIG. 52, is a mode where a memory cell 608 connected to a word line 604 in the flash memory cell array 601 is read into a sense amplifier 602, as a memory cell 613 for every byte or writing operation from the memory cell 613 in the sense amplifier 602 into the memory cell 608 is performed for every byte. Specifically, the byte mode is different from the page mode in that the reading or writing operation is performed by every byte.

Figure 53:
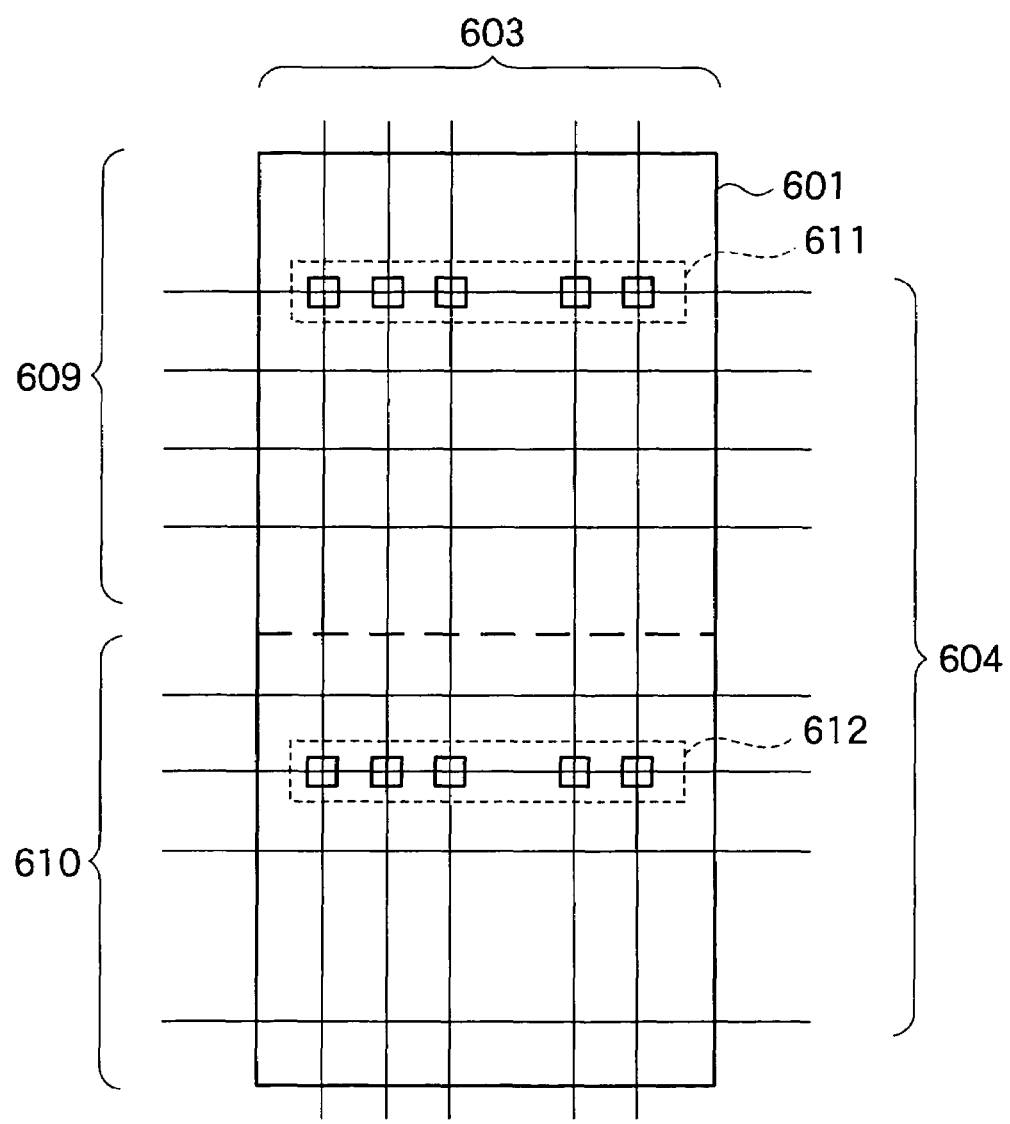
FIG. 53 is a schematic view of the block structure of an EEPROM-type flash memory with a ROM region used in the nonvolatile semiconductor memory system according to the fifth embodiment of the present invention.

On the other hand, the EEPROM mode having a ROM region, as shown in FIG. 53, refers to an operation in which, the flash memory cell array 601 is divided into a flash memory 609 and an EEPROM 610 having a ROM region. The EEPROM 610 has a ROM region, which is switched systematically, and the information in the flash memory cell array 601 is read and rewritten for every page or for every byte. FIG. 53 shows an example where a memory cell row 611 connected to a word line in the flash memory 609 is read as a memory cell row 612 to the EEPROM 610 side having a ROM region for every page, or written thereinto.

It is a matter of course that the nonvolatile semiconductor memory system serving as a divided write/erase memory according to the first through fourth embodiments of the above-described invention can also be operated by the page mode, the byte mode, and the EEPROM mode having a ROM region. In addition, in the nonvolatile semiconductor memories and systems according to the first to third embodiments of the present invention, an explanation was given with respect to the NAND flash memory. However, it is obvious that the page mode, the byte mode, and the EEPROM mode having a ROM region can also be achieved in this case. In particular, in the case of using a flash memory for a memory card or an IC card, since a system LSI is configured, it is important to have the divided write/erase memory or the EEPROM mode having a ROM region in order to promote a one-chip integrated circuit.

[System LSI]

Various applications of the nonvolatile semiconductor memory cell matrices and systems according to the first to fourth embodiments of the present invention are possible. Examples of such applications are shown in FIGS. 54 to 67.

(Memory Card)

A nonvolatile semiconductor memory system for storing information and for accessing a storage medium includes a memory card 60 including a divided write/erase semiconductor memory 50. The divided write/erase semiconductor memory 50 includes a plurality of word lines arranged in a row direction, a plurality of bit lines arranged in a column direction, a plurality of memory cell transistors arranged in the column direction, each of the memory cell transistors having a charge storage layer, a charge storage state of the memory cell transistors being controlled by one of the word lines, and at least one of memory cell transistors functions as a select gate transistor, and injects a charge into the electric charge storage layer so as to form an enhancement mode transistor.

(Application 1)

Figure 54:
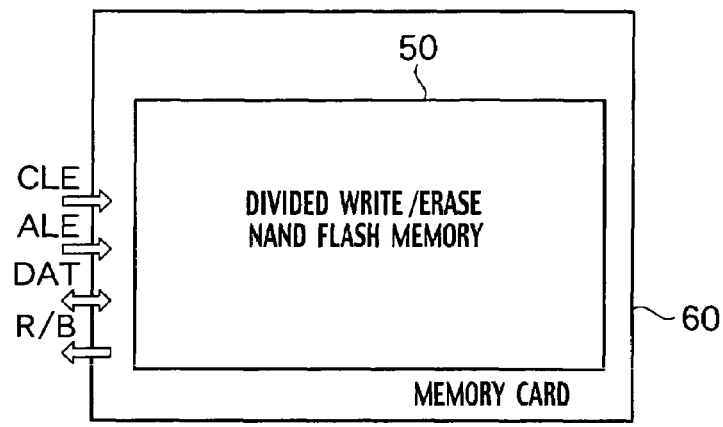
FIG. 54 is a schematic block structure view showing the internal structure of a memory card to which the nonvolatile semiconductor memory system according to the fifth embodiment of the present invention is applied.

As an example, a memory card 60 including a divided write/erase NAND flash memory 50 has a structure as shown in FIG. 54. The nonvolatile semiconductor memories according to the first to fourth embodiments of the present invention can be applied to the divided write/erase NAND flash memory 50. The memory card 60, as shown in FIG. 54, can receive and output predetermined signals from and to an external device (not shown).

Signal lines DAT, a command line enable signal line CLE, an address line enable signal line ALE, and a ready/busy signal line R/B are connected to the memory card 60 having the divided write/erase NAND flash memory 50 incorporated therein. The signal lines DAT transfer a data signal, an address signal, and a command signal. The command line enable signal line CLE transmits a signal for indicating that a command signal is transferred on the signal lines DAT. The address line enable signal line ALE transmits a signal for indicating that the address signal is transferred on the signal lines DAT. The ready/busy signal line R/B transmits a signal for indicating whether or not the divided write/erase NAND flash memory 50 is ready.

(Application 2)

Figure 55:
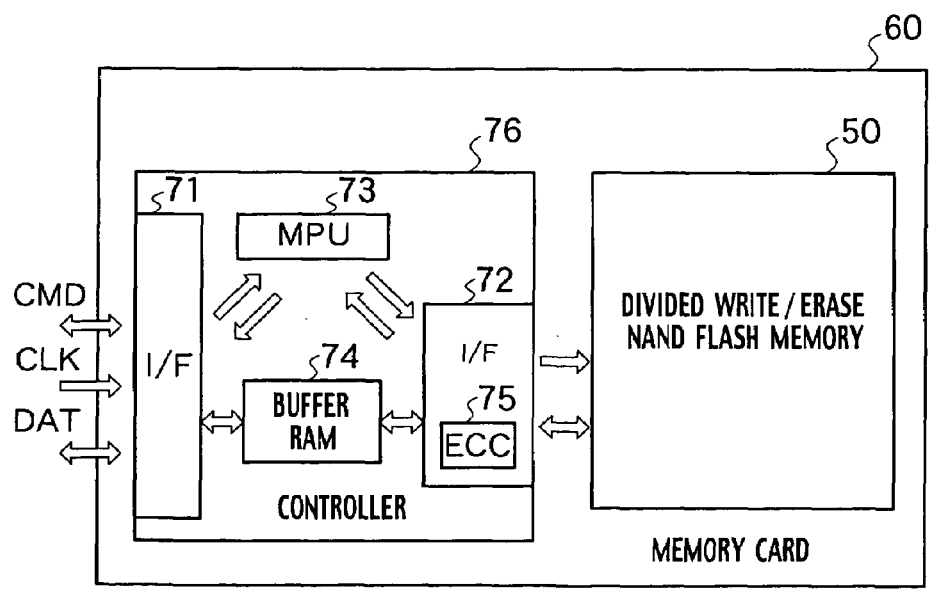
FIG. 55 is a schematic block structure view showing the internal structure of a memory card to which the nonvolatile semiconductor memory system according to the fifth embodiment of the present invention is applied.

Another example of the memory card 60, as shown in FIG. 55, includes a controller 76 in addition to the divided write/erase NAND flash memory 50 different from the example of the memory card of FIG. 54. The controller 76 controls the divided write/erase NAND flash memory 50 and receives and sends predetermined signals from and to an external device. The controller 76 includes interface units (I/F) 71, 72, a microprocessor unit (MPU) 73, a buffer RAM 74, and an error correction code unit (ECC) 75 contained in the interface unit (I/F) 72.

The interface unit (I/F) 71 receives and sends predetermined signals from and to an external device, and the interface unit (I/F) 72 receives and sends the predetermined signals from and to the divided write/erase NAND flash memory 50. The microprocessor unit (MPU) 73 converts logical addresses into physical addresses. The buffer RAM 74 temporarily stores data. The error correction code unit (ECC) 75 generates an error correction code.

A command signal line CMD, a clock signal line CLK, and signal lines DAT are connected to the memory card 60. The number of the control signal lines, the bit width of the signal lines DAT, and the circuit structure of the controller 76 can be modified as needed.

(Application 3)

Figure 56:
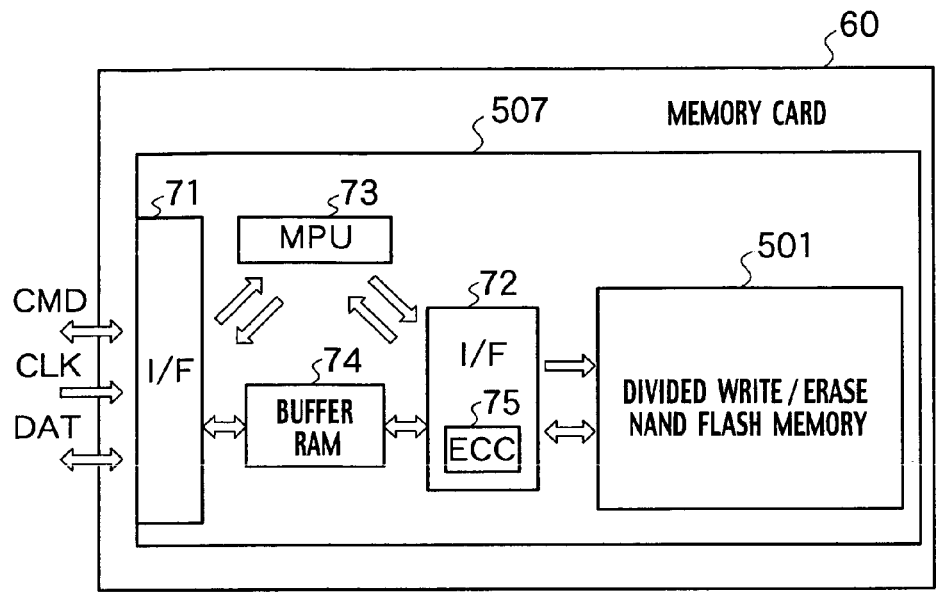
FIG. 56 is a schematic block structure view showing the internal structure of a memory card to which the nonvolatile semiconductor memory system according to the fifth embodiment of the present invention is applied.

Another example of the memory card 60, as shown in FIG. 56, is achieved by a system LSI chip 507 having interface units (I/F) 71, 72, a microprocessor unit (MPU) 73, a buffer RAM 74, an error correction code unit (ECC) 75 contained in the interface unit (I/F) 72, and a divided write/erase NAND flash memory 501 formed in one chip. The system LSI chip 507 is mounted in the memory card 60.

(Application 4)

Figure 57:
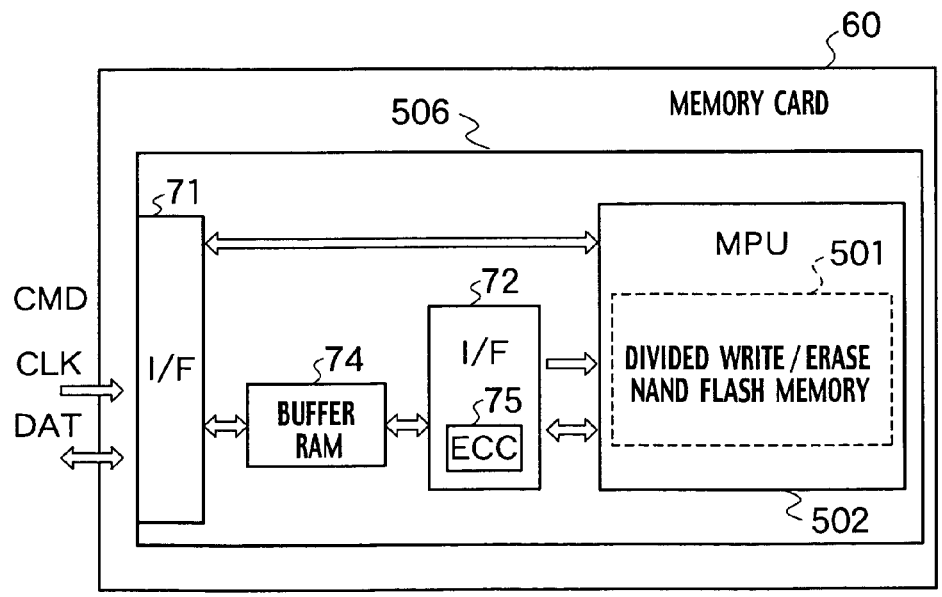
FIG. 57 is a schematic block structure view showing the internal structure of a memory card to which the nonvolatile semiconductor memory system according to the fifth embodiment of the present invention is applied.

In another example of the memory card 60, as shown in FIG. 57, the divided write/erase NAND flash memory 501 is formed in the microprocessor unit (MPU) 73 to achieve a memory mixed MPU 502. Moreover, all of the interface units (I/F) 71 and 72, buffer RAM 74 and error correction code units (ECC) 75 contained in the interface unit (I/F) 72 are formed in one chip, to achieve a system LSI chip 506. Such a system LSI chip 506 is mounted in the memory card 60.

(Application 5)

Figure 58:
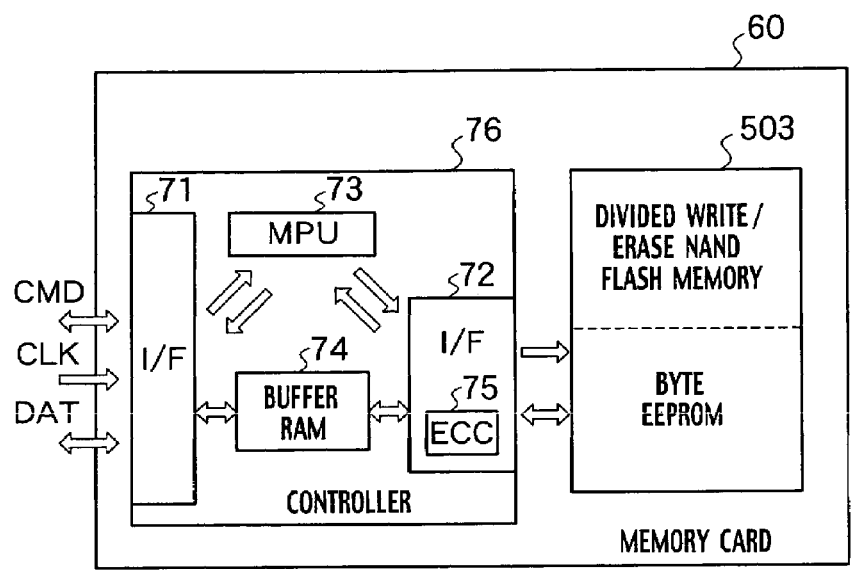
FIG. 58 is a schematic block structure view showing the internal structure of a memory card to which the nonvolatile semiconductor memory system according to the fifth embodiment of the present invention is applied.

In another example of the structure of the memory card 60, as shown in FIG. 58, the flash memory 503 constituted by the divided write/erase NAND flash memory and byte mode EEPROM having a ROM region, are used instead of the divided write/erase NAND flash memory 50 shown in FIG. 54 or 55.

It is a matter of course that the flash memory 503 of EEPROM mode having a ROM region, as shown in FIG. 56, may be on the same chip together with a controller 76 to provide a single-chip to be configured in the system LSI chip 507, as shown in FIG. 56. Still further, it is a matter of course that the flash memory 503 of EEPROM mode having a ROM region is formed in the microprocessor unit (MPU) 73 to achieve the memory mixed MPU 502, and further all of the interface units (I/F) 71, 72 and a buffer RAM 74 are formed in one chip to be configured in one chip of system LSI chip 506, as shown in FIG. 57.

(Application 6)

Figure 59:
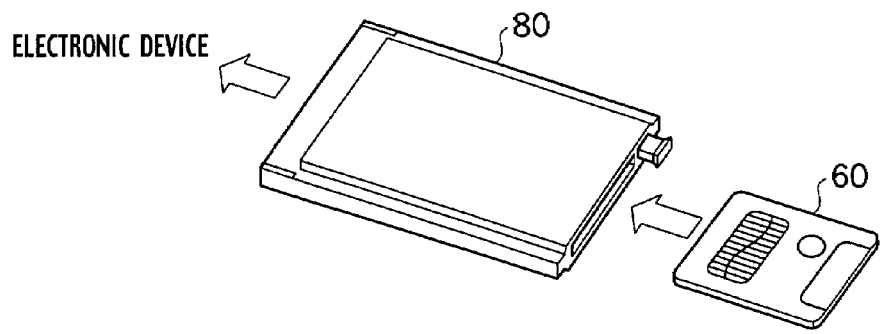
FIG. 59 is a schematic structure view of a memory card and card holder to which the nonvolatile semiconductor memory system according to the fifth embodiment of the present invention is applied.

The 'card holder' means a slot configured to accept a card, hereinafter referred as 'card holder'. A memory card holder 80, as shown in FIG. 59, can be assumed as an application example of the memory cards 60 shown in FIGS. 54 to 58. The memory card holder 80 can contain a memory card 60 having a divided write/erase NAND flash memory 50 as a nonvolatile semiconductor memory cell matrix explained in detail in the first to fourth embodiments of the present invention. The memory card holder 80 is connected to an electronic device (not shown) and can be operated as an interface between the memory cards 60 and the electronic device. The memory card holder 80 can execute various functions including functions of the controller 76, the microprocessor unit (MPU) 73, the buffer RAM 74, the error correction code unit (ECC) 75, interface units (I/F) 71, 72, etc., in the memory cards 60 shown in FIGS. 54 to 58.

(Application 7)

Figure 60:
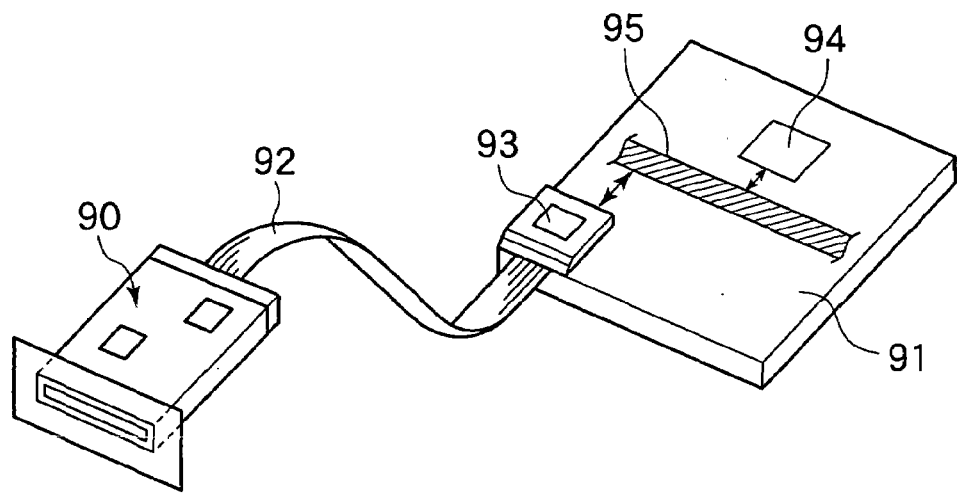
FIG. 60 is a schematic structure view of a connecting unit that can accept a memory card and card holder to which the nonvolatile semiconductor memory system according to the fifth embodiment of the present invention is applied.

With reference to FIG. 60, still another application example will be described. FIG. 60 discloses a connection device 90 capable of containing the memory card 60 or the memory card holder 80. Either one of the memory card 60 and the memory card holder 80 includes the nonvolatile semiconductor memory cell matrix explained in detail in the first to fourth embodiments of the present invention, as a divided write/erase NAND flash memory 50 or a divided write/erase NAND flash memory 501, a memory mixed MPU 502, and a flash memory 503 of EEPROM mode having a ROM region. The memory card 60 or the memory card holder 80 is attached and electrically connected to a connection device 90. The connection device 90 is connected via connecting wires 92 and an interface circuit 93 to a circuit board 91 including a CPU 94 and a bus 95.

(Application 8)

Figure 61:
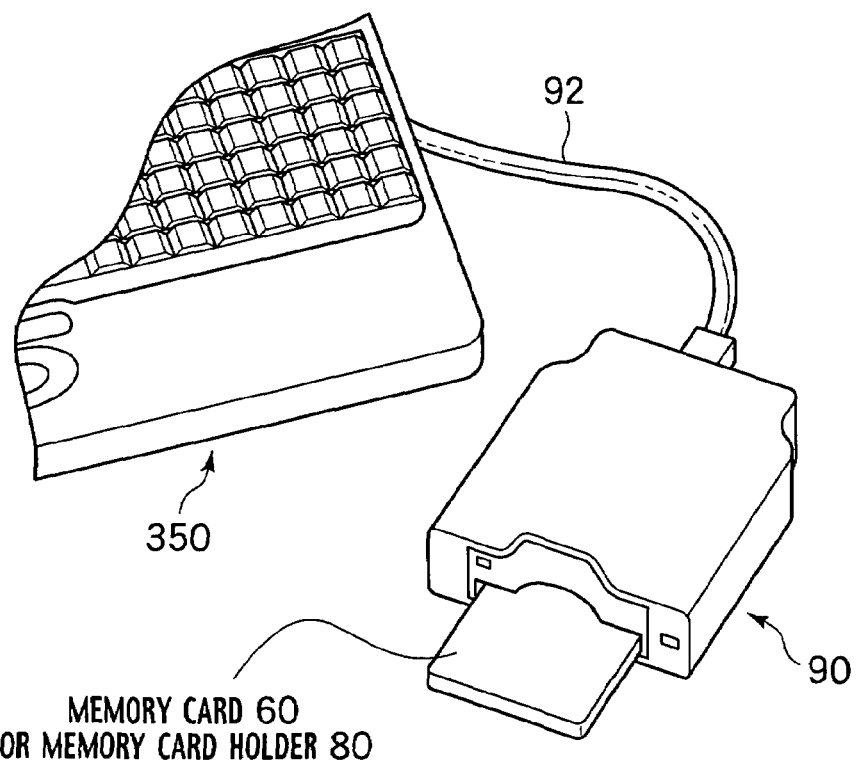
FIG. 61 is a schematic structure view of a connecting unit having therein a memory card, to which the nonvolatile semiconductor memory system according to the fifth embodiment of the present invention is applied, and which connects via connecting wires to a personal computer.

With reference to FIG. 61, still another application example will be described. Either one of the memory card 60 and the memory card holder 80 includes the nonvolatile semiconductor memory cell matrix explained in detail in the first to fourth embodiments of the present invention, as a divided write/erase NAND flash memory 50 or a divided write/erase NAND flash memory 501, a memory mixed MPU 502, and a flash memory 503 of EEPROM mode having a ROM region. The memory card 60 or the memory card holder 80 is attached and electrically connected to a connection device 90. The connection device 90 is connected via connecting wires 92 to a personal computer (PC) 350.

(Application 9)

Figure 62:
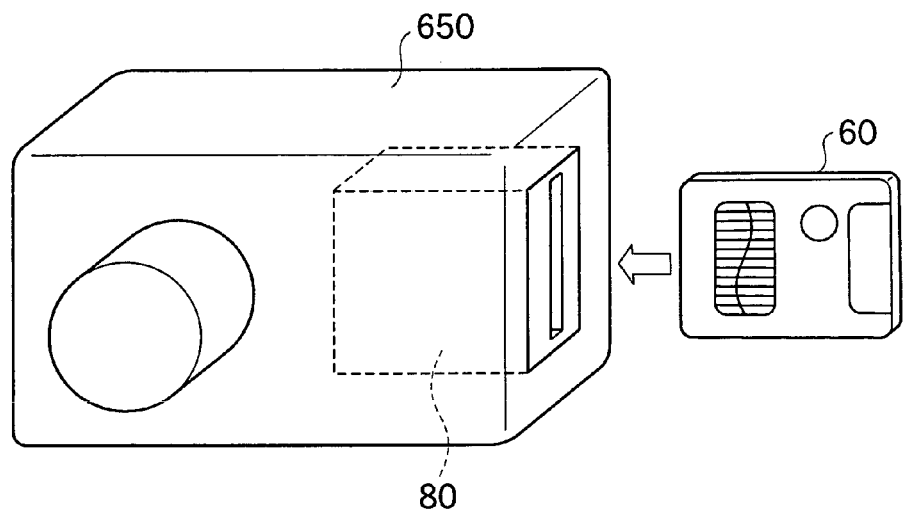
FIG. 62 shows a digital camera system that can contain therein a memory card to which the nonvolatile semiconductor memory system according to the fifth embodiment of the present invention is applied.

With reference to FIG. 62, another application example will be described. The memory card 60 includes the nonvolatile semiconductor memory cell matrix explained in detail in the first to fourth embodiments of the present invention, as a divided write/erase NAND flash memory 50 or a divided write/erase NAND flash memory 501, a memory mixed MPU 502, and a flash memory 503 of EEPROM mode having a ROM region. FIG. 62 shows an example of the application of the memory card 60 to a digital camera 650 having the memory card holder 80 built therein.

(IC Card)

A nonvolatile semiconductor memory system for storing information and for accessing a storage medium includes an IC card 500 including a divided write/erase semiconductor memory 501. A divided write/erase semiconductor memory 501 includes a plurality of word lines arranged in a row direction, a plurality of bit lines arranged in a column direction, a plurality of memory cell transistors arranged in the column direction, each of the memory cell transistors having a charge storage layer, a charge storage state of the memory cell transistors being controlled by one of the word lines, at least one of the memory cell transistors functions as a select gate transistor, and injects a charge into the electric charge storage layer so as to form an enhancement mode transistor.

(Application 10)

Figure 63:
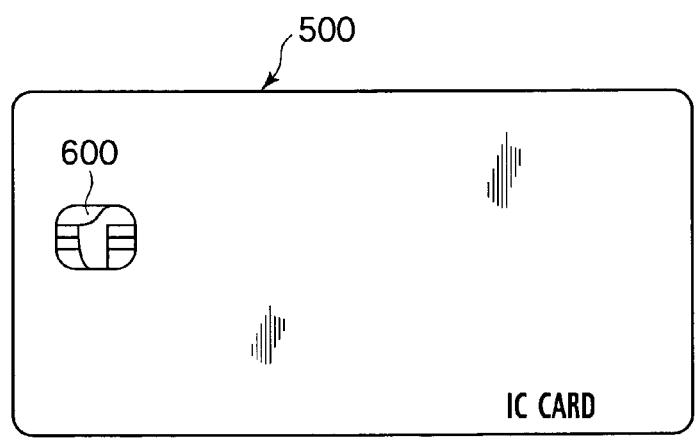
FIG. 63 is a schematic structure view of an IC card to which the nonvolatile semiconductor memory system according to the fifth embodiment of the present invention is applied.
Figure 64:
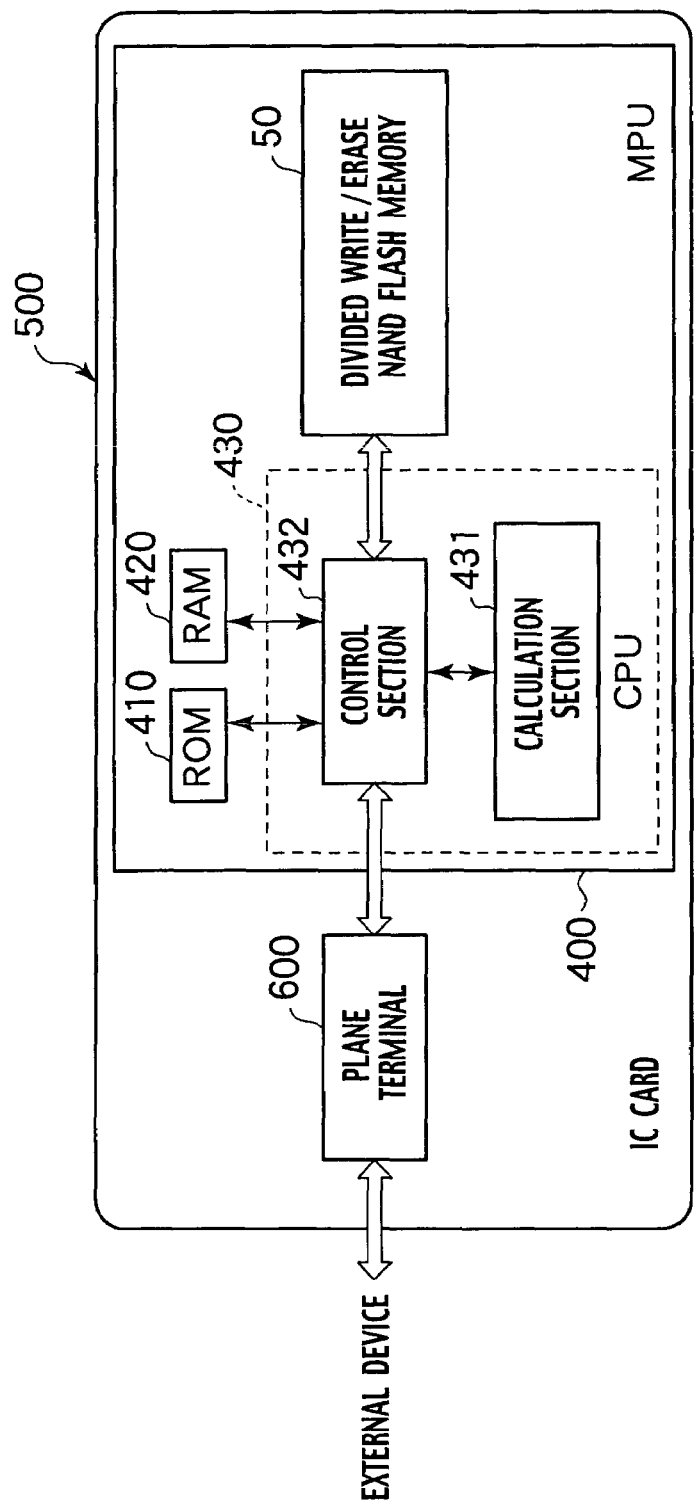
FIG. 64 is a schematic block structure view showing the internal structure of an IC card to which the nonvolatile semiconductor memory system according to the fifth embodiment of the present invention is applied.

Another example of the application of the nonvolatile semiconductor memories according to the first to fourth above embodiments of the present invention shows a configuration of an IC (interface circuit) card 500 including a MPU 400 composed of a divided write/erase NAND flash memory 50, a ROM 410, a RAM 420, and a CPU 430, and a plane terminal 600, as shown in FIGS. 63 and 64. The IC card 500 can be connected to an external device via the plane terminal 600. The plane terminal 600 is connected to the MPU 400 in the IC card 500. The CPU 430 includes a calculation section 431 and a control section 432. The control section 432 is connected to the divided write/erase NAND flash memory 50, the ROM 410, and the RAM 420. The MPU 400 is preferably molded on a surface of the IC card 500 and the plane terminal 600 is preferably formed on the other surface of the IC card 500.

In FIG. 64, the nonvolatile semiconductor memories and systems according to the first to fourth embodiments of the present invention can be applied to the divided write/erase NAND flash memory 50 or the ROM 410. Moreover, the page mode, the byte mode, and the EEPROM mode having a ROM region are possible for operation of the nonvolatile semiconductor memory.

(Application 11)

Figure 65:
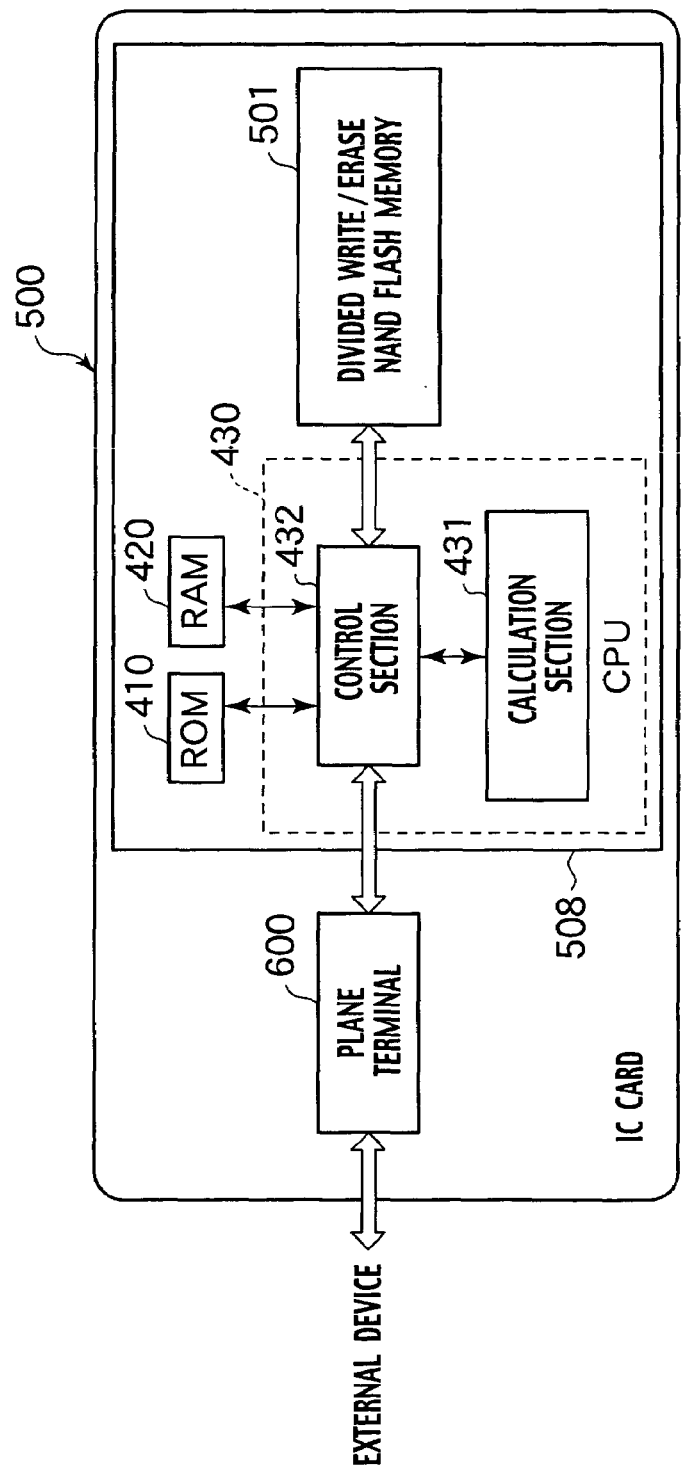
FIG. 65 is a schematic block structure view showing the internal structure of an IC card to which the nonvolatile semiconductor memory system according to the fifth embodiment of the present invention is applied.

Still another example of the structure of the IC card 500, as shown in FIG. 65, is configured by forming all of the ROM 410, RAM 420, CPU 430, and the divided write/erase NAND flash memory 501 into one-chip to be configured in the system LSI chip 508. Such a system LSI chip 508 is incorporated in the IC card 500. In FIG. 65, the nonvolatile semiconductor memories and systems explained in detail in the first to fourth embodiments of the present invention can be applied to the divided write/erase NAND flash memory 501 and the ROM 410. Moreover, the nonvolatile semiconductor memory can be operated by the page mode, the byte mode, and the EEPROM mode having a ROM region.

(Application 12)

Figure 66:
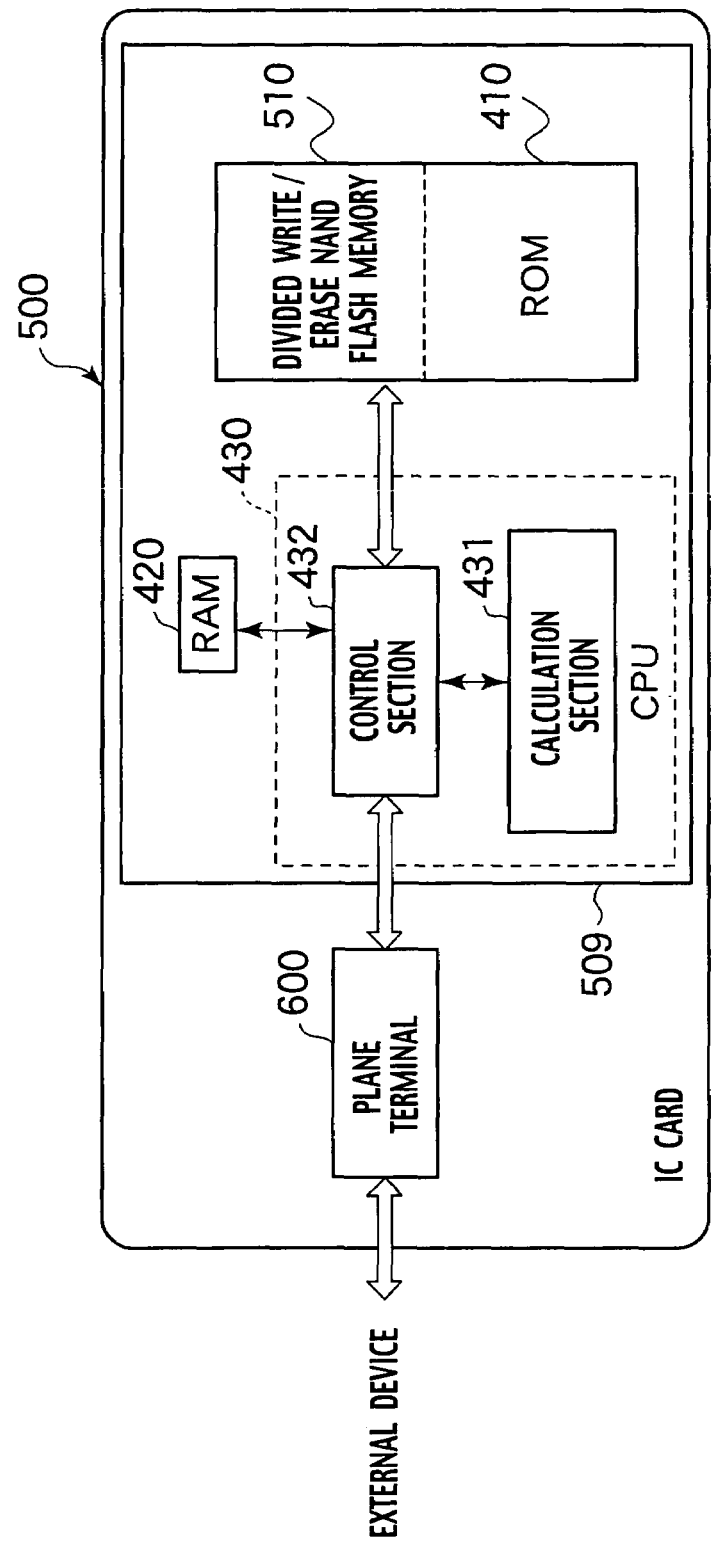
FIG. 66 is a schematic block structure view showing the internal structure of an IC card to which the nonvolatile semiconductor memory system according to the fifth embodiment of the present invention is applied.

Still another example of the structure of the IC card 500, as shown in FIG. 66, is configured by incorporating the ROM 410 in the divided write/erase NAND flash memory 501 to be configured in the flash memory 510 of the EEPROM mode having a ROM region. Further, the flash memory 510 of EEPROM mode having a ROM region, a RAM 420, and a CPU 430 are all formed into one chip to be formed in a system LSI chip 509. The system LSI chip 509 of the above structure is incorporated in the IC card 500.

(Application 13)

Figure 67:
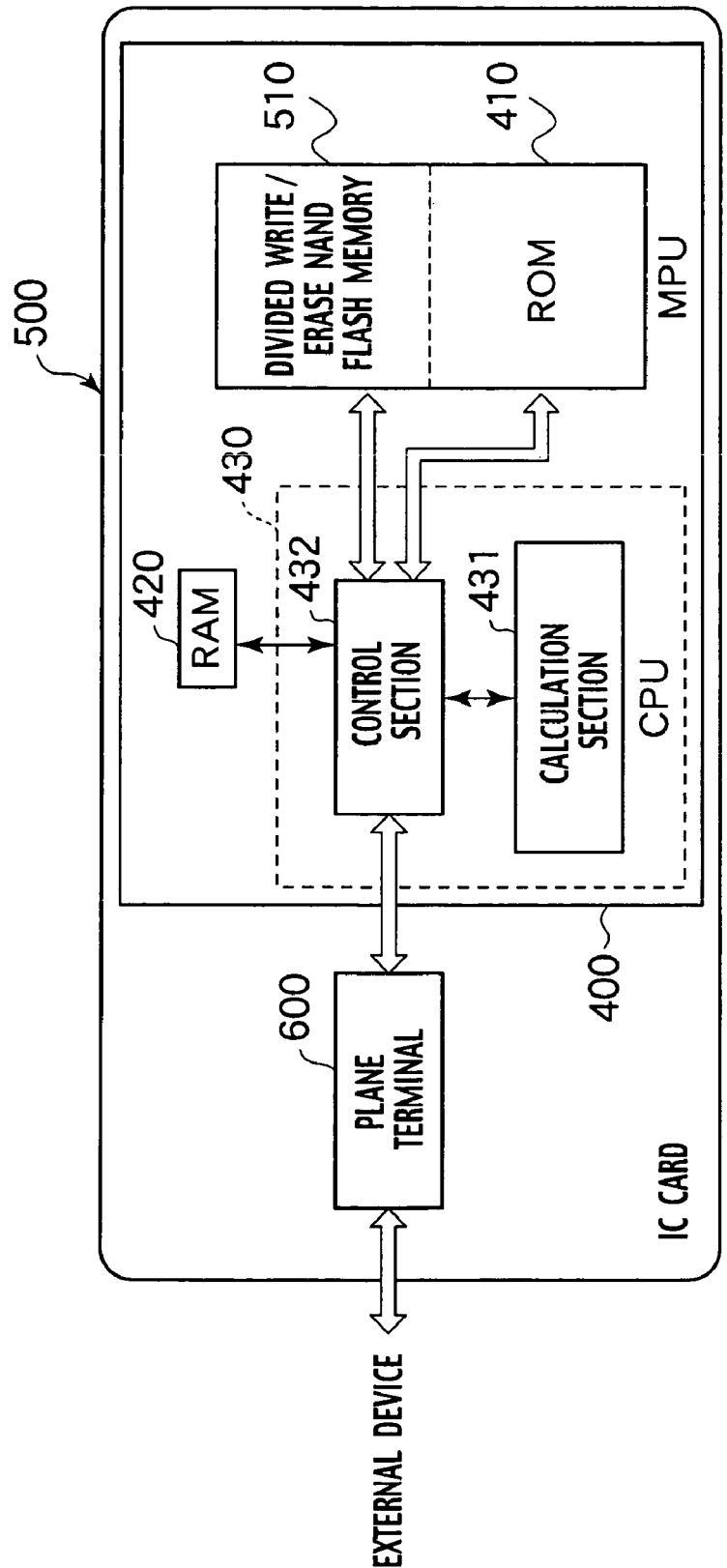
FIG. 67 is a schematic block structure view showing the internal structure of an IC card to which the nonvolatile semiconductor memory system according to the fifth embodiment of the present invention is applied.

Yet another example of the structure of the IC card 500, as shown in FIG. 67, further shows the configuration of the flash memory 510 of the EEPROM mode having a ROM region, incorporating the ROM 410 in the divided write/erase NAND flash memory 50 shown in FIG. 64. The flash memory 510 of the EEPROM mode having a ROM region mode formed in the above structure is incorporated in the MPU 400 similarly to FIG. 64.

Other Embodiments

Although the embodiments of the present invention have been described, it should be understood that the descriptions and drawings forming the present disclosure do not limit the present invention. From this disclosure, those skilled in the art will appreciate various alternative embodiments and operation technique thereof. Therefore, the spirit and scope of the present invention is defined only by the appended claims according to the above descriptions.

Still further, it is a matter of course that the nonvolatile semiconductor memory cell matrix and system disclosed in the embodiments of the present invention and the modified examples thereof can be operated when combined with one another as well as multi-valued storage mode.

According to the nonvolatile semiconductor memories of the present invention, a memory cell is set to have a high-density, a high-speed rewriting is enabled in which the write/erase unit is small, or can be arbitrarily set, or the arbitrary write/erase unit can be systematically set. Therefore, there is a wide application field such as an on-vehicle system, a hard disk drive, a cellular phone, and a high-speed network modem unit as well as a memory card and an IC card.

Various modifications will become possible for those skilled in the art after receiving the teachings of the present disclosure without departing from the scope thereof.

As described above, it is a matter of course that the present invention includes various embodiments not described herein. Hence, the spirit and scope of the present invention is defined only by the following claims according to the above descriptions.

What is claimed is:

1. A nonvolatile semiconductor memory device, comprising:
a semiconductor substrate including a first memory cell region, a second memory cell region located adjacent to the first memory cell region in a first direction, and an active area extending in the first direction and continuously arranged in the first and second memory cell regions;
a first select gate line located in the first memory cell region and extending in a second direction perpendicular to the first direction;
a first select gate transistor located between the first select gate line and the active area in the first memory cell region;
a second select gate line located in the first memory cell region and arranged in parallel with the first select gate line;
a second select gate transistor located between the second select gate line and the active area in the first memory cell region;
a plurality of first word lines located between the first and second gate lines in the first memory cell region, each first word line arranged in parallel with the first select gate line;
a plurality of first memory cell transistors located between the first word lines and the active area in the first memory cell region;
a third select gate line located in the second memory cell region and extending in the second direction;
a third select gate transistor located between the third select gate line and the active area in the second memory cell region;
a fourth select gate line located in the second memory cell region and arranged in parallel with the third select gate line;
a fourth select gate transistor located between the fourth select gate line the active area in the second memory cell region;
a plurality of second word lines located between the third and fourth select gate lines in the second memory cell region, each second word line arranged in parallel with the third select gate line;
a plurality of second memory cell transistors located between the second word lines and the active area in the second memory cell region; and
a controller located adjacent to the second memory cell region in the second direction, the controller connected to the second word lines and arbitrarily setting one of the second memory cell transistors as an additional select gate transistor through a corresponding one of the second word lines,
wherein the number of second memory cell transistors between the third select gate transistor and the additional select gate transistor in the second memory cell region is less than the number of first memory cell transistors between the first and second select gate transistors, a first data to be accessed at a first access speed is stored in the first memory cell transistors in the first memory cell region and a second data to be accessed in second access speed, which is faster than the first access speed, is stored in the second memory cell transistors located between the third and additional select gate transistors in the second memory cell region.

2. The nonvolatile semiconductor memory device of claim 1, wherein the first and second select gate transistors include a first gate length that is same as a second gate length of the first memory cell transistors.

3. The nonvolatile semiconductor memory device of claim 1, wherein the controller includes a row decoder circuit supplying a writing voltage to the first and second word lines.

4. The nonvolatile semiconductor memory device of claim 1, wherein the first and second memory cell transistors include a charge storage layer having a floating gate electrode, respectively.

5. The nonvolatile semiconductor memory device of claim 1, wherein the first and second memory cell transistors include a charge storage layer having a silicon nitride film, respectively.

6. The nonvolatile semiconductor memory device of claim 1, wherein the second data is a program address data.

7. The nonvolatile semiconductor memory device of claim 1, wherein the second data is an encryption code data.

* * * * *